United States Patent
Hirano

(10) Patent No.: US 11,436,391 B2
(45) Date of Patent: Sep. 6, 2022

(54) LEARNING METHOD AND AUTOMATIC LAYOUT DESIGN METHOD

(71) Applicant: KYOCERA Corporation, Kyoto (JP)

(72) Inventor: Yoshikazu Hirano, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/424,496

(22) PCT Filed: Dec. 4, 2019

(86) PCT No.: PCT/JP2019/047348
§ 371 (c)(1),
(2) Date: Jul. 21, 2021

(87) PCT Pub. No.: WO2020/158179
PCT Pub. Date: Aug. 6, 2020

(65) Prior Publication Data
US 2022/0092228 A1    Mar. 24, 2022

(30) Foreign Application Priority Data
Jan. 29, 2019    (JP) .............................. JP2019-013274

(51) Int. Cl.
*G06F 30/17*    (2020.01)
*G06N 20/00*    (2019.01)

(52) U.S. Cl.
CPC ............. *G06F 30/17* (2020.01); *G06N 20/00* (2019.01)

(58) Field of Classification Search
CPC ........ G06N 20/00; G06N 20/10; G06N 20/20; G06F 30/00; G06F 30/17; G06F 30/27
(Continued)

(56) References Cited

U.S. PATENT DOCUMENTS

2020/0184137 A1    6/2020    Tsutsui et al.

FOREIGN PATENT DOCUMENTS

| EP | 1415826 A2 | 5/2004 |
| JP | 2004148823 A | 5/2004 |

(Continued)

OTHER PUBLICATIONS

Cagan, Jonathan et al., "A Simulated Annealing-Based Algorithm using Hierarchical Models for General Three-Dimensional Component Layout", 1998, Computer-Aided Design, vol. 30, No. 10, Elsevier Science Ltd. (Year: 1998).*

*Primary Examiner* — Cedric Johnson
(74) *Attorney, Agent, or Firm* — Hauptman Ham, LLP

(57) ABSTRACT

A learning method and an automatic layout design method are disclosed. In one embodiment, provided is a learning method implementable by an apparatus for a system performing a layout design for automatically determining layout positions of a plurality of layout objects to be placed in a layout space by virtually moving the plurality of layout objects in the layout space based on a relationship between states of the plurality of layout objects in the layout space and movements of the plurality of layout objects to be performed, the method comprising: virtually moving a plurality of first layout objects in the layout space, determining a reward depending on whether or not the plurality of first layout objects interfere with another object in the layout space, and performing a learning process for learning the relationship through machine learning based on the reward.

22 Claims, 32 Drawing Sheets

(58) Field of Classification Search
USPC .............................................................. 703/7
See application file for complete search history.

(56) References Cited

FOREIGN PATENT DOCUMENTS

WO          2018234945 A1    12/2018
WO     WO-2018234945 A1 * 12/2018   ............. G06F 30/00

* cited by examiner

(similar grid)

LEARNING METHOD AND AUTOMATIC LAYOUT DESIGN METHOD

CROSS-REFERENCE TO RELATED APPLICATION

The present application is a National Phase entry based on PCT Application No. PCT/JP2019/047348 filed on Dec. 4, 2019, entitled "LEARNING METHOD, LEARNING PROGRAM, LEARNING DEVICE, AUTOMATIC ARRANGEMENT DESIGN METHOD, AUTOMATIC ARRANGEMENT DESIGN PROGRAM, AND AUTOMATIC ARRANGEMENT DESIGN DEVICE", which claims the benefit of Japanese Patent Application No. 2019-013274, filed on Jan. 29, 2019, entitled "LEARNING METHOD, LEARNING PROGRAM, LEARNING DEVICE, AUTOMATIC ARRANGEMENT DESIGN METHOD, AUTOMATIC ARRANGEMENT DESIGN PROGRAM, AND AUTOMATIC ARRANGEMENT DESIGN DEVICE". The content of which is incorporated by reference herein in its entirety.

FIELD

Embodiments of the present disclosure relate to designing layouts of objects to be placed.

BACKGROUND

Techniques have been developed for designing layouts of components.

SUMMARY

A learning method and an automatic layout design method are disclosed. In one embodiment, provided is a learning method implementable by an apparatus for a system performing a layout design for automatically determining layout positions of a plurality of layout objects to be placed in a layout space by virtually moving the plurality of layout objects in the layout space based on a relationship between states of the plurality of layout objects in the layout space and movements of the plurality of layout objects to be performed, the method comprising: virtually moving a plurality of first layout objects in the layout space, determining a reward depending on whether or not the plurality of first layout objects interfere with another object in the layout space, and performing a learning process for learning the relationship through machine learning based on the reward.

In one embodiment, provided is a learning method implementable by an apparatus for a system performing a layout design for automatically determining layout positions of a plurality of layout objects to be placed in a layout space by virtually moving the plurality of layout objects in the layout space based on a relationship between states of the plurality of layout objects in the layout space and movements of the plurality of layout objects to be performed, the method comprising: performing a learning process for learning the relationship while virtually moving a plurality of first layout objects in the layout space, the relationship is learned based on first state data representing states of the plurality of first layout objects in the layout space. A first space including the layout space includes a plurality of elements, and each of the plurality of first layout objects includes a plurality of elements. The learning process is performed using first array data representing the first space and second array data representing each of the plurality of first layout objects, the first array data is generated by assigning first data to each of the plurality of elements of the first space, and the second array data is generated by assigning second data to each of the plurality of elements of each of the plurality of first layout objects. The first state data includes merged array data obtained by merging a plurality of sets of second array data representing the plurality of first layout objects on the first array data in accordance with a position of each of the plurality of first layout objects in the layout space corresponding to the plurality of sets of second array data.

In one embodiment, provided is an automatic layout design method implementable by an apparatus, the method comprising: performing a layout design for automatically determining layout positions of a plurality of second layout objects to be placed in a layout space by virtually moving the plurality of second layout objects in the layout space based on the relationship learned with the learning method. The layout positions of the plurality of second layout objects in the layout space are determined for a plurality of sizes of the layout space.

In one embodiment, provided is an automatic layout design method implementable by an apparatus, the method comprising: performing a first layout design for automatically determining layout positions of a plurality of second layout objects to be placed in a layout space by virtually moving the plurality of second layout objects in the layout space based on the relationship learned with the first learning process performed with the learning method; and performing a second layout design for automatically determining the layout positions of the plurality of second layout objects to be placed in the layout space by virtually moving the plurality of second layout objects in the layout space based on the relationship learned with the second learning process performed with the learning method.

In one embodiment, provided is an automatic layout design method implementable by an apparatus, the method comprising: performing a layout design for automatically determining layout positions of a plurality of second layout objects to be placed in a layout space to avoid interference between each of the plurality of second layout objects and another object by virtually moving the plurality of second layout objects in the layout space based on the relationship learned with the learning method. A first space including the layout space includes a plurality of elements, and each of the plurality of second layout objects includes a plurality of elements. The layout design is performed using first array data representing the first space and second array data representing each of the plurality of second layout objects, the first array data is generated by assigning first data to each of the plurality of elements of the first space, and the second array data is generated by assigning second data to each of the plurality of elements of each of the plurality of second layout objects. The method further comprises determining whether each of the plurality of second layout objects interferes with another object in the layout space based on merged array data obtained by merging a plurality of sets of second array data representing the plurality of second layout objects on the first array data in accordance with a position of each of the plurality of second layout objects in the layout space corresponding to the plurality of sets of second array data.

In one embodiment, provided is an automatic layout design method implementable by an apparatus for a system performing a layout design for automatically determining layout positions of a plurality of layout objects to be placed in a layout space by virtually moving the plurality of layout objects in the layout space based on a relationship between states of the plurality of layout objects in the layout space and movements of the plurality of layout objects to be performed, the method comprising: performing the layout design for automatically determining the layout positions of the plurality of second layout objects in the layout space for a plurality of sizes of the layout space by virtually moving the plurality of second layout objects in the layout space based on the relationship learned through machine learning while virtually moving a plurality of first layout objects in the layout space.

BRIEF DESCRIPTION OF THE DRAWINGS

FIG. 12 illustrates a diagram describing merged target-space data in an embodiment.

FIG. 13 illustrates a diagram describing merged target-space data in an embodiment.

FIG. 46 illustrates a diagram describing second object-state data in an embodiment.

FIG. 47 illustrates a diagram describing third object-state data in an embodiment.

DETAILED DESCRIPTION

Figure 1:
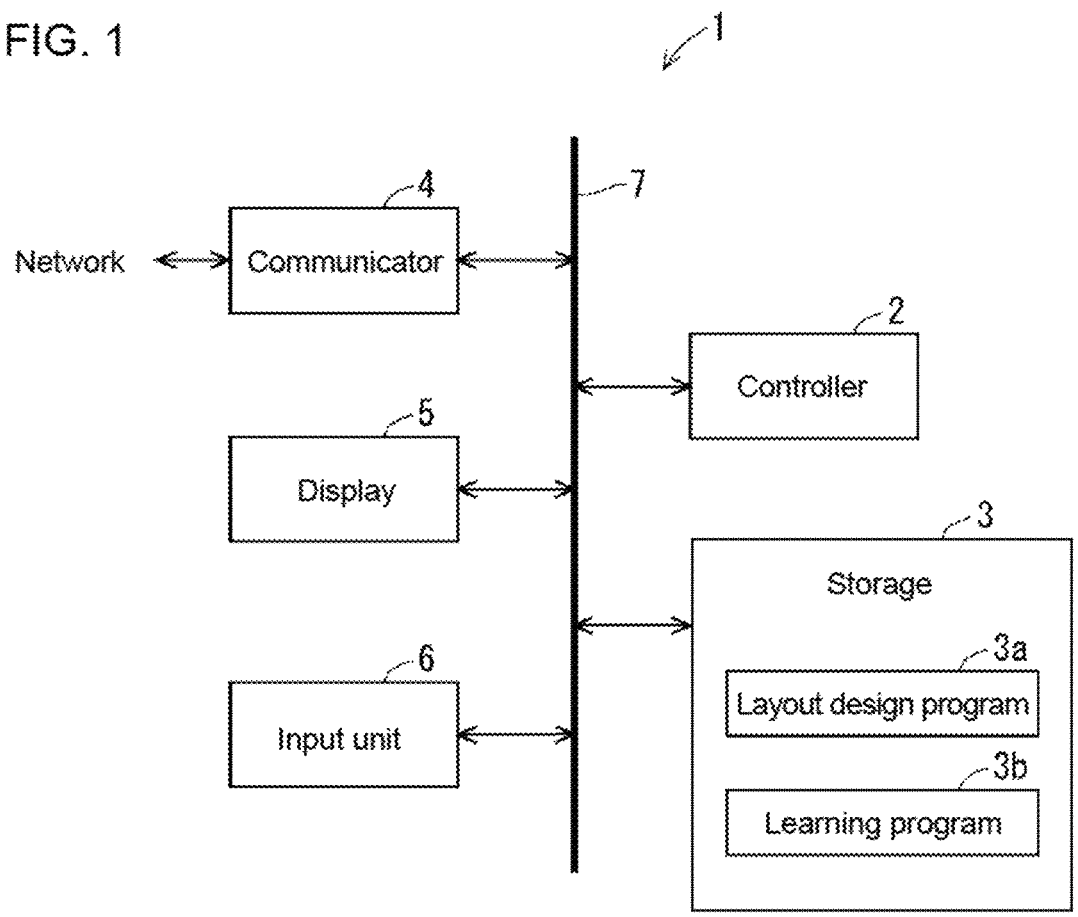
FIG. 1 illustrates a schematic diagram of a computer apparatus in an embodiment.

FIG. 1 is a schematic block diagram of a computer apparatus 1 in an embodiment. The computer apparatus 1 functions as an automatic layout design system that performs an automatic layout design process for automatically determining layout positions of multiple layout objects in a layout space. In other words, the computer apparatus 1 functions as an automatic layout design apparatus that performs the automatic layout design process. The computer apparatus 1 also functions as a learner apparatus that performs a learning process for learning, through machine learning, parameters used in the automatic layout design system. The automatic layout design process may hereafter be simply referred to as a layout design process. The layout design process, together with the learning process as its preprocess, may be referred to as an automatic design process. Placing a layout object in a layout space herein is a virtual process performed by a computer. Moving a layout object in a layout space herein is also a virtual process performed by a computer.

As shown in FIG. 1, the computer apparatus 1 includes, for example, a controller 2, a storage 3, a communicator 4, a display 5, and an input unit 6. The controller 2, the storage 3, the communicator 4, the display 5, and the input unit 6 may be electrically connected to one another with, for example, a bus 7.

The controller 2 can centrally manage the operation of the computer apparatus 1 by controlling the other components of the computer apparatus 1. The controller 2 may serve as a control device or a control circuit. The controller 2 includes at least one processor that performs control and processing for implementing various functions, as described in more detail below.

In various embodiments, the processor(s) may be implemented as a single integrated circuit (IC), or as multiple integrated circuits (ICs) or discrete circuits connected to allow communication between them, or as both multiple ICs and discrete circuits. The processor(s) is implementable with various known techniques.

In one embodiment, the processor includes one or more circuits or units that perform one or more data computation procedures or processes by, for example, executing commands stored in an associated memory. In other embodiments, the processor may be firmware (e.g., a discrete logic component) that performs one or more data computation procedures or processes.

In various embodiments, the processor includes one or more processors, controllers, microprocessors, microcontrollers, application-specific integrated circuits (ASICs), digital signal processors, programmable logic devices, field programmable gate arrays, combinations of any of these devices or configurations, or combinations of other known devices and configurations, and may implement the functions described below. In an embodiment, the controller 2 includes a central processing unit (CPU).

The storage 3 includes a non-transitory recording medium readable by the CPU in the controller 2. Examples of the storage 3 include a read-only memory (ROM) and a random-access memory (RAM). The storage 3 stores a layout design program 3a for causing the computer apparatus 1 to function as an automatic layout design apparatus. The storage 3 stores a learning program 3b for causing the computer apparatus 1 to function as a learner apparatus. The CPU in the controller 2 executes the layout design program 3a stored in the storage 3 to cause the computer apparatus 1 to function as an automatic layout design apparatus (in other words, an automatic layout design system). The CPU in the controller 2 also executes the learning program 3b stored in the storage 3 to cause the computer apparatus 1 to function as a learner apparatus.

The communicator 4 is connected to a communication network, such as the Internet, with wires or wirelessly. The communicator 4 can communicate with other devices such as a cloud server and a web server through the communication network. The communicator 4 can input information received from the communication network into the controller 2. The communicator 4 can also output information received from the controller 2 to the communication network.

The display 5 is, for example, a liquid crystal display or an organic electroluminescence (EL) display. The display 5 can display various pieces of information, such as characters, symbols, and graphics, as controlled by the controller 2.

The input unit 6 can receive a user input on the computer apparatus 1. The input unit 6 includes, for example, a keyboard and a mouse. The input unit 6 may include a touchscreen to detect a user operation on a display panel of the display 5.

The computer apparatus 1 may have the structure other than the structure described above. For example, the controller 2 may include multiple CPUs. The controller 2 may also include at least one digital signal processor (DSP). The functions of the controller 2 may be implemented entirely or partially using hardware circuits, without using software to implement the functions. The storage 3 may also include a non-transitory computer-readable recording medium other than a ROM and a RAM. Examples of the storage 3 include a small hard disk drive and a solid state drive (SSD). The storage 3 may include a memory such as a universal serial bus (USB) flash drive that is connectable to and removable from the computer apparatus 1.

Automatic Design Process

An automatic design process will now be described in detail. The automatic design process will be described below using components included in an electronic device, but may also be performed for layout objects other than such components of an electronic device. The layout objects may also be referred to as layout components.

The computer apparatus 1 performs a learning process for learning parameters to be used in an automatic layout design system (in other words, an automatic layout design apparatus) through machine learning. The computer apparatus 1 uses, for example, reinforcement learning in the learning process. The computer apparatus 1 can perform a layout design process based on the learned parameters. For example, the computer apparatus 1 may use deep reinforcement learning as reinforcement learning in the learning process. The computer apparatus 1 may use reinforcement learning other than deep reinforcement learning in the learning process. The computer apparatus 1 may learn the parameters through a process other than reinforcement learning. Reinforcement learning or deep reinforcement learning herein refers to learning parameters to be used in an automatic layout design system using the computer apparatus 1.

Figure 2:
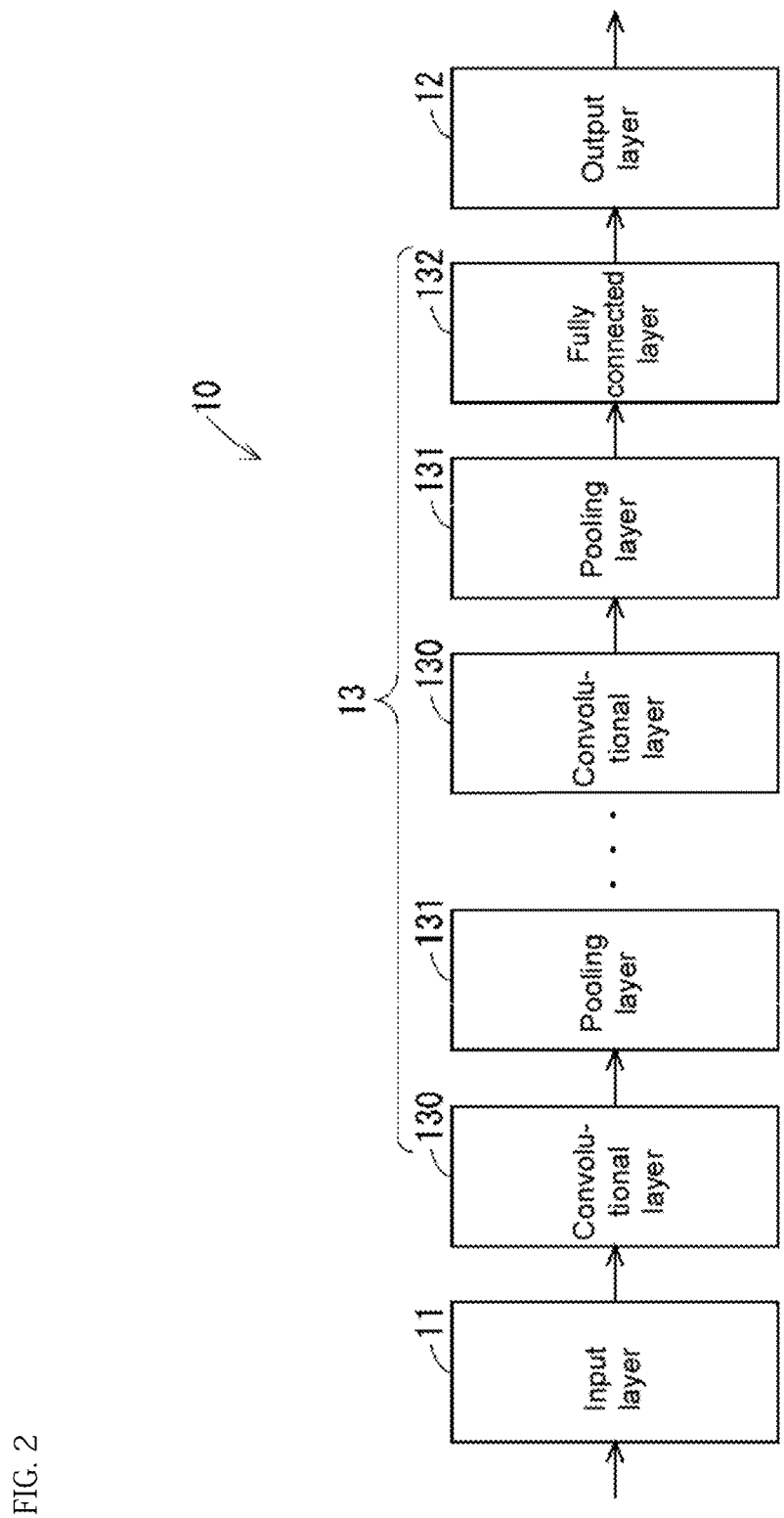
FIG. 2 illustrates a schematic diagram of a neural network in an embodiment.

FIG. 2 is a schematic diagram of the computer apparatus 1 showing its components associated with the automatic design process. As shown in FIG. 2, the computer apparatus 1 includes a neural network 10 to be used in the automatic design process. The neural network 10 may be, for example, a convolutional neural network (CNN). Reinforcement learning includes learning parameters for the neural network 10. The parameters for the neural network 10 include weighting factors indicating the weights for nodes between artificial neurons. The parameters for the neural network 10 may be hereafter referred to as neural network (NN) parameters. The NN parameters resulting from learning may be referred to as learned NN parameters. The neural network 10 performs computations based on the learned NN parameters using input data to allow the computer apparatus 1 to perform a layout design process.

As shown in FIG. 2, the neural network 10 includes, for example, an input layer 11, hidden layers 13, and an output layer 12. The hidden layers 13 are also referred to as middle layers. The hidden layers 13 include, for example, multiple convolutional layers 130, multiple pooling layers 131, and a fully connected layer 132. The neural network 10 includes the fully connected layer 132 upstream from the output layer 12. The neural network 10 includes the convolutional layers 130 and the pooling layers 131 that are alternate to each other between the input layer 11 and the fully connected layer 132. The neural network 10 may be configured differently from the example in FIG. 2. For example, the neural network 10 may include a single convolutional layer 130 and a single pooling layer 131 between the input layer 11 and the fully connected layer 132.

The learning process includes, for example, reinforcement learning using value iteration. The learning process includes, for example, reinforcement learning using Q-learning, which is an example of value iteration. Deep reinforcement learning using Q-learning is called Deep Q-Network (DQN) learning.

The automatic design process uses an observational space defined as a layout space in which layout objects are to be placed. Multiple layout objects are then placed in the layout space. In reinforcement learning, the states of multiple layout objects in the layout space are observed. Reinforcement learning uses an action of moving layout objects. The controller 2, which functions as an agent for reinforcement learning, automatically determines the layout positions of multiple layout objects in the layout space by virtually moving the objects in the layout space based on the relationship between the states of the objects in the layout space and movements of the objects to be performed. The relationship between the states of the multiple layout objects in the layout space and the movements of the layout objects to be performed is determined using NN parameters. In reinforcement learning, the NN parameters are learned for learning the relationship between the states of multiple layout objects in the layout space and the movements of the layout objects to be performed. The NN parameters include, for example, parameters used in the hidden layers 13. More specifically, the NN parameters include filter coefficients used in the convolutional layer 130 and weighting coefficients used in the fully connected layer 132. In an embodiment, the controller 2 determines the layout positions of multiple layout objects in the layout space to avoid interference between these layout objects.

The input layer 11 in the neural network 10 receives input data representing the states of layout objects in the layout space. The output layer 12 in the neural network 10 outputs the value of an action value function, or an action value, for each action. An action value is output from the output layer 12 in response to state data representing one state input into the input layer 11. The action value indicates a probability that an action corresponding to the action value is used in the state. The state data input into the input layer 11 may be hereafter referred to as input-state data. The action value output from the output layer 12 may be referred to as a Q value.

Figure 3:
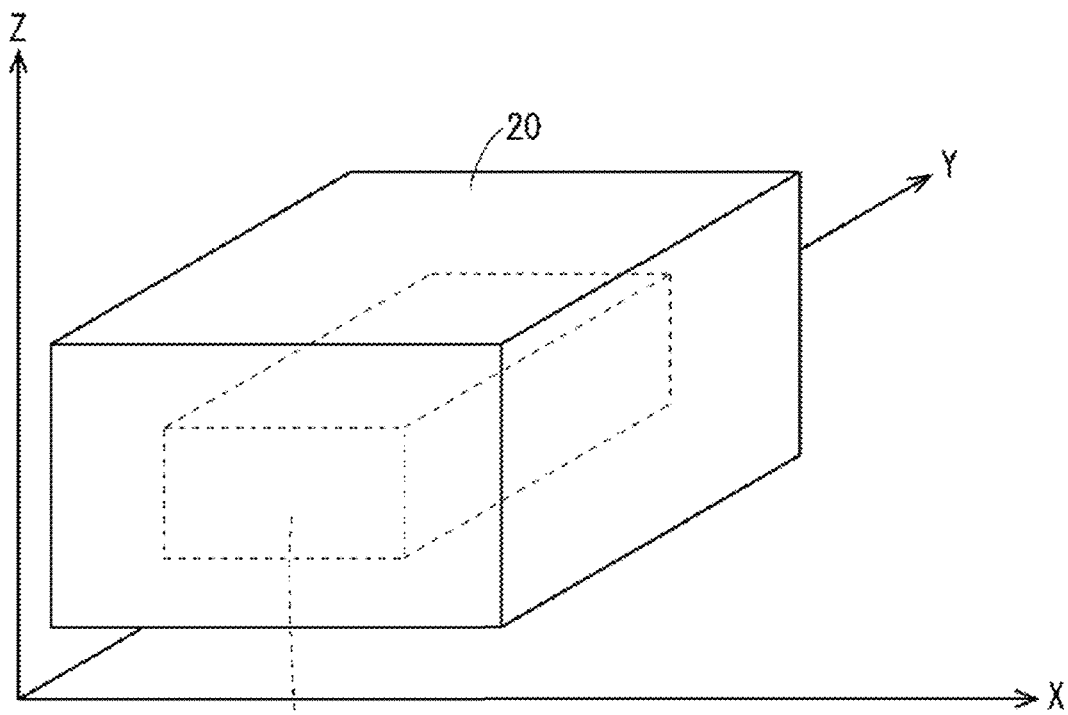
FIG. 3 illustrates a diagram describing an observational space in an embodiment.

The automatic design process in an embodiment uses a rectangular observational space 20 defined in the orthogonal XYZ coordinate system as shown in FIG. 3. The observational space 20 includes a fixed layout space 30. Layout objects are moved virtually in the orthogonal XYZ coordinate system. In an embodiment, the layout space 30 is a three-dimensional (3D) space.

The layout space 30 is defined by, for example, a case that covers the exterior of an electronic device. The case for the electronic device can thus be a space definer that defines the layout space 30. In an embodiment, seven different actions for reinforcement learning are defined, including a movement in +X direction, a movement in −X direction, a movement in +Y direction, a movement in −Y direction, a movement in +Z direction, a movement in −Z direction, and no movement. The output layer 12 in the neural network 10 outputs seven Q values corresponding to the respective actions, which are the movement in +X direction, the movement in −X direction, the movement in +Y direction, the movement in −Y direction, the movement in +Z direction, and no movement. The output layer 12 includes seven output elements that output the respective seven Q values.

In the layout design process, the controller 2, which functions as an agent, determines a movement of each layout object to be performed based on seven Q values output from the output layer 12. In the layout design process, the controller 2 performs, on the layout object, an action corresponding to the largest value of the seven Q values output from the output layer 12. The no movement action may be eliminated from the actions in reinforcement learning.

Input-State Data

Input-state data is generated based on layout-space data representing the layout space 30 and component data representing layout components. Input-state data is generated based on, for example, computer-aided design (CAD) data. The storage 3 stores CAD data for each component of the electronic device. The controller 2 generates layout-space data and component data based on the CAD data stored in the storage 3 and generates input-state data based on the generated layout-space data and component data. The storage 3 may prestore the layout-space data and the component data.

Figure 4:
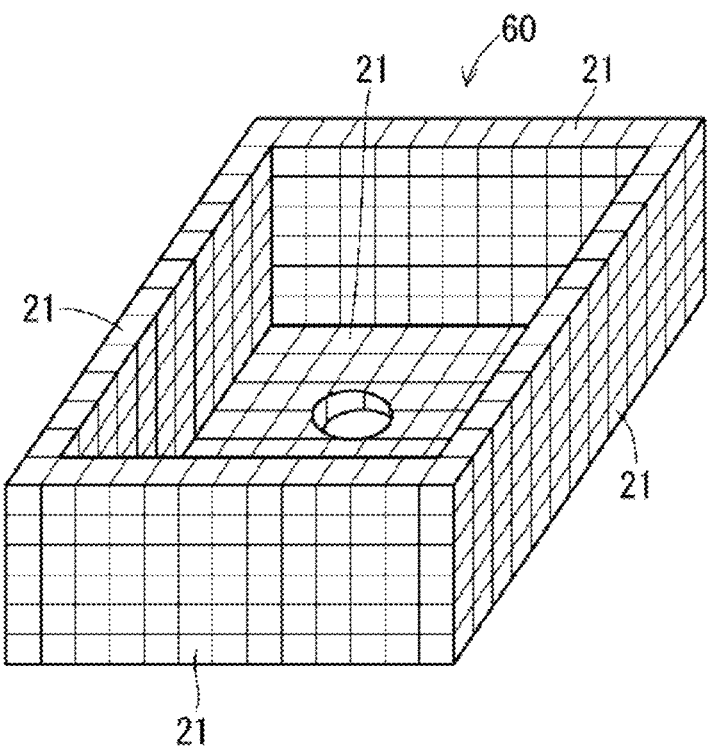
FIG. 4 illustrates a diagram describing a layout object split into multiple elements in an embodiment.

In an embodiment, the controller 2 splits the observational space 20 into multiple split elements 21. The layout space 30 defined in the observational space 20 and any layout component in the observational space 20 are each split into multiple split elements 21. FIG. 4 is a diagram describing a layout component 60 split into multiple split elements 21 in an embodiment. Each split element 21 may be, for example, a cube, but may be in any other shape.

The controller 2 determines the shape of a layout component 60 based on relevant CAD data, and splits the layout component 60 into multiple split elements 21 based on the determined shape. The controller 2 then assigns multiple data values to the respective split elements 21 of the layout component 60. The controller 2 uses array data including data values assigned to the respective split elements 21 of the layout component 60 as component data representing the layout component 60. The component data includes 3D array data. The component data may serve as shape data indicating the shape of the layout component 60.

The controller 2 also determines the shape of the case (in other words, the exterior case) for the electronic device based on the CAD data and defines the layout space 30 in the observational space 20 based on the determined shape. The controller 2 then splits the layout space 30 into multiple split elements 21 and assigns multiple data values to the respective split elements 21. The controller 2 uses array data including data values assigned to the respective split elements 21 of the layout space 30 as layout-space data representing the layout space 30. The layout-space data includes 3D array data, in the same manner as for the component data. The layout-space data may serve as shape data indicating the shape of the layout space.

The electronic device may include the case and holders for holding components. The holders are formed from the same material as the case. In the electronic device, the holders may be integrally molded with the case. For a case formed from resin, for example, holders formed from resin may be integrally molded with the case. For a case for a mobile phone such as a smartphone, for example, a holder for a camera, a holder for a motor, a holder for a speaker, and a holder for a strap may be integrally molded with the case. In the electronic device manufactured, such holders can be part of the case. Unless otherwise specified, holders herein are integrally molded with the case. An object integrally molded with the case, such as a holder, may be referred to as a molded portion.

In an embodiment, the controller 2 performs an automatic design process using a case having a flat surface and having no molded portion. The controller 2 determines the layout space 30 defined by the case having no molded portion. For a component held by a holder to be placed in the layout space 30, the controller 2 processes the component and the holder together as a single layout component to be moved. A component held by a holder is thus virtually moved integrally in the automatic design process. Unless otherwise specified, a case herein has no molded portion. A layout component to be held by a holder may be referred to as a holdable component.

A case and a holder are integrally molded in the manufacture of an electronic device. Thus, a part of the case may serve as the holder. Thus, the holder may be placed to overlap a wall part of the case (in other words, a solid part or a body of the case) in an automatic design process. In other words, one or more layout components may be placed to overlap the wall part of the case. In an embodiment, the controller 2 defines a space inward from an exterior surface of the case to be the layout space 30 that thus includes the wall part of the case. The layout space 30 includes a hollow part inside the case and the wall part of the case. In the automatic design process in an embodiment, a holder may be placed in the layout space to overlap the wall part of the case.

For manufacture of an electronic device, multiple holders may be integrally molded together. One holder may be commonly used for multiple layout components. Thus, holders may overlap one another in the automatic design process. In the automatic design process in an embodiment, a holder may be placed in the layout space to overlap another holder.

In the automatic design process in an embodiment, a component that is not integrally molded with the case, such as a holdable component, cannot be placed to overlap another object. For example, a holdable component as a layout component cannot be placed to overlap another holdable component as a layout component and also cannot be placed to overlap a holder. A component not to be held by a holder, or in other words, a layout component having no holder, cannot be placed to overlap another layout component. A component that cannot be placed to overlap another object may be hereafter referred to as a nonoverlapping component.

In an embodiment, a space surrounding the layout space 30 is also used in the automatic design process. The space surrounding the layout space 30 may be hereafter referred to as a surrounding space. A space including the layout space and the surrounding space may be referred to as a target space.

Figure 5:
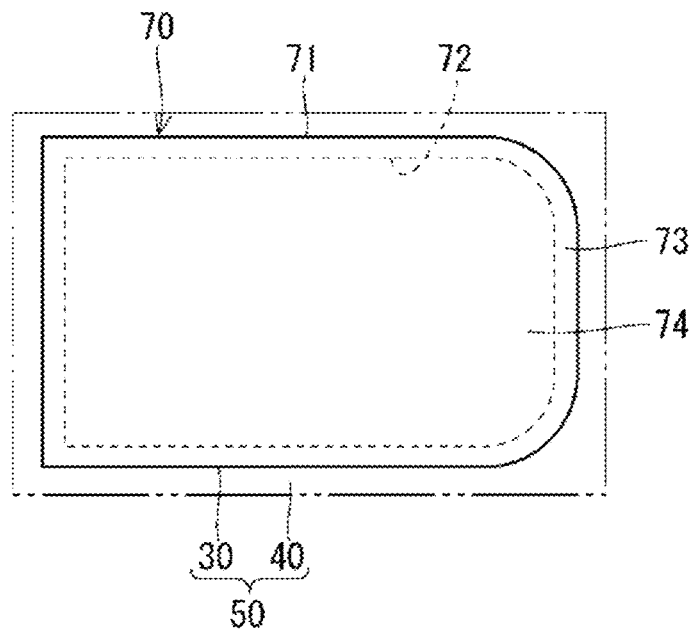
FIG. 5 illustrates a diagram describing a target space in an embodiment.

FIG. 5 is a diagram describing a target space 50 in an embodiment. In the example shown in FIG. 5, the layout space 30 is inward from an exterior surface 71 of a case 70. The layout space 30 includes a wall part 73 (in other words, a solid part 73) between the exterior surface 71 and an interior surface 72 of the case 70, and a hollow part 74 inward from the interior surface 72. The target space 50 includes the layout space 30 defined by the case 70 and a surrounding space 40 surrounding the layout space 30. In an embodiment, the surrounding space 40 is outward from the layout space 30 in the observational space 20. In an embodiment, the target space 50 is thus equal to the observational space 20.

As described above, the observational space 20 is split into multiple split elements, and thus the surrounding space 40 is also split into multiple split elements. The controller 2 then assigns multiple data values to the respective split elements of the target space 50 including the layout space 30 and the surrounding space 40. This assigns multiple data values to the respective split elements of the layout space 30, and multiple data values to the respective split elements of the surrounding space 40. The controller 2 uses array data including the data values assigned to the respective split elements of the surrounding space 40 as surrounding-space data representing the surrounding space 40. The controller 2 uses array data including the data values assigned to the respective split elements of the target space 50 as target-space data representing the target space 50. The target-space data includes layout-space data and the surrounding-space data. The layout-space data and the surrounding-space data each are 3D array data. The controller 2 generates input-state data based on the target-space data and the component data. Data assigned to the split elements of the target space may be referred to as first data. Data assigned to the split elements of a layout component may be referred to as second data.

Figure 6:
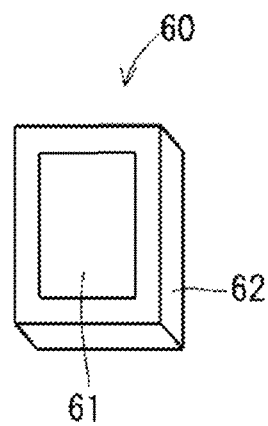
FIG. 6 illustrates a diagram describing a layout object in an embodiment.

FIG. 6 is a diagram describing a layout component 60 including a holdable component 61 and a holder 62 in an embodiment. In the example shown in FIG. 6, the holdable component 61 is a camera, with its periphery held by the holder 62.

Figure 7:
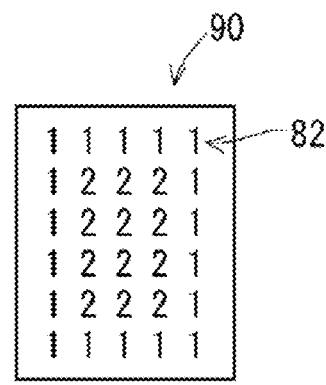
FIG. 7 illustrates a diagram describing component data in an embodiment.

FIG. 7 is a diagram describing component data 90 representing the layout component 60 shown in FIG. 6. Although the component data 90 in FIG. 7 is two-dimensional (2D) data, the component data 90 is actually 3D data. The same applies to other component data shown in subsequent figures. Second data 82 assigned to one split element of the layout component 60 indicates a layout position corresponding to the position of the split element of the layout component 60 in the 3D data array represented by the component data 90. More specifically, the relative position of a portion of the component data 90 indicated by the second data 82 assigned to one split element of the layout component 60 is the same as the relative position of the split element of the layout component 60.

The controller 2 assigns second data 82 indicating, for example, 1 to each split element of a holder, and assigns second data 82 indicating, for example, 2 to each split element of a nonoverlapping component. In the example shown in FIG. 7, data indicating 1 is assigned to each split element of the holder 62 shown in FIG. 6, and data indicating 2 is assigned to each split element of the holdable component 61 shown in FIG. 6.

Figure 8:
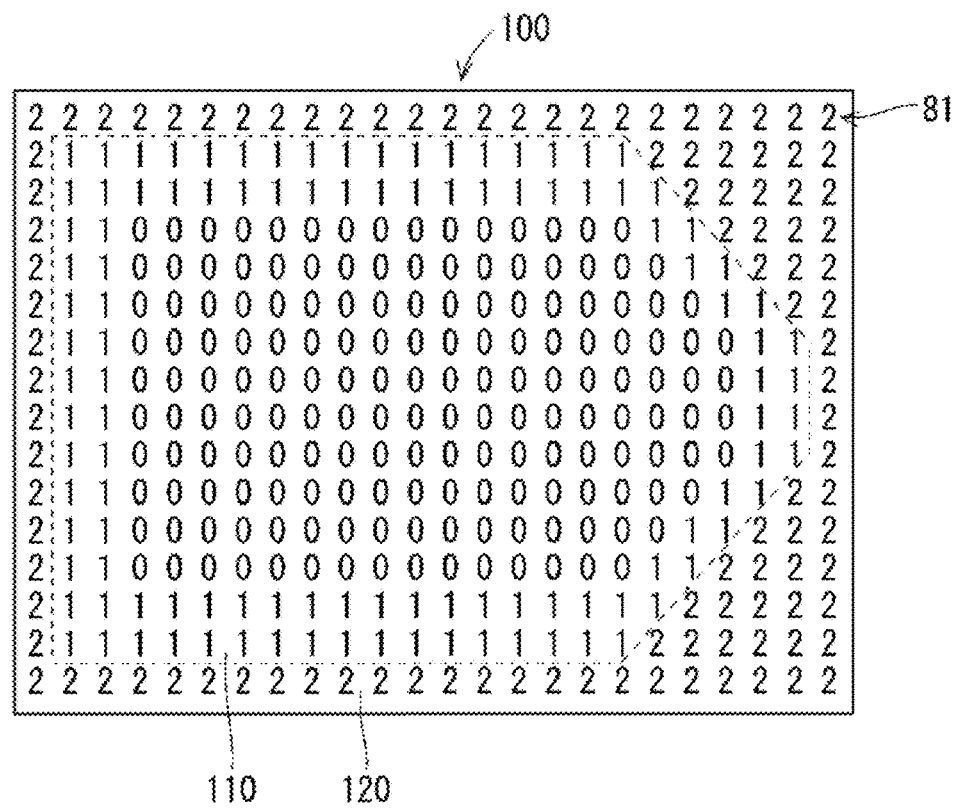
FIG. 8 illustrates a diagram describing target-space data in an embodiment.

FIG. 8 is a diagram describing target-space data 100 representing the target space 50 shown in FIG. 5 described above in an embodiment. Although the target-space data 100 in FIG. 8 is 2D data, the target-space data 100 is actually 3D data. The same applies to any target-space data shown in subsequent figures. First data 81 assigned to one split element of the target space 50 indicates a layout position corresponding to the position of the split element of the target space 50 in the 3D data array represented by the target-space data 100. More specifically, the relative position of a portion of the target-space data 100 indicated by the first data 81 assigned to one split element of the target space 50 is the same as the relative position of the split element of the target space 50. In FIG. 8, an array data portion boxed with a dashed line is layout-space data 110, and an array data portion outside the dashed line is surrounding-space data 120.

The controller 2 assigns first data 81 indicating, for example, 0 to each split element of the hollow part of the case defining the layout space 30. The controller 2 assigns first data 81 indicating, for example, 1 to each split element of the wall part of the case, in the same manner as for the holder. The controller 2 then assigns first data 81 indicating, for example, 2 to each split element of the surrounding space, in the same manner as for the nonoverlapping component. In the example shown in FIG. 8, data indicating 0 is assigned to each split element of the hollow part 74 of the case 70 shown in FIG. 5, and data indicating 1 is assigned to each split element of the wall part 73 of the case 70. In the example shown in FIG. 8, data indicating 2 is assigned to each split element of the surrounding space 40 shown in FIG. 5.

Input-state data representing the states of multiple layout components in the layout space includes merged array data including multiple sets of component data representing the respective layout components merged with target-space data at the respective positions of the layout components corresponding to the sets of component data in the layout space. The merged array data may be hereafter referred to as input merged data.

Figure 9:
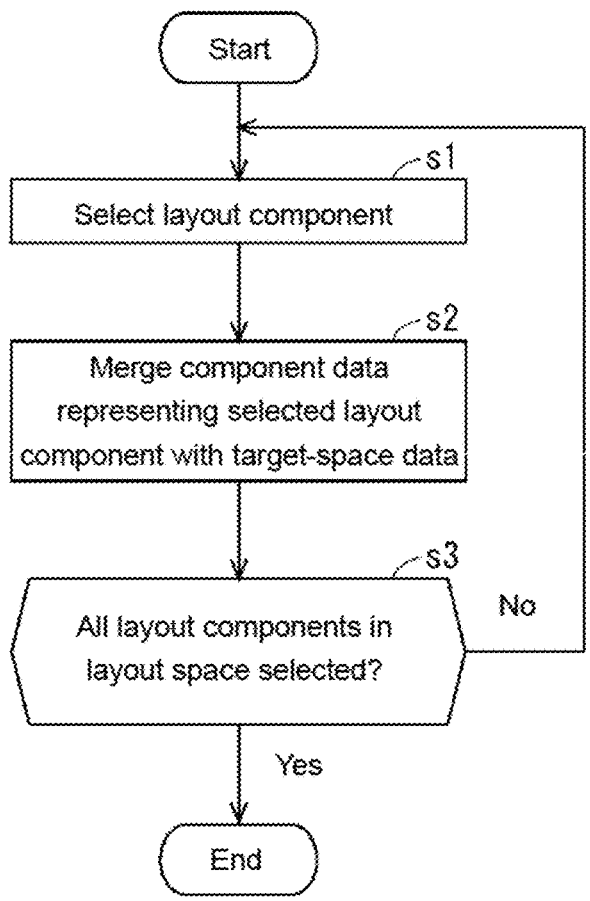
FIG. 9 illustrates a flowchart showing an operation of a computer apparatus in an embodiment.

In an embodiment, the input-state data simply includes input merged data. In other words, the input-state data is the input merged data in an embodiment. FIG. 9 is a flowchart showing a method for generating input merged data (in other words, a method for generating input-state data) in an embodiment. In the example shown in FIG. 9, input merged data is generated by sequentially merging multiple sets of component data with target-space data. The method for generating input merged data is not limited to the example shown in FIG. 9. Each position in the 3D array of the target-space data may be hereafter referred to as a first data position. Each position in the 3D array of the component data may be hereafter referred to as a second data position.

As shown in FIG. 9, in step s1, the controller 2 selects one layout component from multiple layout components in the layout space. The layout component selected in step s1 may be hereafter referred to as a select-component.

In step s2, the controller 2 merges component data representing a select-component with target-space data in accordance with the position of the select-component in the layout space. In step s2, the controller 2 first determines an area of the target space occupied by the select-component as a select-component area. The controller 2 then determines a data area of the target-space data including first data corresponding to each split element of the determined select-component area as select-component area data. The select-component area data is 3D array data. The controller 2 then merges the component data representing the select-component with the determined select-component area data in the target layout space. This generates the target-space data merged with the component data representing the select-component. The target-space data merged with the component data may be hereafter referred to as merged target-space data.

To merge component data with select-component area data, the controller 2 adds, for each first data position of the select-component area data in the 3D array, second data at a second data position corresponding to each first data position in the 3D array of the component data. This changes the first data. When the first data at the first data position of the target-space data indicates 1 and the second data to be added to the first data also indicates 1, the controller 2 maintains the first data indicating 1 at the first data position, without adding the second data to the first data at the first data position.

In step s3, the controller 2 determines whether all layout components in the layout space have been selected. When the determination result is negative in step s3, the processing in step s1 is performed again. In the second or subsequent cycles of step s1, the controller 2 selects one layout component from unselected ones of the multiple layout components in the layout space.

In step s2, the controller 2 merges component data representing the newly selected select-component with the merged target-space data generated in the previous step s2 in accordance with the position of the select-component in the layout space.

In the second or subsequent cycles of step s2, the controller 2 first determines an area of the target space occupied by the select-component as a select-component area, in the same manner as in the first cycle of step s2. The controller 2 then determines an area of the merged target-space data, obtained in the previous cycle of step s2, including first data corresponding to each split element of the determined select-component area as select-component area data. The controller 2 then merges component data representing the new select-component with the select-component area data included in the merged target-space data obtained in the previous cycle of step s2. The merged target-space data resulting from the second cycle of step s2 includes two sets of component data that have been merged together. In general, merged target-space data resulting from the N-th (N≥1) cycle of step s2 includes N sets of component data that have been merged together. After step s2, the processing in step s3 is performed. The controller 2 thereafter operates in the same manner.

When the determination result is affirmative in step s3, the controller 2 uses the merged target-space data obtained in the immediately preceding cycle of step s2 as input merged data, and ends the process for generating the input merged data. For M layout components (≥2) in the layout space, target-space data including M sets of component data that have been merged together is used as the input merged data, which is input into the input layer 11 in the neural network 10. Each set of data included in the merged target-space data may be hereafter referred to as third data, or third data 83.

A specific example of the process shown in FIG. 9 will now de described using the component data 90 and the target-space data 100 shown in FIGS. 7 and 8 described above.

Figure 10:
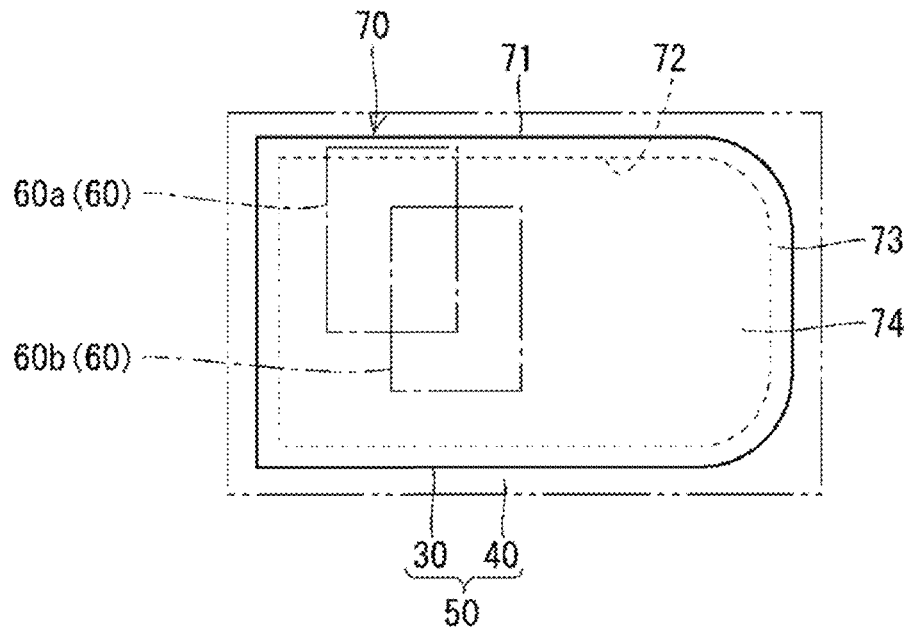
FIG. 10 illustrates a diagram describing layout objects placed in a layout space in an embodiment.
Figure 11:
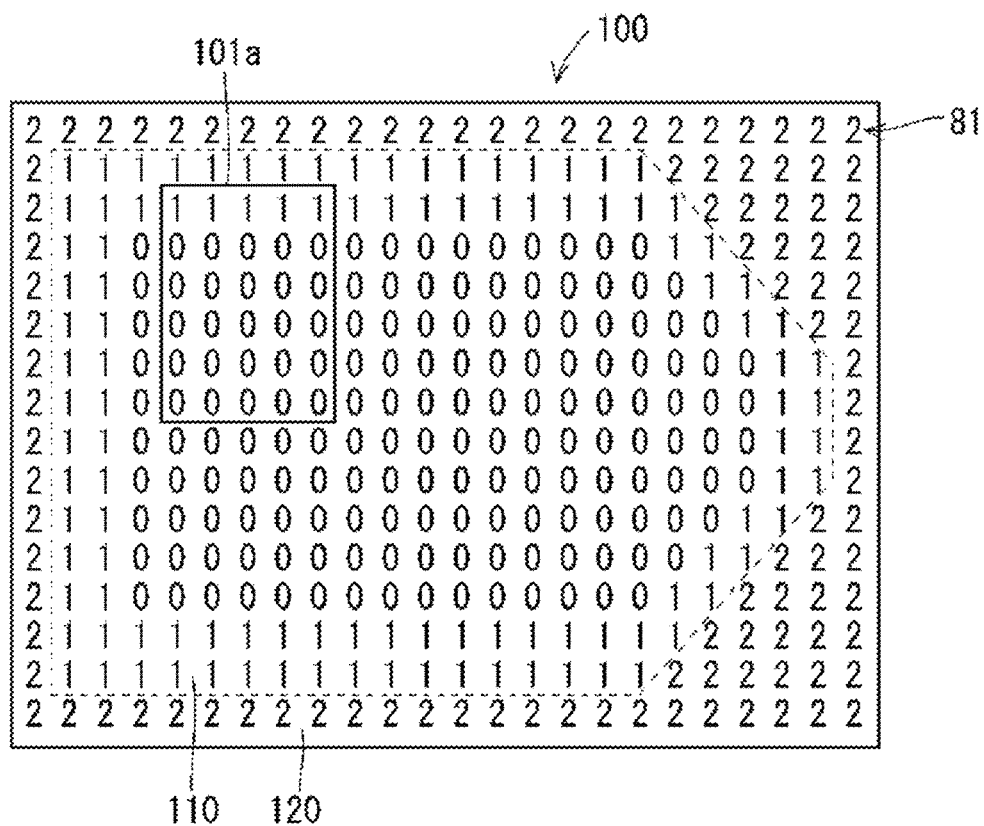
FIG. 11 illustrates a diagram describing target-space data in an embodiment.
Figures 12, 13:
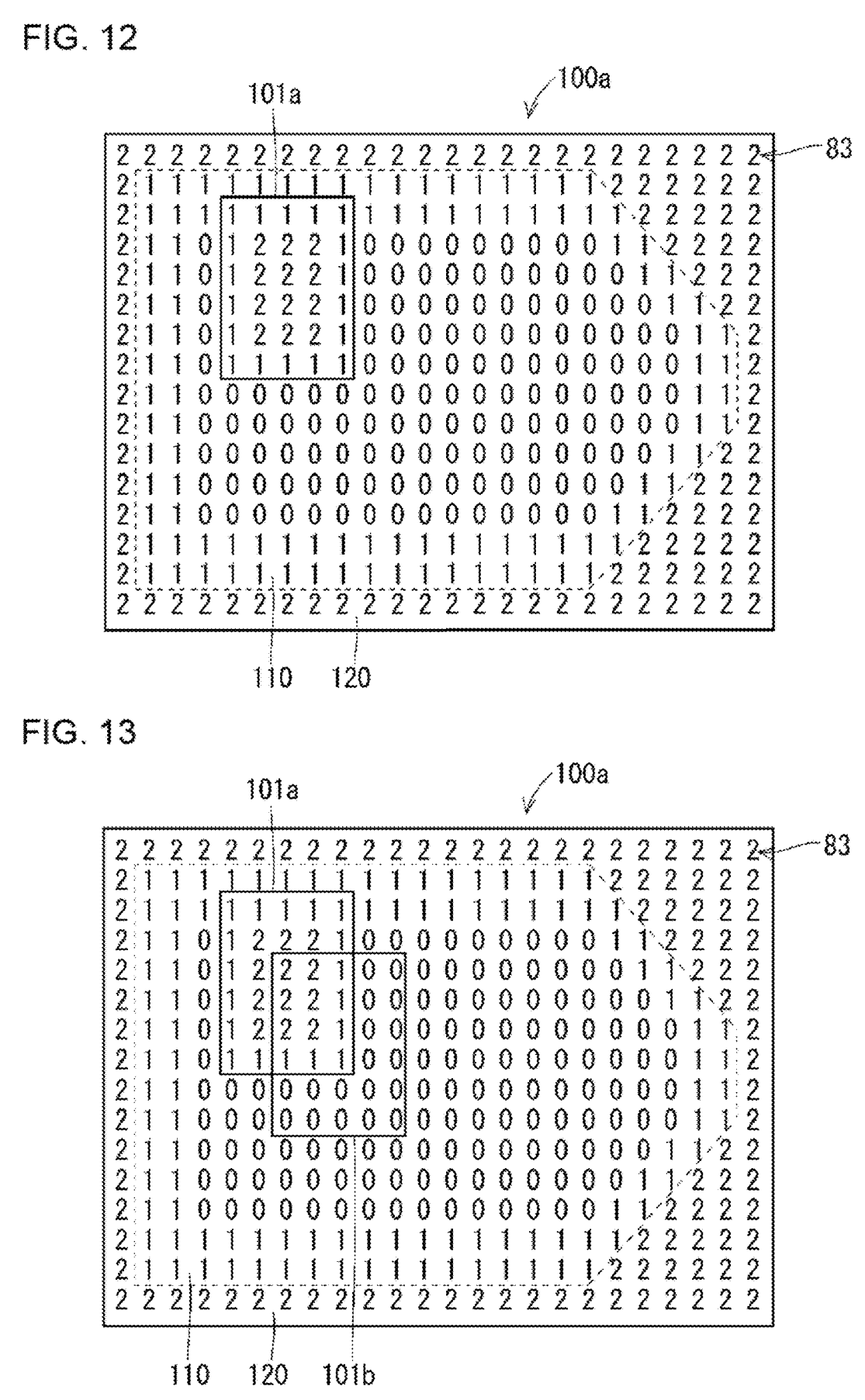

As shown in FIG. 10, for example, the two layout components 60 shown in FIG. 6 are placed in the layout space 30. The two layout components 60 are referred to as a layout component 60a and a layout component 60b. The controller 2 first selects, for example, the layout component 60a from the layout components 60a and 60b (in the first cycle of step s1). Select-component area data 101a in this state is shown in FIG. 11. In step s2, the controller 2 merges the component data 90 representing the layout component 60a shown in FIG. 7 described above with the select-component area data 101a. Merged target-space data 100a obtained in step s2 is shown in FIG. 12.

Figures 14, 15:
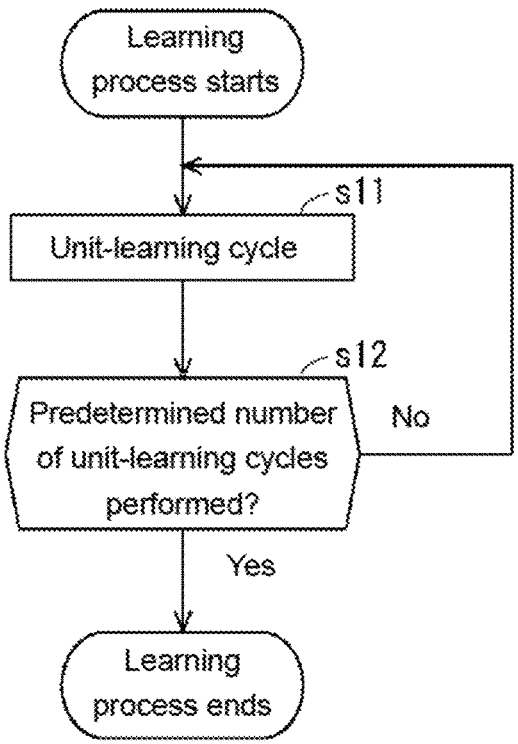
FIG. 14 illustrates a diagram describing merged target-space data in an embodiment.
FIG. 15 illustrates a flowchart showing an operation of a computer apparatus in an embodiment.

The controller 2 then selects the layout component 60b (in the second cycle of step s1). Select-component area data 101b in this state is shown in FIG. 13. In the second cycle of step s2, the controller 2 merges the component data 90 representing the layout component 60b shown in FIG. 7 described above with the select-component area data 101b. Merged target-space data 100b obtained in the second cycle of step s2 is shown in FIG. 14. In the example shown in FIG. 10, the merged target-space data 100b shown in FIG. 14 is used as the input merged data.

The merged target-space data 100b shown in FIG. 14 can be used to determine the states of the layout components 60a and 60b in the layout space. For example, a data area with a portion of the merged target-space data 100b indicating 4 is an area of the layout space in which a holdable component as the layout component 60a and a holdable component as the layout component 60b overlap each other. For example, a data area with a portion of the merged target-space data 100b indicating 3 is an area of the layout space in which the holdable component as one of the layout components 60a and 60b overlaps the holdable component as the other one of the layout components 60a and 60b.

Learning Process

In reinforcement learning, NN parameters are learned based on rewards. In an embodiment, a reward is determined based on whether each layout component interferes with any other object in the target space. In reinforcement learning, a negative reward (specifically, penalty) is provided when any layout component interferes with another object in the target space, and a positive reward is provided when no layout component interferes with another object in the target space.

As described above, a holder is permitted to overlap the wall part of the case in an embodiment. Thus, in reinforcement learning, a holder overlapping the wall part of the case is not determined as interfering. A holder is also permitted to overlap another holder in an embodiment. Thus, in reinforcement learning, a holder overlapping another holder is also not determined as interfering.

However, a nonoverlapping component such as a holdable component is not permitted to overlap another object. Thus, in reinforcement learning, a nonoverlapping component overlapping another object is determined as interfering. This reduces the likelihood that a nonoverlapping component is automatically placed to overlap another object in a layout design process.

In reinforcement learning, a layout component at least partially being outside the layout space is determined as interfering. This reduces the likelihood that a layout component is placed to be at least partially outside the layout space in a layout design process.

Any interference in the target space can be detected using the input merged data. As described above, data indicating 1 is assigned to each split element of the wall part of the case, and data indicating 0 is assigned to each split element of the hollow part of the case. Data indicating 1 is assigned to each split element of a holder. For first data at a first data position of target-space data indicating 1 and second data indicating 1 to be added to the first data, the first data indicating 1 is maintained without the second data being added to the first data at the first data position, as described above using the process for generating input merged data. Under these rules, a data area of the input merged data indicating a value of 2 or less indicates no interference in a partial space corresponding to the data area in the layout space. A data area of the input merged data indicating a value of 3 or greater indicates interference occurring in a partial space corresponding to the data area of the layout space. The determination for any interference occurring in the target space based on the input merged data may be hereafter referred to as an interference determination.

FIG. 15 is a flowchart showing a learning process in an embodiment. The learning process shown in FIG. 15 is implemented by the controller 2 executing the learning program 3b stored in the storage 3. FIG. 15 shows an operation of the controller 2 performing reinforcement learning while moving multiple layout components of an electronic device in the target space. For example, the controller 2 performs reinforcement learning using two neural networks 10. Each of the layout components of the electronic device used in reinforcement learning may be hereafter referred to as a learning target component. The two neural networks 10 used in reinforcement learning may be referred to as a first neural network and a second neural network.

The first neural network outputs Q values for determining an action to be performed on each learning target component. The controller 2 uses seven Q values output from the first neural network to determine actions to be performed on the respective learning target components. Similarly, the second neural network outputs Q values for determining an action to be performed on each learning target component. The controller 2 uses six Q values output from the second neural network to determine actions to be performed on the respective learning target components.

The learning process involves unit-learning repeated a predetermined number of times for learning the NN parameters for the first and second neural networks while multiple learning target components are being moved in the target space until no interference occurs between them. In step s11, as shown in FIG. 15, the controller 2 performs unit-learning for learning the NN parameters for the first and second neural networks. In step s12, the controller 2 then determines whether a predetermined number of unit-learning cycles have been performed. The predetermined number is set to, for example, several tens to several hundred times. When the determination result is affirmative in step s2, the learning process ends. This generates learned NN parameters to be used in a layout design process. When the determination result is negative in step s2, the processing in step s11 is performed again. The controller 2 thereafter operates in the same manner as described above. In the second or subsequent cycles of step s11, the NN parameters learned in the immediately preceding cycle of step s11 are learned further. Through every cycle of unit-learning, the NN parameters are learned further for the first and second neural networks. The NN parameters for the first and second neural networks resulting from the predetermined number of unit-learning cycles then serve as the learned NN parameters to be used in the layout design process. After the learning process ends, the controller 2 stores the learned NN parameters for the first and second neural networks into the storage 3.

Figure 16:
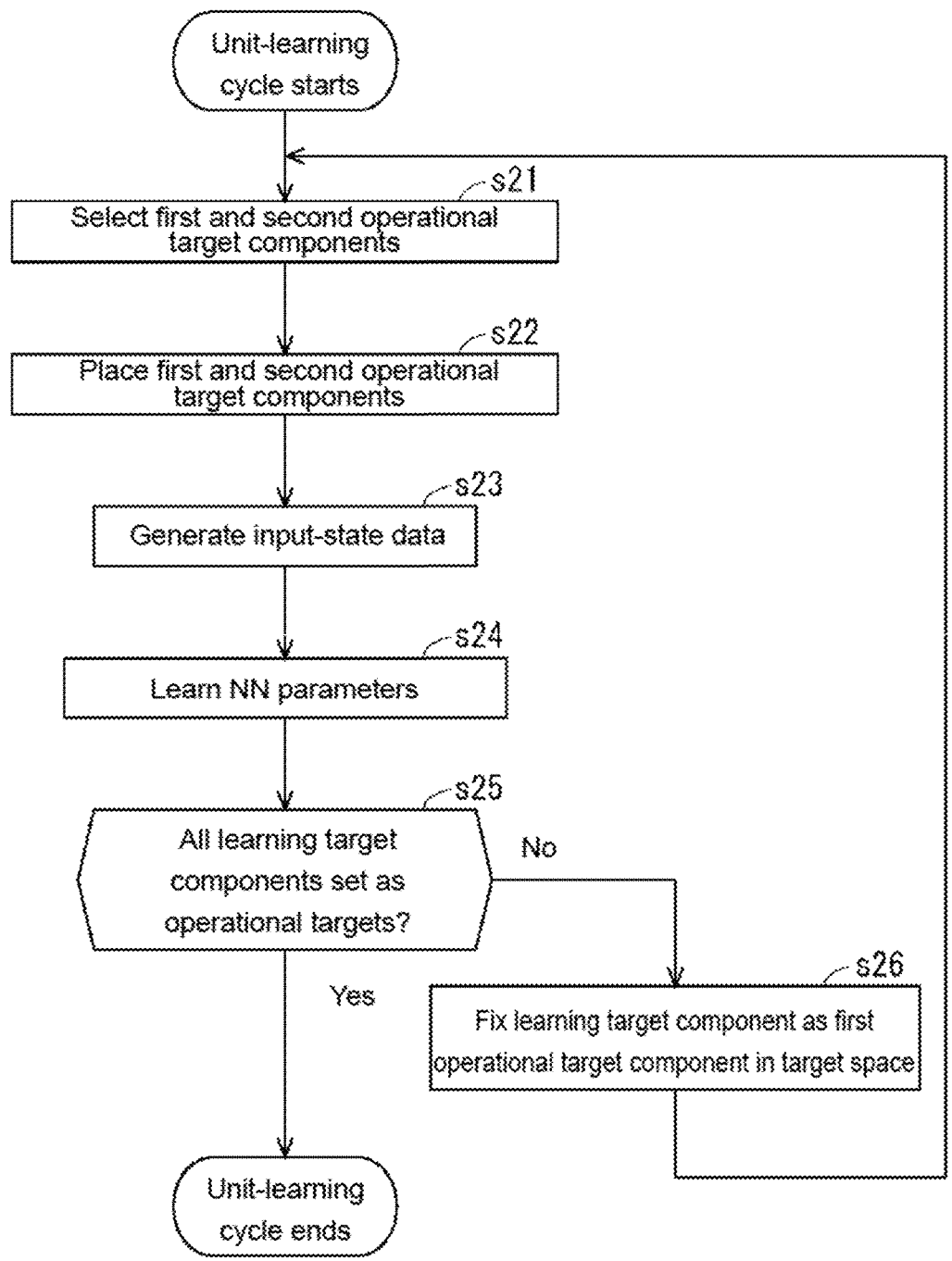
FIG. 16 illustrates a flowchart showing the operation of the computer apparatus in an embodiment.

FIG. 16 is a flowchart showing a unit-learning cycle in an embodiment. As shown in FIG. 16, the unit-learning cycle starts from step s21. In step s21, the controller 2 selects, as operational targets, two learning target components from multiple learning target components. The controller 2 selects, for example, a learning target component with the largest volume as a first operational target component and a learning target component with the second largest volume as a second operational target component. The controller 2 uses the first operational target component as a learning target component for the first neural network, and the second operational target component as a learning target component for the second neural network.

In step s22, the controller 2 then places the first and second operational target components in the target space. The controller 2 places the first and second operational target components to cause these components to interfere with each other in the layout space. In step s22, for example, the controller 2 places the first and second operational target components in the target space to cause their centers to align with the center of the layout space.

In step s23, the controller 2 generates input-state data representing the states of the first and second operational target components in the layout space (in other words, input merged data) through the process shown in FIG. 9 described above. For example, the first and second operational target components are the layout components 60a and 60b shown in FIG. 10 described above. When the first and second operational target components are placed in the layout space 30 as shown in FIG. 10 in step s22, the input merged data shown in FIG. 14 described above is generated in step s23.

In step s24, the controller 2 learns the NN parameters for the first and second neural networks using the input merged data. The controller 2 learns the NN parameters for the first and second neural networks while moving the first and second operational target components in the target space until no interference occurs between them. The controller 2 determines an action to be performed on the first operational target component based on an output from the first neural network, and determines an action to be performed on the second operational target component based on an output from the second neural network. The controller 2 ends the processing in step s24 when the first and second operational target components no longer interfere with any other object. The controller 2 then performs the processing in step s25. The processing in step s24 will be described in detail later.

In step s25, the controller 2 determines whether all the learning target components have been set as operational targets. When the determination result is affirmative in step s25, the unit-learning cycle in step s11 ends. When the determination result is negative in step s25, the processing in step s26 is performed. In step s26, the controller 2 fixes the position of the learning target component as the first operational target component in the target space to its position at the completion of step s24 (in other words, at the time when interference no longer occurs in the target space). In the subsequent processing in the unit-learning cycle, the learning target component as the first operational target component remains at the position fixed in the target space.

Following step s26, the controller 2 performs the processing in step s21 again. In the second or subsequent cycles of step s21, the controller 2 determines the learning target component used as the second operational target component in the previous cycle of step s21 as a new first operational target component. The controller 2 then selects, as a new second operational target component, a learning target component with the largest volume from learning target components that have yet to be set as operational targets.

The controller 2 then performs the processing in step s22, and places the first and second operational target components in the layout space to cause the new first and second operational target components to interfere with each other. This causes the target space to include the learning target components that have been placed at the fixed position in step s26 as well as the newly placed first and second operational target components.

The controller 2 then performs the processing in step s23 to generate, for multiple learning target components including the first and second operational target components currently in the target space, input merged data representing the states of the multiple learning target components in the layout space through the process shown in FIG. 9. The controller 2 then performs the processing in step s24, and thereafter operates in the same manner as described above. At the time when the determination result in step s25 is affirmative, each learning target component of the electronic device is placed in the layout space without interfering with another object. More specifically, the unit-learning cycle ends when each learning target component of the electronic device is placed in the layout space without interfering with another object.

Figure 17:
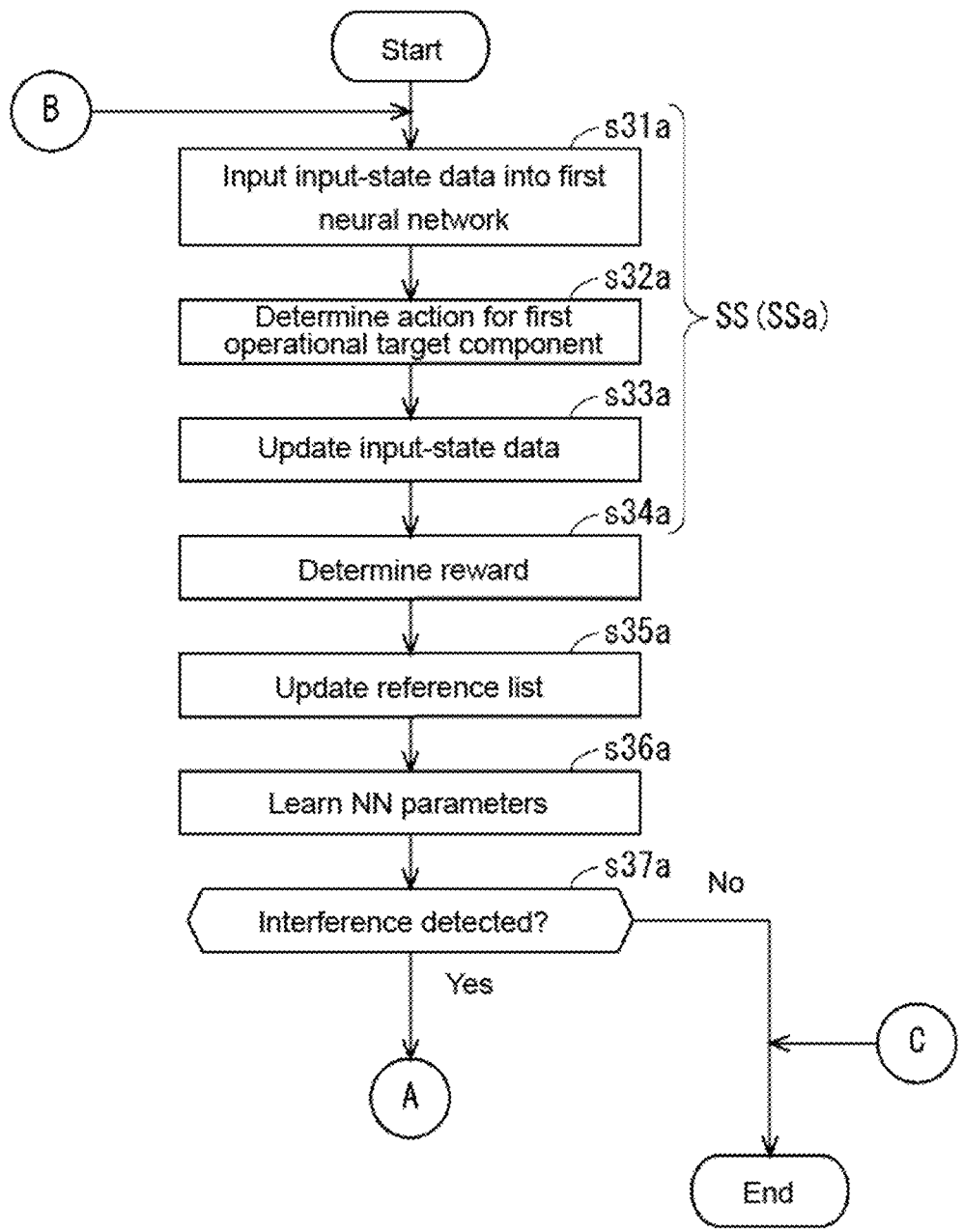
FIG. 17 illustrates a flowchart showing the operation of the computer apparatus in an embodiment.
Figure 18:
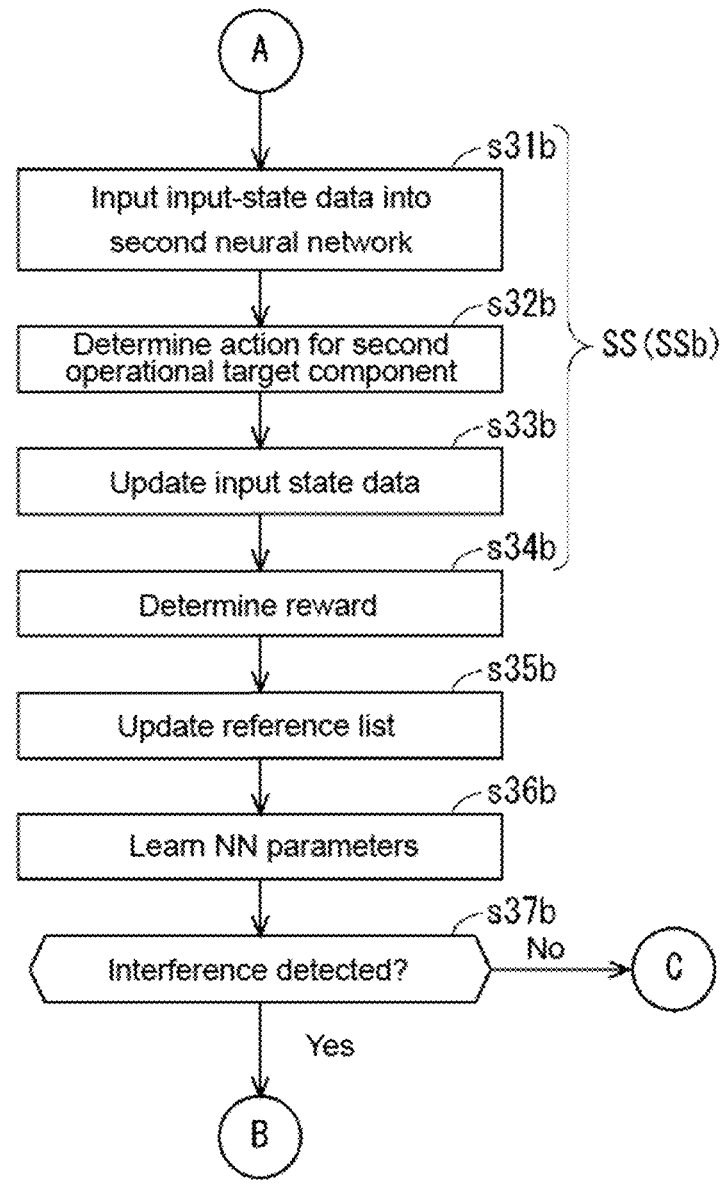
FIG. 18 illustrates a flowchart showing the operation of the computer apparatus in an embodiment.

FIGS. 17 and 18 are flowcharts showing the processing in step s24 in an embodiment in detail. In step s24, as shown in FIG. 17, the processing in step s31a is performed first. In step s31a, the controller 2 inputs the input-state data generated in step s23 (specifically, input merged data) into the first neural network. The neural network 10 includes multiple input elements that receive respective sets of third data included in the input-state data. When, for example, the input merged data is 3D array data including 50×50×50 sets of third data, the input layer 11 includes 125,000 input elements.

In step s32a, the controller 2 then determines an action for the first operational target component for the first neural network, and performs the determined action on the first operational target component. The controller 2 uses, for example, Epsilon-Greedy to determine an action for the first operational target component. The controller 2 randomly determines an action for the first operational target component with a probability $\alpha$. The controller 2 then determines an action for the first operational target component with a probability $(1-\alpha)$ based on an output from the first neural network that has received the input-state data in step s31b. The controller 2 reduces the probability $\alpha$ to be used in step s32a for a larger number of times the processing in step s32a is performed. When determining an action for the first operational target component based on an output from the first neural network, the controller 2 performs an action corresponding to the largest one of the seven Q values output from the first neural network on the first operational target component.

In step s32a, for example, the controller 2 may move the first operational target component by a distance corresponding to one split element. For example, the controller 2 may move the first operational target component in +X direction by a distance corresponding to one split element.

Following step s32a, the processing in step s33a is performed. In step s33a, the controller 2 updates the input-state data (specifically, the input merged data) in accordance with the action determined for the first operational target component in step s32a. The controller 2 that has moved the first operational target component in step s32a then generates input-state data representing the states of the moved multiple learning target components in the layout space to update the input-state data. When the action determined for the first operational target component in step s32a indicates no movement, the controller 2 uses the input-state data used in step s31a as the updated input-state data.

In step s34a, the controller 2 determines a reward based on the latest input-state data (in other words, the updated input-state data). In other words, the controller 2 determines the reward based on the states of the multiple learning target components in the layout space after the action is performed on the first operational target component. The controller 2 sets a larger reward for no interference occurring in the target space and sets a smaller reward for any interference occurring in the target space. A method for determining rewards in an embodiment will be described below.

The controller 2 determines whether the latest input merged data includes third data indicating a value of 3 or greater. When determining that the input merged data includes no third data indicating a value of 3 or greater, the controller 2 determines a reward to be, for example, a positive fixed value. The fixed value is determined in accordance with, for example, the number of multiple sets of third data included in the input merged data.

As described above, a data area of the input merged data indicating a value of 3 or greater indicates interference occurring in a partial space corresponding to the data area of the layout space. Thus, the controller 2 determines the reward to be a positive value when detecting no interference in the target space after the action is performed on the first operational target component in step s32a.

When determining that the input merged data includes third data indicating a value of 3 or greater, the controller 2 determines the reward to be a negative value. In other words, the controller 2 determines the reward to be a negative value when detecting interference in the target space after the action is performed on the first operational target component in step s32a. The controller 2 adds the values of 3 or greater included in the input merged data together, and determines a negative value for the resultant value to be the reward. For example, the input merged data is the same as the merged target-space data 100b shown in FIG. 14 described above. In this case, the input merged data includes eight sets of third data 83 each indicating a value of 3, and two sets of third data 83 indicating a value of 4. Thus, the reward is set to a value of −32. The reward is set to a smaller value for a larger area involving interference in the target space.

When the reward is determined in step s34a, the controller 2 updates a reference list used for learning the NN parameters in step s35a. In step s36a, the controller 2 learns the NN parameters for the first neural network and the second neural network based on the updated reference list. Steps s35a and s36a will be described in detail later.

In step s37a, the controller 2 performs an interference determination. More specifically, the controller 2 determines whether interference occurs in the target space after the action is performed on the first operational target component in step s32a based on the latest input-state data. More specifically, the controller 2 determines whether at least one of the multiple learning target components placed in the target space interferes with another object. When the determination result is negative in step s37a, the processing in step s24 ends. When the determination result is affirmative in step s37a, the processing in step s31b is performed.

In step s31b, as shown in FIG. 18, the controller 2 inputs the current input-state data (specifically, the current input merged data) into the second neural network. In other words, the controller 2 inputs the input merged data updated in step s33a into the second neural network.

In step s32b, the controller 2 then determines an action for the second operational target component for the second neural network in the target space, and performs the determined action on the second operational target component. Similarly to determining an action for the first operational target component, the controller 2 may use Epsilon-Greedy in determining an action for the second operational target component. The controller 2 randomly determines an action for the second operational target component with a probability β. The controller 2 then determines an action for the second operational target component with a probability (1−β) based on an output from the second neural network that has received the input-state data in step s31b. The controller 2 reduces the probability β to be used in step s32b for a larger number of times the processing in step s32b is performed. When determining an action for the second operational target component based on an output from the second neural network, the controller 2 performs an action corresponding to the largest one of the seven Q values output from the second neural network on the second operational target component. In step s32b, for example, the controller 2 may move the second operational target component by a distance corresponding to one split element.

Following step s32b, the processing in step s33b is performed. In step s33b, the controller 2 updates the input-state data (specifically, the input merged data) in accordance with the action for the second operational target component in step s32b, similarly to the processing in step s33a.

In step s34b, the controller 2 determines a reward based on the latest input-state data, similarly to the processing in step s34a. In step s35b, the controller 2 then updates the reference list. In step s36b, the controller 2 learns the NN parameters for the first neural network and the second neural network learned in step s36a based on the updated reference list. Steps s35b and s36b will be described in detail later.

In step s37b, the controller 2 performs an interference determination. More specifically, the controller 2 determines whether interference occurs in the target space after the action is performed on the second operational target component in step s32b. When the determination result is negative in step s37b, the processing in step s24 ends. When the determination result is affirmative in step s37b, the processing in step s31a is performed again. The controller 2 thereafter operates in the same manner as described above. In the second or subsequent cycles of step s31a, the input-state data updated in the immediately preceding cycle of step s33b is input into the first neural network. In the second or subsequent cycles of step s31b, the input-state data updated in the immediately preceding cycle of step s33a is input into the second neural network.

In the processing in step s24 described above, an action for the first operational target component and an action for the second operational target component are determined alternately. For every action determined for a learning target component as an operational target, the input-state data is updated, the reward is determined, the reference list is updated, the NN parameters are learned, and an interference determination is performed. When no interference is detected in the interference determination, the processing in step s24 ends.

The processing in steps s31a to s34a performed before the reference list is updated and the processing in steps s31b to s34b performed before the reference list is updated may each be hereafter referred to as a pre-update process SS. A pre-update process SS from steps s31a to s34a may be referred to as a pre-update process SSa. A pre-update process SS from steps s31b to s34b may be referred to as a pre-update process SSb.

Figure 19:
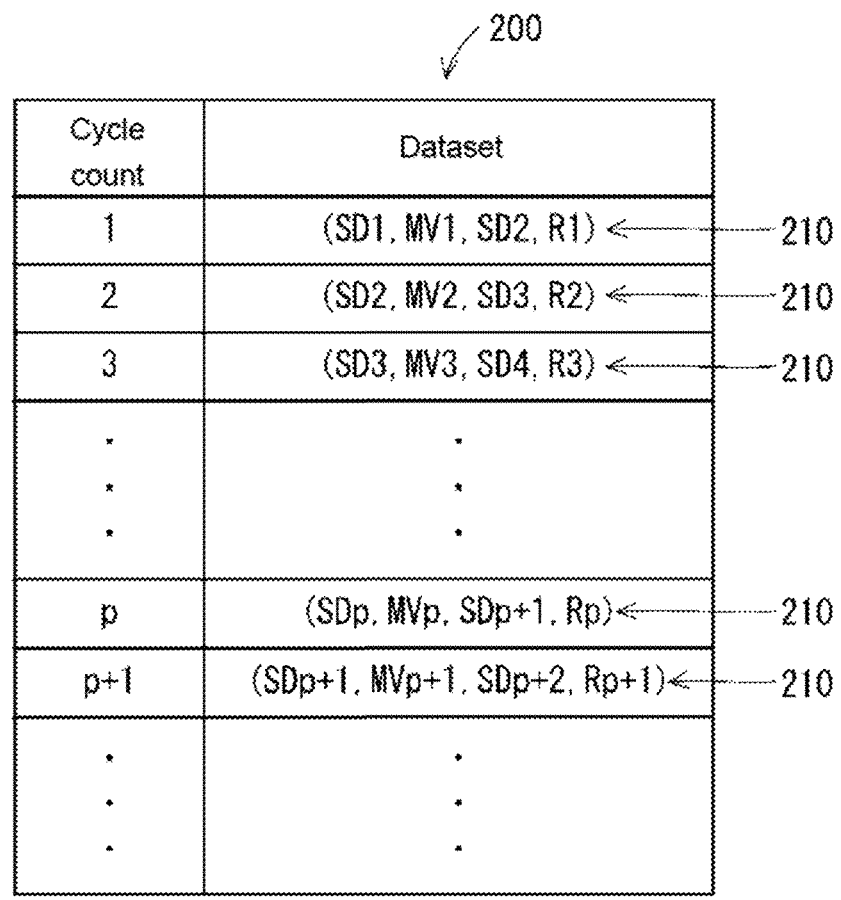
FIG. 19 illustrates a table showing a reference list in an embodiment.

Steps s35a and 35b and steps s36a and 36b will now be described in detail. FIG. 19 is a table showing a reference list 200 in an embodiment. As shown in FIG. 19, the reference list 200 stores a dataset 210 for each count of the pre-update process SS performed. The count for the pre-update process SS is increased every time when the pre-update process SSa or the pre-update process SSb is performed. The count for the pre-update process SS is thus the sum of the number of times the pre-update process SSa is performed and the number of times the pre-update process SSb is performed. The reference list 200 includes multiple datasets 210.

In the p-th pre-update process SS (p≥1), input-state data (specifically, input merged data) input into the neural network 10 is data SDp. In the p-th pre-update process SS, action data indicating an action to be performed on a learning target component as an operational target is data MVp. The reward determined in the p-th pre-update process SS is a reward Rp. The reward Rp may serve as a reward obtainable after the action is performed on the learning target component. In the p-th pre-update process SS, input-state data updated in accordance with the action for the learning target component is input into the neural network 10 in the (p+1)th pre-update process SS. Thus, in the p-th pre-update process SS, input-state data updated in accordance with the action for learning target component is data SDp+1.

The dataset 210 resulting from the pre-update process SS performed p times includes the input-state data SDp, the action data MVp, the input-state data SDp+1, and the reward Rp. The dataset 210 corresponding to the p-th pre-update process SS includes the dataset (SDp, MVp, SDp+1, Rp) including the input-state data SDp, the action data MVp, the input-state data SDp+1, and the reward Rp.

When the q-th pre-update process SSa (q≥1) is the p-th pre-update process SS, the controller 2 generates a dataset 210 corresponding to the p-th pre-update process SS based on the q-th pre-update process SSa in step s35a immediately after the q-th pre-update process SSa. More specifically, the controller 2 uses, as the input-state data SDp, input-state data input into the first neural network in step s31a in the q-th pre-update process SSa. The controller 2 also uses, as the action data MVp, action data indicating the action performed on the first operational target component in step s32a in the q-th pre-update process SSa. When, for example, the action performed on the first operational target component in step s32a in the q-th pre-update process SSa is a movement in +X direction, the controller 2 generates the action data MVp indicating the movement in +X direction. The controller 2 also uses, as the input-state data SDp+1, input-state data updated in step s33a in the q-th pre-update process SSa. The controller 2 uses, as the reward Rp, the reward determined in step s34a in the q-th pre-update process SSa. The controller 2 then adds the dataset (SDp, MVp, SDp+1, Rp) resulting from the q-th pre-update process SSa to the reference list 200 as the dataset 210 corresponding to the p-th pre-update process SS. This updates the reference list 200.

Similarly, when the r-th pre-update process SSb (r≥1) is the p-th pre-update process SS, the controller 2 generates a dataset 210 corresponding to the p-th pre-update process SS based on the r-th pre-update process SSb in step s35b immediately after the r-th pre-update process SSb. More specifically, the controller 2 uses, as the input-state data SDp, input-state data input into the second neural network in step s31b in the r-th pre-update process SSb. The controller 2 also uses, as the action data MVp, action data indicating the action performed on the second operational target component in step s32b in the r-th pre-update process SSb. The controller 2 also uses, as the input-state data SDp+1, input-state data updated in step s33b in the r-th pre-update process SSb. The controller 2 uses, as the reward Rp, the reward determined in step s34b in the r-th pre-update process SSb. The controller 2 then adds the dataset (SDp, MVp, SDp+1, Rp) resulting from the r-th pre-update process SSb to the reference list 200 as the dataset 210 corresponding to the r-th pre-update process SS. This updates the reference list 200.

The controller 2 learns the NN parameters for the first and second neural networks based on the reference list 200 updated as described above. In step s36a, the controller 2 randomly extracts a predetermined number of datasets 210 from the reference list 200 updated in the immediately preceding cycle of step s35a. The controller 2 then generates training data using the extracted predetermined number of datasets 210 and adjusts the NN parameters for the first neural network to reduce the difference between the generated training data and the output data from the first neural network. In this manner, the NN parameters for the first neural network are learned. This learning method may be referred to as mini-batch learning.

In step s36b, the NN parameters for the second neural network are learned in a similar manner. In step s36b, the controller 2 randomly extracts a predetermined number of datasets 210 from the reference list 200 updated in the immediately preceding cycle of step s35b. The controller 2 then generates training data using the extracted predetermined number of datasets 210 and adjusts the NN parameters for the second neural network to reduce the difference between the generated training data and the output data from the second neural network.

When the reference list 200 updated in step s35a does not include at least a predetermined number of datasets 210, step s36a is not performed, and step s37a is performed. Similarly, when the reference list 200 updated in step s35b does not include at least a predetermined number of datasets 210, step s36b is not performed, and step s37b is performed.

Examples of Learning Process

Figure 20:
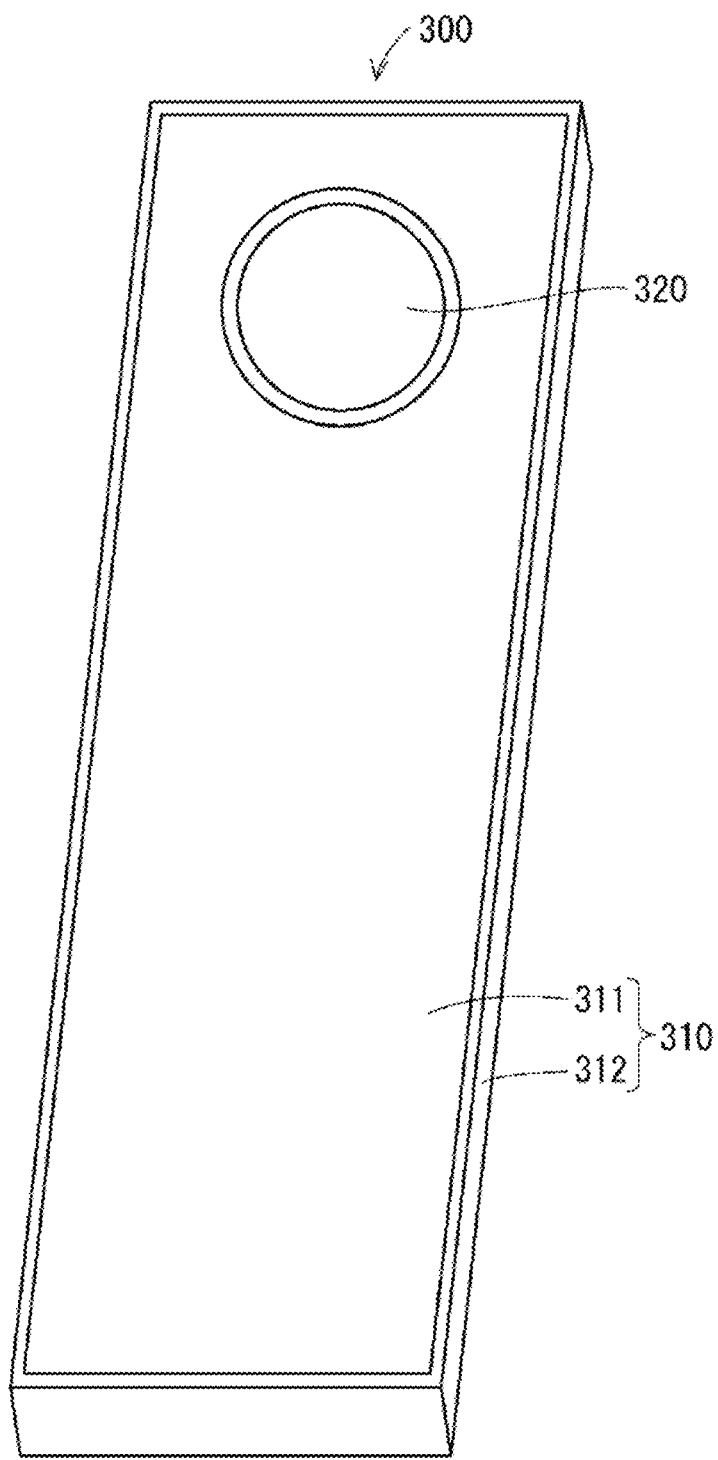
FIG. 20 illustrates a diagram of an electronic device in an embodiment.
Figure 21:
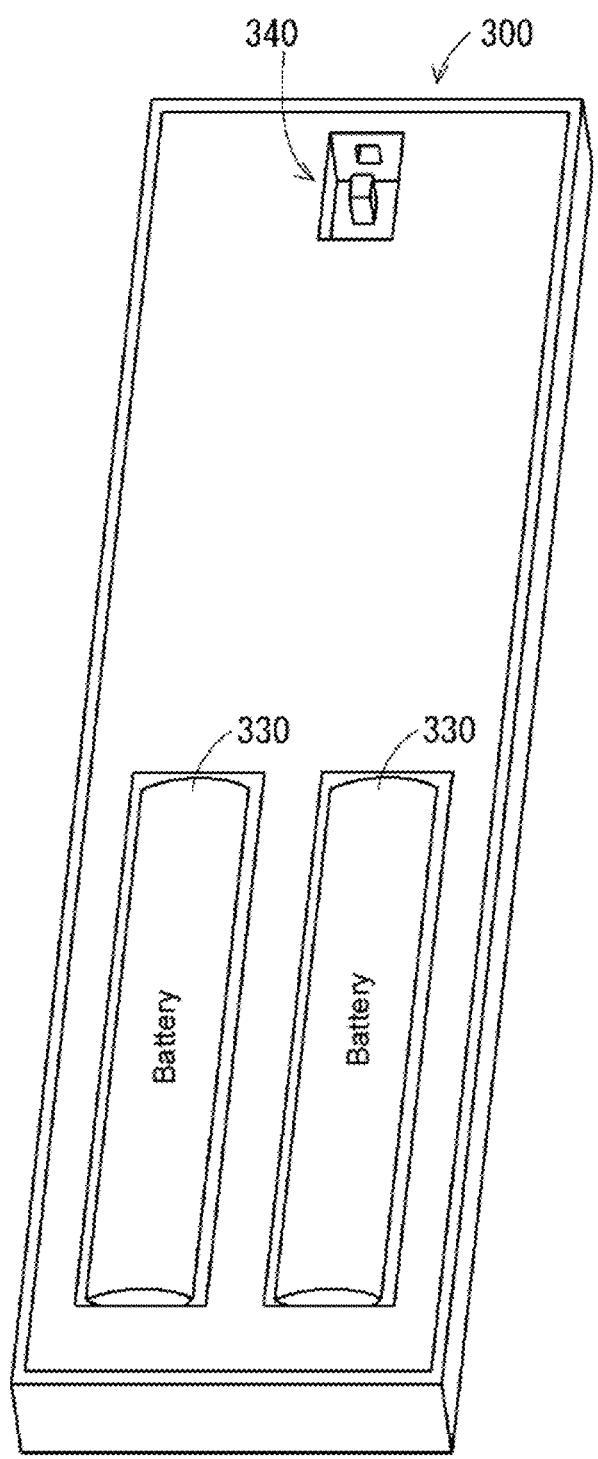
FIG. 21 illustrates a diagram of the electronic device in an embodiment.

Examples of the learning process will now be described using components included in an electronic device 300 shown in FIGS. 20 and 21. FIG. 20 shows the electronic device 300 as viewed from the front. FIG. 21 shows the electronic device 300 as viewed from the rear.

The electronic device 300 includes a case 310, a button 320, multiple batteries 330, and a strap holder 340. The electronic device 300 also includes a board 350 and a screw boss 360, which will be described later. The button 320, the batteries 330, and the board 350 are housed in the case 310. The strap holder 340 is a molded portion that is integrally molded with the case 310. The screw boss 360 has a holder that is integrally molded with the case 310. The electronic device 300 can transmit signals to an external unit in response to an operation on the button 320.

Figure 22:
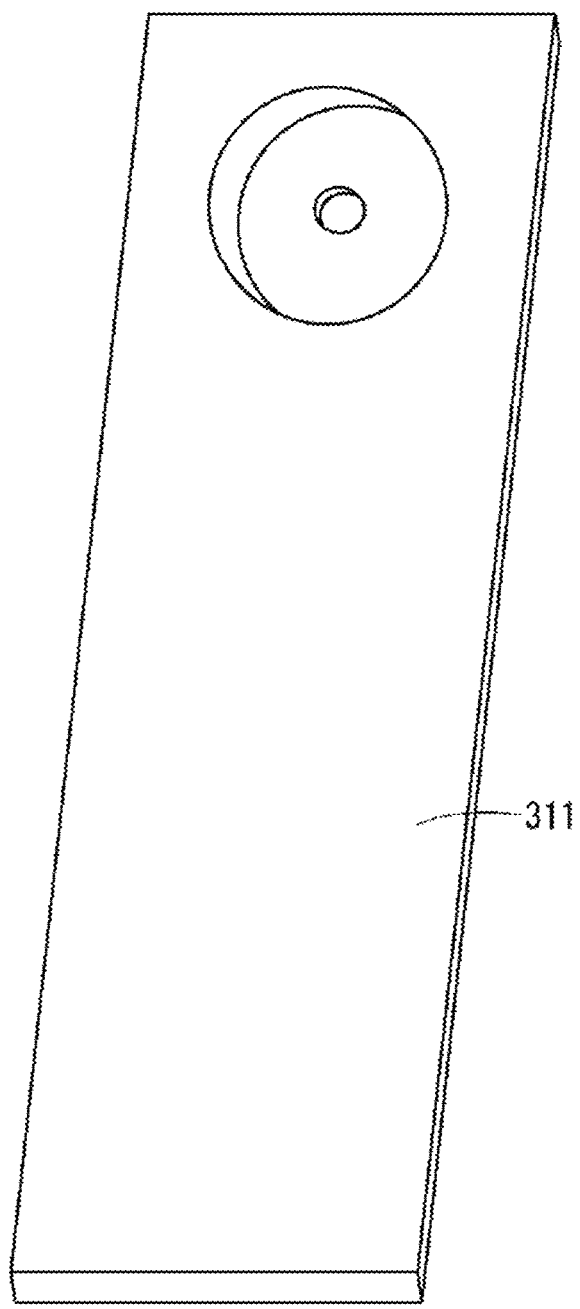
FIG. 22 illustrates a diagram of a front case in an embodiment.
Figure 23:
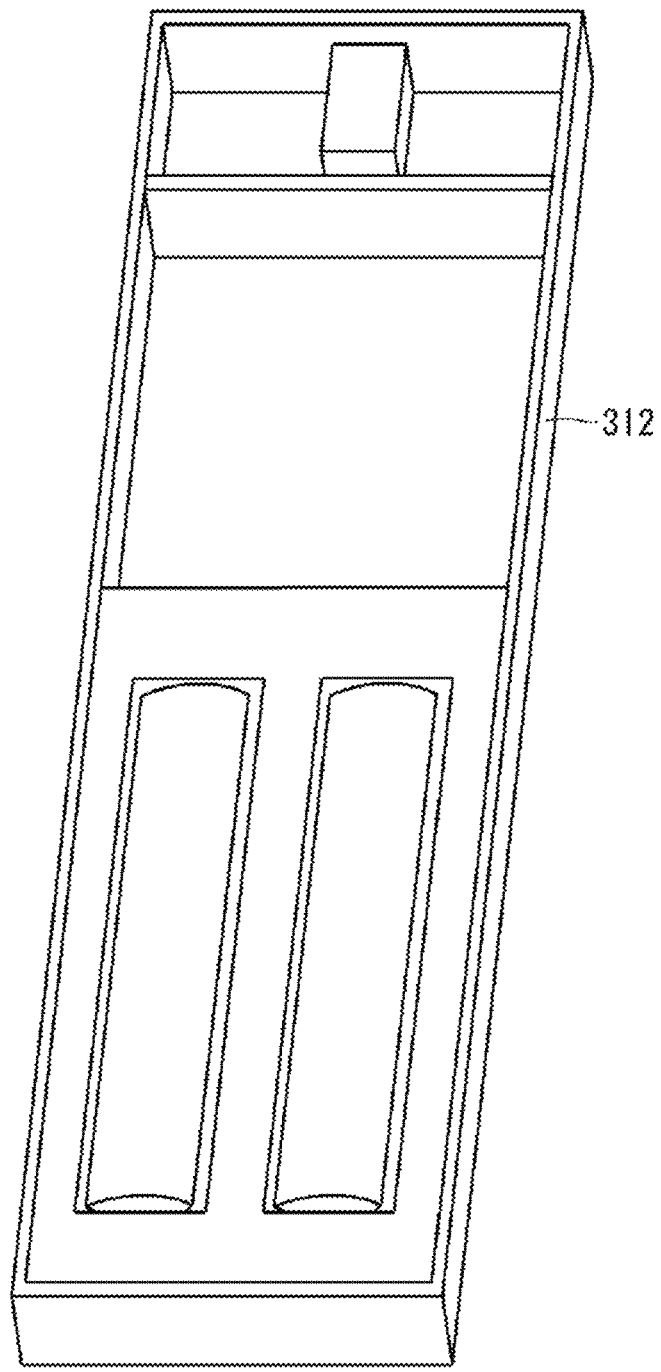
FIG. 23 illustrates a diagram of a back case in an embodiment.

The case 310 includes a front case 311 and a back case 312. FIG. 22 is a perspective view of the front case 311 alone. FIG. 23 is a perspective view of the back case 312 alone.

In the automatic design process, the controller 2 processes the electronic device 300 as several separate parts, or specifically, the case 310 having no molded portion, a button unit 322 including the button 320, a battery unit 332 including the batteries 330, the strap holder 340, the board 350, and the screw boss 360. In the automatic design process, the controller 2 determines a layout space defined by the case 310 having no molded portion. In the automatic design process, the controller 2 also uses the button unit 322, the battery unit 332, the strap holder 340, the board 350, and the screw boss 360 as layout components to be placed in the layout space. The controller 2 then moves the button unit 322, the battery unit 332, the strap holder 340, the board 350, and the screw boss 360 in the layout space while learning the NN parameters.

Figure 24:
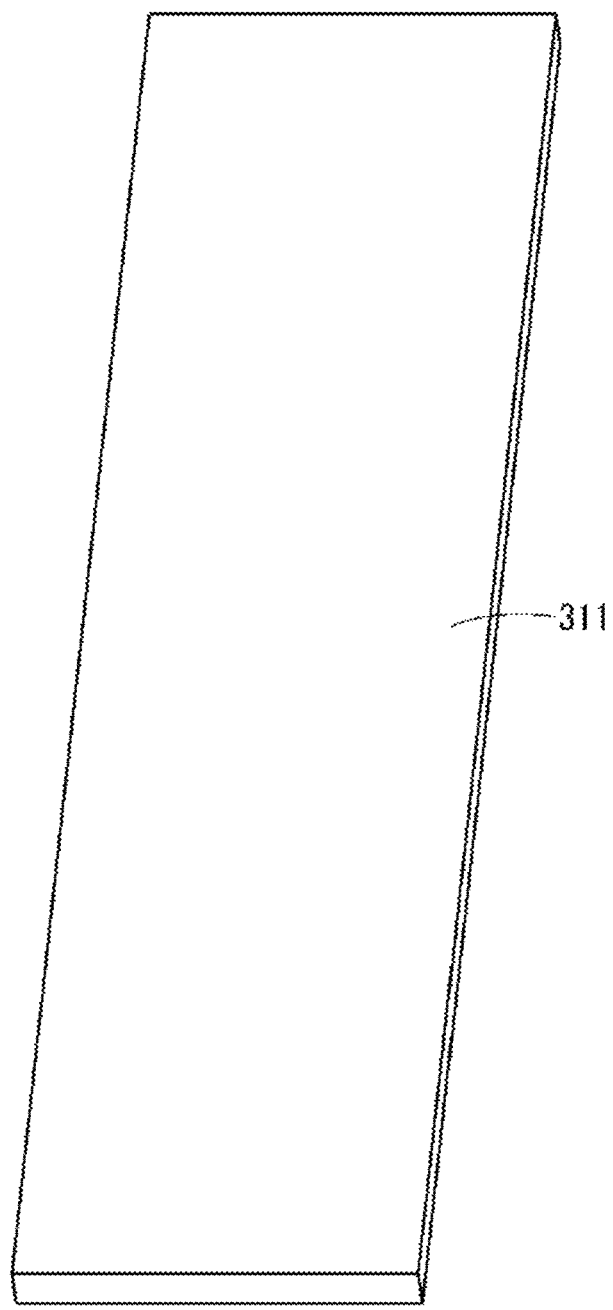
FIG. 24 illustrates a diagram of a front case in an embodiment.
Figure 25:
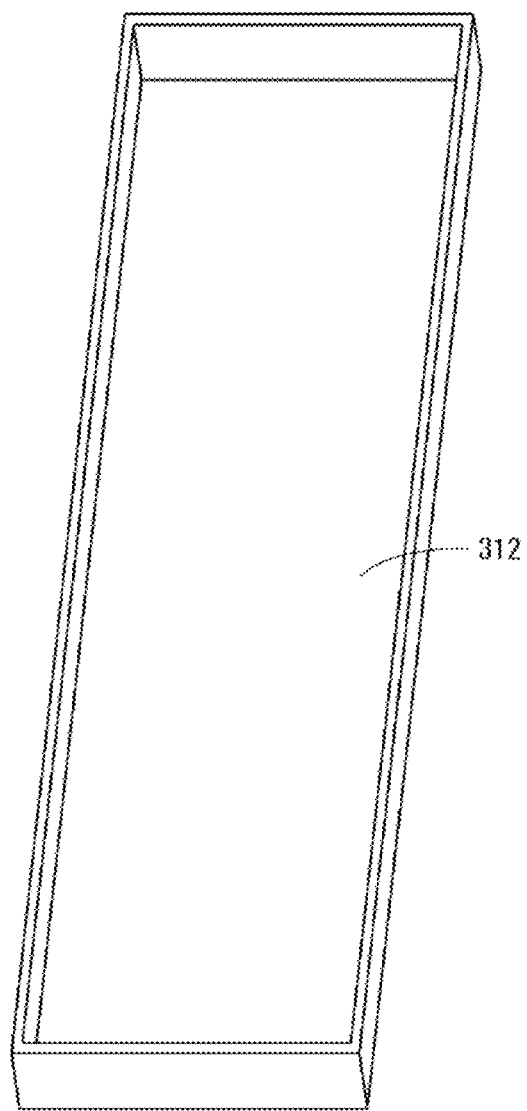
FIG. 25 illustrates a diagram of a back case in an embodiment.

FIG. 24 is a perspective view of the front case 311 in the case 310 having no molded portion. FIG. 25 is a perspective view of the back case 312 in the case 310 having no molded portion. The case 310 having no molded portion will hereafter be simply referred to as the case 310. To generate target-space data, the controller 2 assigns first data indicating 1 to each split element of the case 310.

Figure 26:
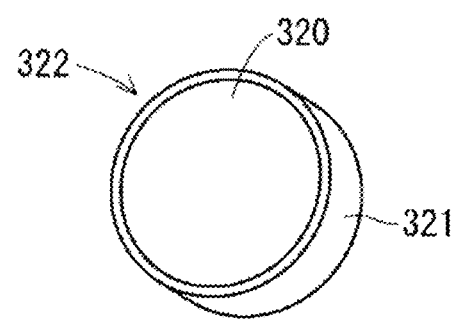
FIG. 26 illustrates a diagram of a button unit in an embodiment.

FIG. 26 is a perspective view of the button unit 322. As shown in FIG. 26, the button unit 322 includes the button 320 as a nonoverlapping component and a holder 321 holding the button 320. The holder 321 is a molded portion that is integrally molded with the case 310. To generate component data representing the button unit 322, the controller 2 assigns second data indicating 2 to each split element of the button 320. The controller 2 also assigns second data indicating 1 to each split element of the holder 321.

Figure 27:
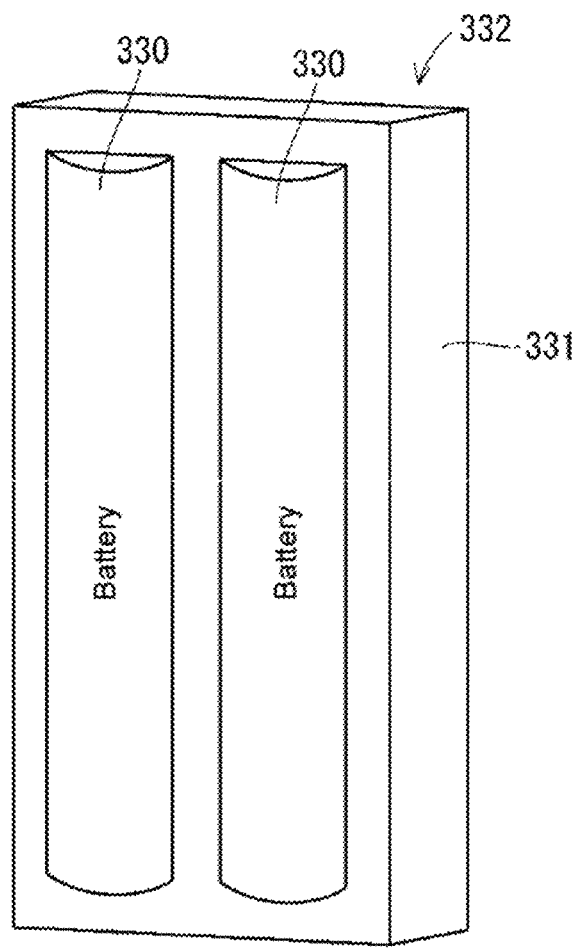
FIG. 27 illustrates a diagram of a battery unit in an embodiment.

FIG. 27 is a perspective view of the battery unit 332. As shown in FIG. 27, the battery unit 332 includes the batteries 330 as nonoverlapping components and a holder 331 holding the batteries 330. The holder 331 may serve as a battery case accommodating the batteries 330. The holder 331 is a molded portion that is integrally molded with the case 310. To generate component data representing the battery unit 332, the controller 2 assigns second data indicating 2 to each split element of the batteries 330. The controller 2 also assigns second data indicating 1 to each split element of the holder 331.

Figure 28:
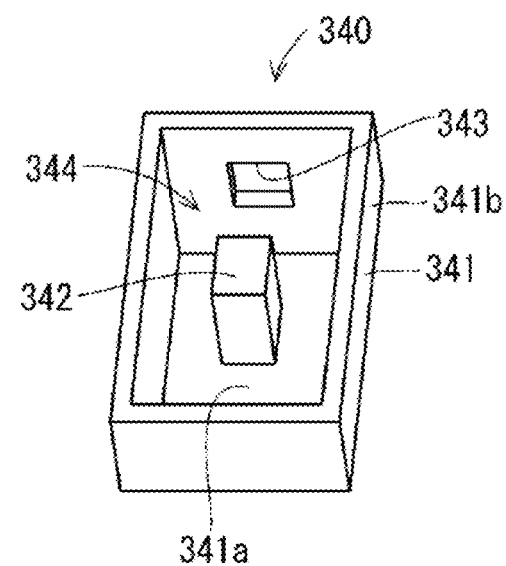
FIG. 28 illustrates a diagram of a strap holder in an embodiment.

FIG. 28 is a perspective view of the strap holder 340. As shown in FIG. 28, the strap holder 340 includes a box-shaped body 341 having a top opening, and a protrusion 342 protruding from a bottom 341a of the body 341. The body 341 has a side 341b having a through-hole 343 for a strap to pass through. The strap through the through-hole 343 is hooked on the protrusion 342. With the strap hooked on the protrusion 342, the body 341 has its internal space 344 excluding the protrusion 342 (in other words, the space 344 defined inside the body 341 excluding the protrusion 342) housing the strap. The space 344 may hereafter be referred to as a strap housing space 344.

To generate component data representing the strap holder 340, the controller 2 assigns data to the through-hole 343 and the strap housing space 344, in addition to assigning data to the body 341 and the protrusion 342. More specifically, the controller 2 assigns second data to each split element of the through-hole 343 and the strap housing space 344, in addition to assigning second data to each split element of the body 341 and the protrusion 342. The controller 2 then generates component data representing the strap holder 340 using array data including the second data assigned to each split element of the body 341, the protrusion 342, the through-hole 343, and the strap housing space 344.

In the automatic design process, the body 341 as a molded portion may be placed to overlap another molded portion or may be placed to overlap the case. Thus, the controller 2 assigns second data indicating 1 to each split element of the body 341. The protrusion 342, also as a molded portion, is to receive the strap being hooked. The protrusion 342 thus cannot be placed to overlap another object. The controller 2 thus processes the protrusion 342 differently, and assigns second data indicating 2 to each split element of the protrusion 342, in the same manner as assigning data to a nonoverlapping component. The through-hole 343, through which the strap passes, cannot overlap any layout component. The controller 2 thus assigns second data indicating 2 to each split element of the through-hole 343, in the same manner as assigning data to a nonoverlapping component. This reduces the likelihood that a layout component is automatically placed in the through-hole 343 in the layout design process. Similarly, the controller 2 assigns second data indicating 2 to each split element of the strap housing space 344. This reduces the likelihood that a layout component is automatically placed in the strap housing space 344 in the layout design process.

Figure 29:
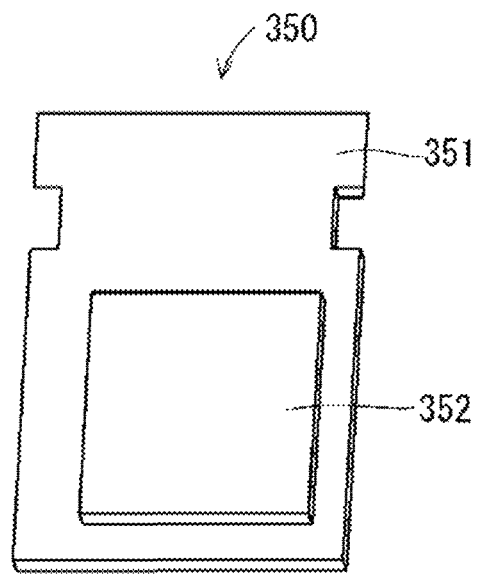
FIG. 29 illustrates a diagram of a board in an embodiment.

FIG. 29 is a perspective view of the board 350. As shown in FIG. 29, the board 350 includes a plate body 351, and an electronic component 352 mounted on the plate body 351. To generate component data representing the board 350 as a nonoverlapping component, the controller 2 assigns second data indicating 2 to each split element of the plate body 351 and each split element of the electronic component 352.

Figure 30:
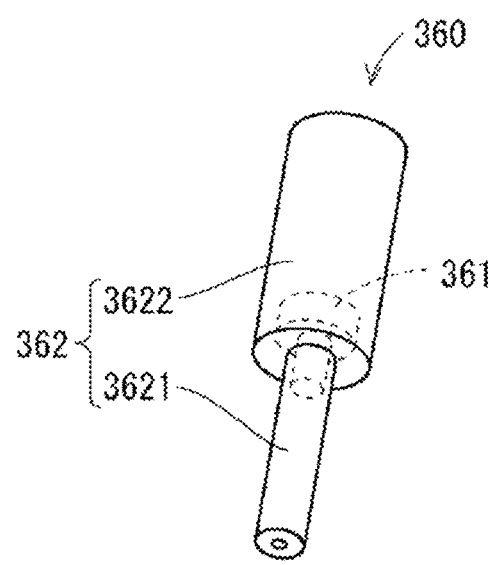
FIG. 30 illustrates a diagram of a screw boss in an embodiment

FIG. 30 is a perspective view of the screw boss 360. As shown in FIG. 30, the screw boss 360 includes a screw 361 as a nonoverlapping component and a holder 362 holding the screw 361. The holder 362 is a molded portion that is integrally molded with the case 310. The holder 362 includes a first section 3621 that houses a stem of the screw 361 and a second section 3622 that houses a head of the screw 361. One of the first section 3621 and the second section 3622 is integrally molded with the front case 311, and the other one of the first section 3621 and the second section 3622 is integrally molded with the back case 312. To generate component data representing the screw boss 360, the controller 2 assigns second data indicating 2 to each split element of the screw 361. The controller 2 also assigns second data indicating 1 to each split element of the holder 362.

In the first step of the unit-learning cycle using the button unit 322, the battery unit 332, the strap holder 340, the board 350, and the screw boss 360, or in step s21, the controller 2 selects the battery unit 332 with the largest volume as a first operational target component and the board 350 with the second largest volume as a second operational target component. The controller 2 then performs the processing in steps s22 to s24.

In step s24, the controller 2 determines an action for the battery unit 332 and an action for the board 350 alternately. For every action determined for the battery unit 332 (step s32a), the controller 2 updates the input-state data (step s33a), determines a reward (step s34a), updates the reference list (step s35a), learns the NN parameters (step s36a), and performs an interference determination (step s37a). For every action determined for the board 350 (step s32b), the controller 2 updates the input-state data (step s33b), determines a reward (step s34b), updates the reference list (step s35b), learns the NN parameters (step s36b), and performs an interference determination (step s37b). When detecting no interference in the interference determination, the controller 2 ends the processing in step s24.

Following step s24, the controller 2 performs the processing in step s25. The determination result in step s25 is negative, and the processing in step s26 is performed. In step s26, the battery unit 332 set as the first operational target component is fixed in the target space.

Following step s26, the processing in step s21 is performed again. In step s21, the board 350 is set as a first operational target component. Also, the button unit 322 with the third largest volume is set as a second operational target component. The processing in steps s22 to s24 is then performed. In step s24, the board 350 and the button unit 322 are moved in the target space in which the battery unit 332 has been fixed.

Following step s24, the processing in step s25 is performed. The determination result in step s25 is negative, and the processing in step s26 is performed. In step s26, the board 350 set as the first operational target component is fixed in the target space.

Following step s26, the processing in step s21 is performed again. In step s21, the button unit 322 is set as a first operational target component. Also, the strap holder 340 with the fourth largest volume is set as a second operational target component. The processing in steps s22 to s24 is then performed. In step s24, the button unit 322 and the strap holder 340 are moved in the target space in which the battery unit 332 and the board 350 have been fixed.

Following step s24, the processing in step s25 is performed. The determination result in step s25 is negative, and the processing in step s26 is performed. In step s26, the button unit 322 set as a first operational target component is fixed in the target space.

Following step s26, the processing in step s21 is performed again. In step s21, the strap holder 340 is set as a first operational target component. Also, the screw boss 360 with the smallest volume is set as a second operational target component. The processing in steps s22 to s24 is then performed. In step s24, the strap holder 340 and the screw boss 360 are moved in the target space in which the battery unit 332, the board 350, and the button unit 322 have been fixed.

Following step s24, the processing in step s25 is performed. The determination result is affirmative in step s25. This ends the unit-learning cycles.

A predetermined number of unit-learning cycles described above are performed using the button unit 322, the battery unit 332, the strap holder 340, the board 350, and the screw boss 360 (Yes in step s12). This ends the learning process. After the learning process ends, the controller 2 stores, as the learned NN parameters, the NN parameters for the first and second neural networks resulting from the end of the learning process into the storage 3. The learned NN parameters for the first neural network may be hereafter referred to as first learned NN parameters. The learned NN parameters for the second neural network may be hereafter referred to as second learned NN parameters.

In each unit-learning cycle described above, the NN parameters are learned after every action determined for a learning target component selected as an operational target. In some embodiments, the processing in either step s36a or step s36b may not be performed.

In each unit-learning cycle, the processing in step s36a may be performed every time after the processing in step s35a is performed multiple times. In each unit-learning cycle, the processing in step s36b may be performed every time after the processing in step s35b is performed multiple times.

In some embodiments, the controller 2 may learn the NN parameters for one of the first and second neural networks in step s36a, and may learn the NN parameters for the other one of the first and second neural networks in step s36b.

The controller 2 may store, as the learned NN parameters, the NN parameters for the first and second neural networks resulting from the learning process performed multiple times into the storage 3. The controller 2 may use the same electronic device throughout the learning process performed multiple times, or may use a different electronic device in the learning process performed each time.

Although data indicating 1 is assigned to each split element of the wall part of the case in the above embodiment, data indicating 2 may be assigned to selected split elements of the wall part of the case. In the learning process, a part of the case with assigned data indicating 2 overlapping another object is determined as interfering.

In some embodiments, the layout space may be the hollow part inward from the interior surface of the case alone. In this case, data indicating 2 is assigned to each split element of the wall part of the case.

In an embodiment described above, the controller 2 learns the relationship between the states of multiple layout objects in the layout space and the movements of the layout objects to be performed by learning the NN parameters based on the input-state data. The controller 2 thus learns the relationship through machine learning, while virtually moving the multiple layout components in the layout space. This structure enables appropriate learning of the relationship, thus shortening the time taken by the controller 2 for the layout design process and reducing the design cost.

Layout Design Process

Figure 31:
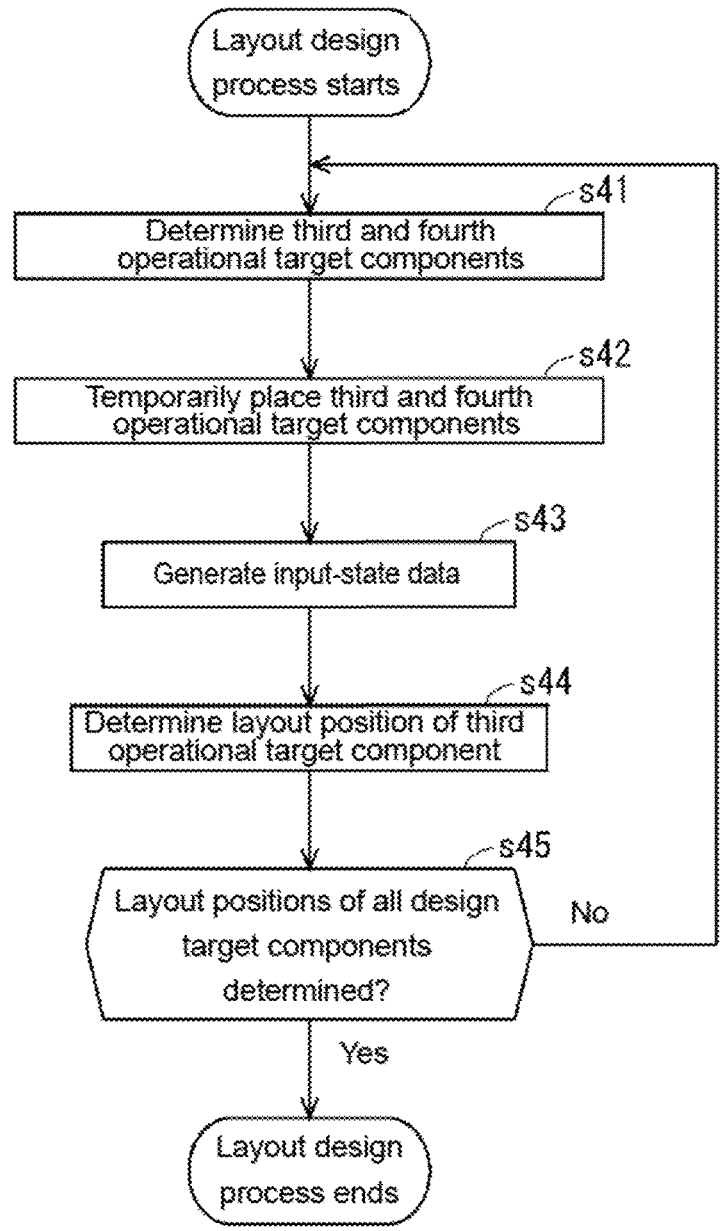
FIG. 31 illustrates a flowchart showing an operation of a computer apparatus in an embodiment.

FIG. 31 is a flowchart showing the layout design process in an embodiment. The layout design process shown in FIG. 31 is implemented by the controller 2 executing the layout design program 3a stored in the storage 3. FIG. 31 shows an operation of the controller 2 automatically determining the layout positions of multiple layout components of an electronic device in the layout space in an embodiment. In the layout design process, the multiple layout components are moved in the target space until no interference occurs between them for determining the layout positions of the multiple layout components in the layout space. A layout component for which the layout position is to be determined in the layout design process may be hereafter referred to as a design target component.

For example, the controller 2 performs the layout design process using two neural networks 10. The two neural networks 10 used in the layout design process may be hereafter referred to as a third neural network and a fourth neural network.

The first learned NN parameters may be used as NN parameters for the third neural network. The second learned NN parameters may be used as NN parameters for the fourth neural network. The third neural network outputs Q values for determining an action to be performed on each design target component. The controller 2 uses seven Q values output from the third neural network to determine actions to be performed on the respective design target components. Similarly, the fourth neural network outputs Q values for determining an action to be performed on each design target component. The controller 2 uses seven Q values output from the fourth neural network to determine actions to be performed on the respective design target components.

As shown in FIG. 31, the layout design process starts from step s41. In step s41, the controller 2 selects, as operational targets, two design target components from the multiple design target components for which the layout positions in the layout space are to be determined. In the same manner as in step s21 described above, the controller 2 selects, for example, a design target component with the largest volume as a third operational target component and a design target component with the second largest volume as a fourth operational target component. The controller 2 uses the third operational target component as a design target component for the third neural network, and the fourth operational target component as a design target component for the fourth neural network.

In step s42, the controller 2 then temporarily places the third and fourth operational target components in the target space. In step s42, the controller 2 places the third and fourth operational target components in the layout space to cause the third and fourth operational target components to interfere with each other, as in step s22 described above.

In step s43, the controller 2 generates input-state data representing the states of the third and fourth operational target components in the layout space (in other words, input merged data) through the process shown in FIG. 9 described above.

In step s44, the controller 2 then determines the layout position of the third operational target component in the layout space using the input merged data generated in step s42 as well as using the third and fourth neural networks. The processing in step s43 will be described in detail later.

In step s45, the controller 2 determines whether the layout positions of all the design target components have been determined. When the determination result is affirmative in step s45, the layout design process ends. When the determination result is negative in step s45, the processing in step s41 is performed again. In the second or subsequent cycles of step s41, the controller 2 determines the design target component set as the fourth operational target component used in the previous cycle of step s41 as a new third operational target component. The controller 2 then selects, as a new fourth operational target component, a design target component with the largest volume from design target components that have yet to be set as operational targets.

The controller 2 then performs the processing in step s42, and temporarily places the third and fourth operational target components in the layout space to cause the new third and fourth operational target components to interfere with each other. This causes the target space to include the design target component that has been placed at the determined layout position as well as the newly placed third and fourth operational target components.

The controller 2 then performs the processing in step s43 to generate, for multiple learning target components including the third and fourth operational target components currently in the target space, input merged data representing the states of the multiple learning target components in the layout space through the process shown in FIG. 9. The controller 2 then performs the processing in step s44, and thereafter operates in the same manner as described above. At the time when the determination result in step s45 is affirmative, each design target component of the electronic device for which the layout position is to be determined is placed in the layout space without interfering with another object. The layout positions of all the design target components are determined. This ends the layout design process.

Figure 32:
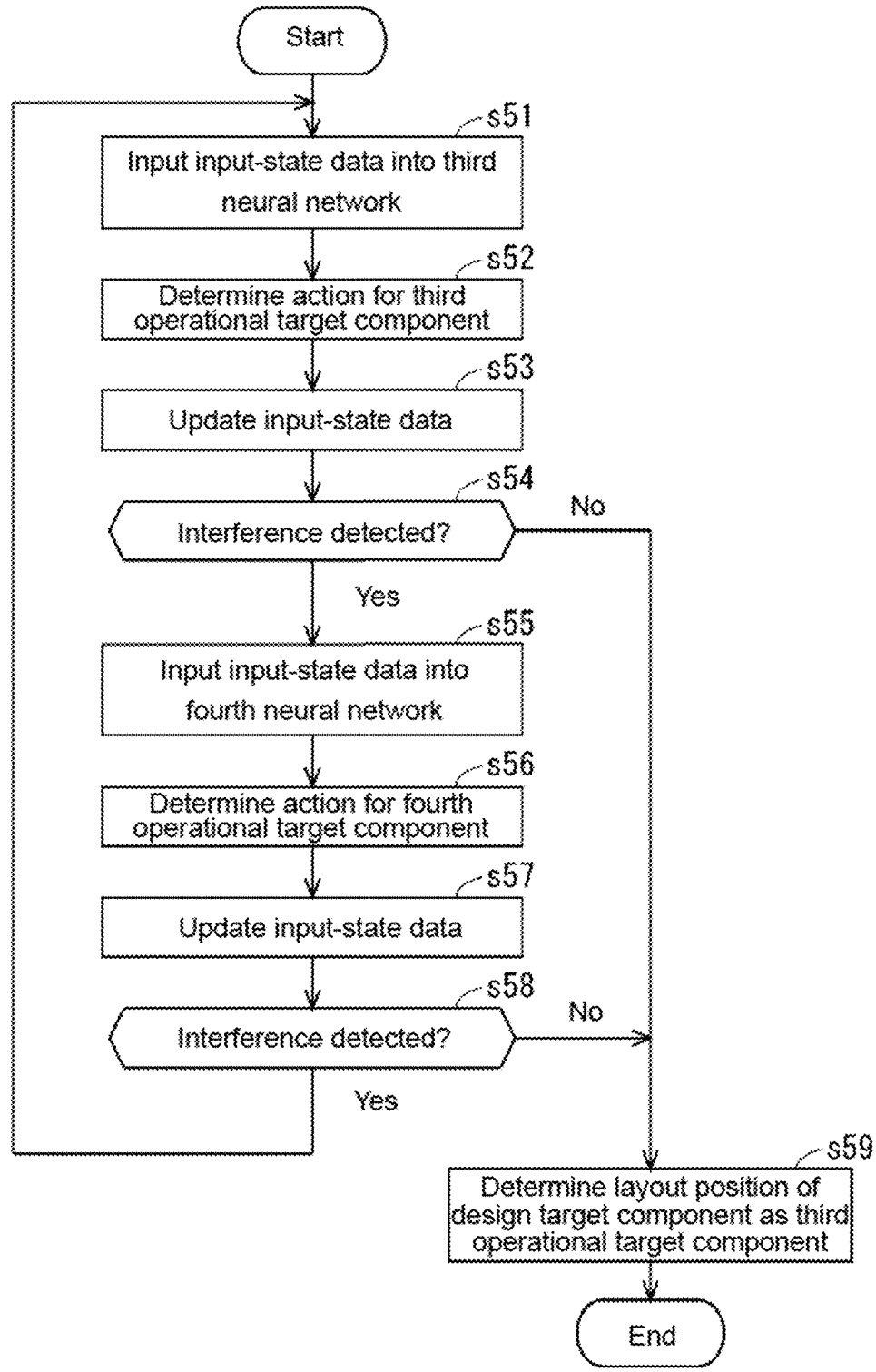
FIG. 32 illustrates a flowchart showing an operation of a computer apparatus in an embodiment.

FIG. 32 is a flowchart showing the processing in step s44 in an embodiment in detail. In step s44, as shown in FIG. 32, the processing in step s51 is performed first. In step s51, the controller 2 inputs the input-state data generated in step s43 (specifically, input merged data) into the third neural network.

In step s52, the controller 2 then determines an action for the third operational target component for the third neural network, and performs the determined action on the third operational target component. The controller 2 then determines an action to be performed on the third operational target component based on an output from the third neural network that has received the input-state data in step s51. More specifically, the controller 2 performs an action corresponding to the largest one of the seven Q values output from the third neural network on the third operational target component. As in the learning process, for example, the controller 2 may move the third operational target component by a distance corresponding to one split element. For example, the controller 2 may move the third operational target component in +Z direction by a distance corresponding to one split element.

Following step s52, the processing in step s53 is performed. In step s53, the controller 2 updates the input-state data (specifically, the input merged data) in accordance with the action for the third operational target component in step s52, similarly to the processing in steps s33a and s33b. The controller 2 that has moved the third operational target component in step s52 then generates input-state data representing the states of the moved multiple design target components in the layout space to update the input-state data.

In step s54, the controller 2 then performs an interference determination based on the updated input-state data, similarly to the processing in steps s37a and s37b described above. When the determination result is affirmative in step s54, or specifically when interference is detected in the target space, the processing in step s55 is performed. When the determination result is negative in step s54, or specifically when no interference is detected in the target space, the processing in step s59 is performed.

In step s59, the controller 2 then determines the layout position of the design target component set as the third operational target component. More specifically, the controller 2 uses, as the final layout position of the design target component, the current position of the design target component in the layout space set as the third operational target component. The layout position of the design target component set as the third operational target component is determined. This ends the processing in step s44.

In step s55, the controller 2 inputs the current input-state data (specifically, the current input merged data) into the fourth neural network. In other words, the controller 2 inputs the input merged data updated in step s53 into the fourth neural network.

In step s56, the controller 2 then determines an action for the fourth operational target component for the fourth neural network, and performs the determined action on the fourth operational target component. Similarly to determining an action for the third operational target component, the controller 2 then determines the action for the fourth operational target component based on an output from the fourth neural network that has received the latest input-state data. In step s56, for example, the controller 2 may move the fourth operational target component by a distance corresponding to one split element.

Following step s56, the processing in step s57 is performed. In step s57, the controller 2 updates the input-state data (specifically, the input merged data) in accordance with the action for the fourth operational target component in step s56, similarly to the processing in step s53.

In step s58, the controller 2 performs an interference determination. When the determination result is negative in step s58, the processing in step s59 is performed. When the determination result is affirmative in step s58, the processing in step s51 is performed again. The controller 2 thereafter operates in the same manner as described above. In the second or subsequent cycles of step s51, the input-state data updated in the immediately preceding cycle of step s57 is input into the third neural network. In the second or subsequent cycles of step s55, the input-state data updated in the immediately preceding cycle of step s53 is input into the fourth neural network In the processing in step s44 described above, an action for the third operational target component and an action for the fourth operational target component are determined alternately. For every action determined for a design target component as an operational target, an interference determination is performed. When no interference is detected in the interference determination, the layout position of the design target component as the third operational target component is determined. When the layout position of the design target component as the third operational target component is determined, the third and fourth operational target components are newly selected to undergo the same processing. The processing is performed until the layout positions of all the design target components are determined. This automatically determines the layout positions of the multiple target components in the layout space.

When the layout design process ends, the controller 2 may control the display 5 to display the layout positions determined for the multiple design target components, or may provide information about the determined layout positions to another device through the communicator 4.

When the layout design process is not complete in a predetermined period after the start of the process, the controller 2 may fail to automatically determine the layout positions of the multiple design target components in the layout space and stop the process.

Figure 33:
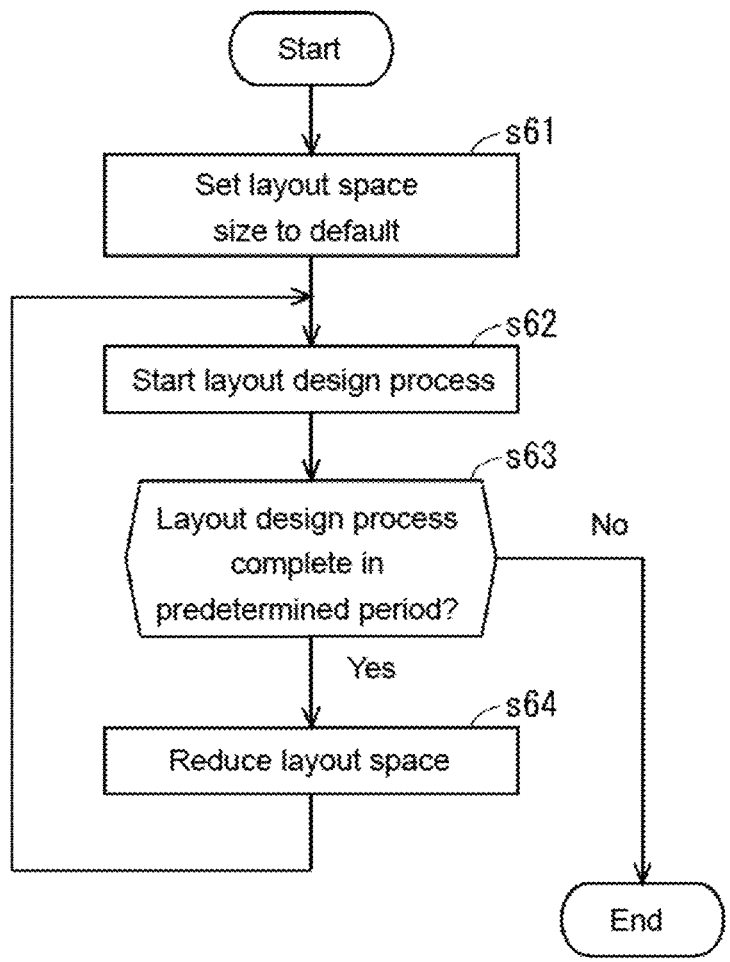
FIG. 33 illustrates a flowchart showing an operation of a computer apparatus in an embodiment.

In some embodiments, the controller 2 may perform the layout design process for determining the layout positions of multiple design target components using layout spaces with different sizes. FIG. 33 is a flowchart showing an operation of the controller 2 in an embodiment.

As shown in FIG. 33, the controller 2 sets the size of the layout space to its default in step s61. To set the size of the layout space to the default, the controller 2 sets the size of the case to its default.

In step s62, the controller 2 then starts a layout design process for determining the layout positions of multiple design target components in the layout space (in other words, the case) with the size set in step s61. In step s63, the controller 2 then determines whether the layout design process is complete in a predetermined period. When the layout design process is not complete in the predetermined period from its start, the controller 2 stops the process and ends the layout design process. When the layout design process is complete in the predetermined period from its start, the processing in step s64 is performed. In step s64, the controller 2 reduces the size of the layout space. The controller 2 reduces the size of the case to reduce the size of the layout space. Following step s64, the controller 2 performs the processing in step s62 again. In step s62, the controller 2 then starts a layout design process for determining the layout positions of multiple design target components in the layout space (in other words, the case) with the size reduced in step s63. The controller 2 then performs the processing in step s63 again. When the determination result is affirmative in step s63, the processing in step s64 is performed again to further reduce the size of the layout space. The controller 2 thereafter operates in the same manner as described above.

Through the layout design process performed repeatedly using the layout space set smaller each time, the controller 2 can determine the layout space with the smallest size that can accommodate the multiple design target components. In other words, the controller 2 can determine the case with the smallest size that can accommodate the multiple design target components. The layout space has the smallest size when the determination result is negative in step s63.

When the determination result is negative in step s63, the processing in step s64 may be performed. In this case, the process may end after the layout design process using the layout space set with the smallest size is performed. In some embodiments, layout design processes using layout spaces with different sizes may be performed in parallel to one another.

Figure 34:
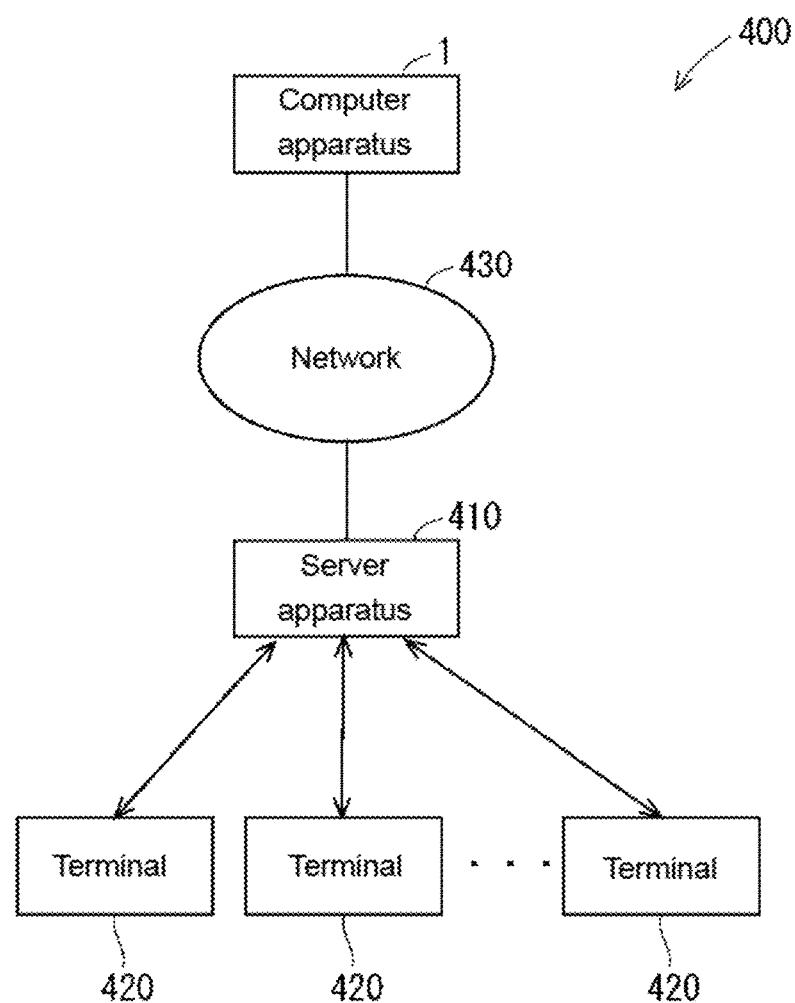
FIG. 34 illustrates a schematic diagram of a design system in an embodiment.

The controller 2 may perform a layout design process for a design target component specified by the user. In some embodiments, the controller 2 may perform a layout design process using a case specified by the user. The user may specify, for example, either a design target component or a case for the controller 2 by operating the input unit 6 included in the computer apparatus 1. The computer apparatus 1 may receive information about the design target component or the case specified by the user through the communicator 4. FIG. 34 is a schematic diagram of a design system 400 including the computer apparatus 1 in an embodiment.

As shown in FIG. 34, the design system 400 includes the computer apparatus 1, a server apparatus 410, and multiple terminals 420. The server apparatus 410 can communicate with each terminal 420. The server apparatus 410 can control each terminal 420. The server apparatus 410 can also communicate with the computer apparatus 1 with a network 430, such as the Internet. The communicator 4 in the computer apparatus 1 is connected to the network 430. The server apparatus 410 and the terminals 420 are both computer apparatuses, and may each have the same structure as the computer apparatus 1.

A general user can use a terminal 420 to use the layout design capability of the computer apparatus 1. A general user can use a terminal 420 to specify a design target component and a case for the computer apparatus 1.

Figure 35:
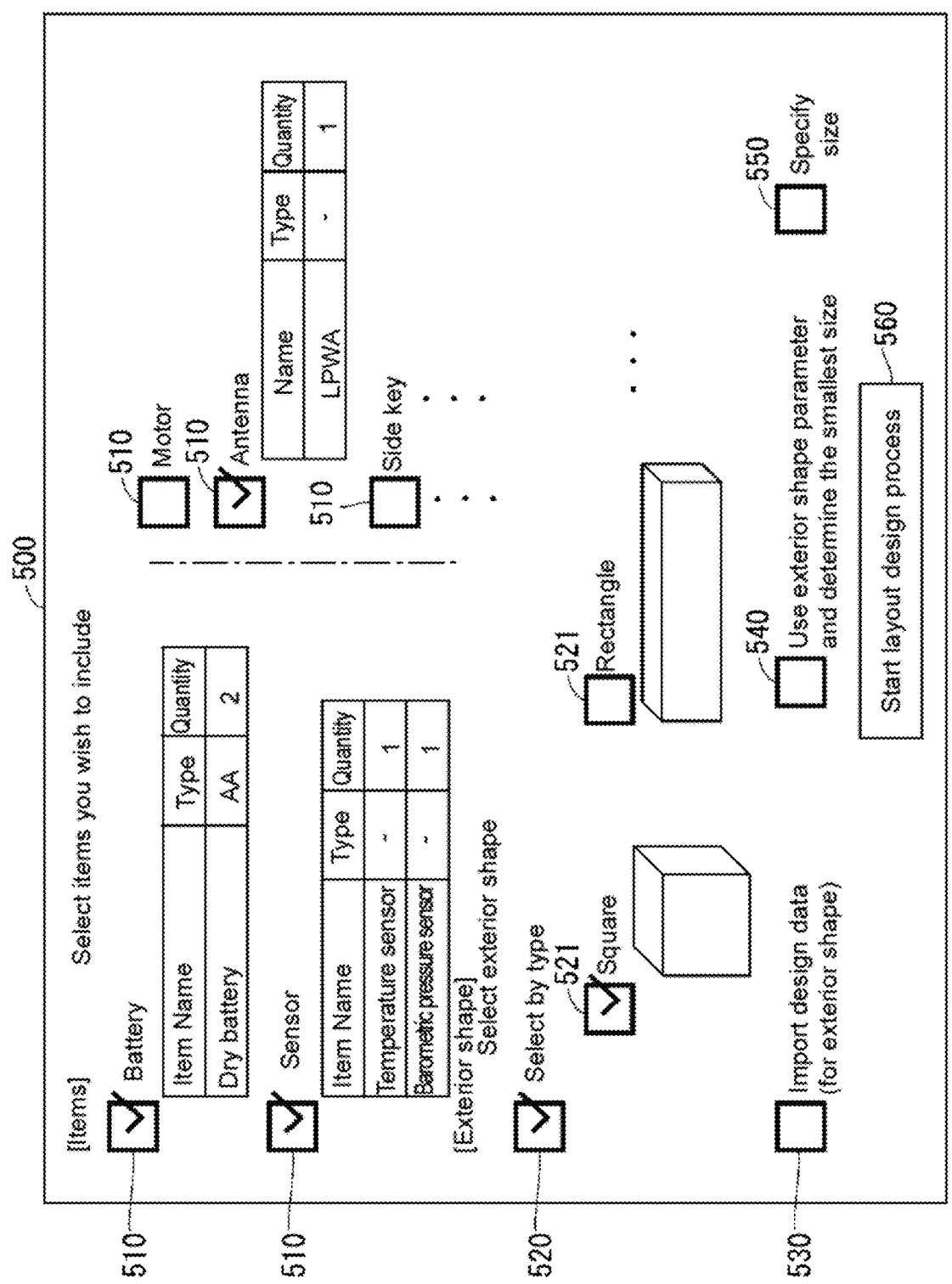
FIG. 35 illustrates a diagram of a display screen in an embodiment.

FIG. 35 is a diagram of a screen 500 usable by a general user in an embodiment. The screen 500 appears on a display in a terminal 420. A general user can use the screen 500 shown in FIG. 35 to specify a design target component and a case for the computer apparatus 1. The server apparatus 410 controls the terminal 420 to display the screen 500.

As shown in FIG. 35, the screen 500 includes a start button 560 that is operable to instruct the computer apparatus 1 to perform a layout design process. The user can operate the start button 560 by operating the input unit included in the terminal 420. In response to the start button 560 being operated, the terminal 420 outputs an instruction for starting a layout design process. The start instruction is provided to the controller 2 through the server apparatus 410, the network 430, and the communicator 4 included in the computer apparatus 1. Upon receiving the start instruction, the controller 2 performs the layout design process. When the layout design process ends, the computer apparatus 1 may provide, through the server apparatus 410, information about the determined layout positions of multiple design target components to the terminal 420 on which the start button 560 has been operated. In this case, the terminal 420 may display the layout positions provided from the computer apparatus 1. The user can visually check the layout positions determined by the computer apparatus 1. The user may directly use the layout positions determined by the computer apparatus 1 in manufacturing an electronic device or may modify the layout positions determined by the computer apparatus 1 as appropriate and use the modified positions in manufacturing an electronic device.

The screen 500 includes multiple checkboxes, in addition to the start button 560. The user can mark any checkbox by operating the input unit included in the terminal 420.

The screen 500 includes multiple checkboxes 510 for the user to specify design target components. In response to any checkbox 510 being marked, the component corresponding to the marked checkbox 510 is selected. When the start button 560 is operated with the component being selected, information about the selected component is provided from the terminal 420 to the controller 2 through the server apparatus 410, the network 430, and the communicator 4. The controller 2 then performs a layout design process using the component selected by the user as a design target component. When the component selected by the user has a holder for holding the component, the controller 2 sets the selected component and its holder together as one design target component. In this manner, a design target component can be specified by the user.

In the example shown in FIG. 35, two AA batteries, a temperature sensor, a barometric pressure sensor, and an antenna are selected by the user. The controller 2 sets a battery unit including the selected two AA batteries and a holder holding the batteries as a design target component. The controller 2 also sets a temperature sensor unit including the selected temperature sensor and a holder for holding the temperature sensor as a design target component. The controller 2 also sets a barometric pressure sensor unit including the selected barometric pressure sensor and a holder for holding the barometric pressure sensor as a design target component. The controller 2 also sets an antenna unit including the selected antenna and a holder for holding the antenna as a design target component. In the layout design process, the controller 2 determines the layout positions of the battery unit, the temperature sensor unit, the barometric pressure sensor unit, and the antenna unit in the layout space.

The screen 500 further includes a checkbox 520 to be marked when the exterior shape (or the profile) of a case is to be specified, and multiple checkboxes 521 to be used to specify the exterior shape of the case in detail. When the checkbox 520 is marked, the checkboxes 521 become selectable. The exterior shape corresponding to a marked checkbox 521 is selected as the exterior shape of the case. In the example shown in FIG. 35, the square is selected as the exterior shape of the case. When the start button 560 is operated with the checkboxes 520 and 521 being marked, information about the exterior shape of the case selected by the user is provided from the terminal 420 to the controller 2 through the server apparatus 410 and other units. In this manner, the exterior shape of the case is specified by the user. When the exterior shape of the case alone is specified by the user, the size of the case prestored in the computer apparatus 1 is used as the size of the case in the layout design process.

The screen 500 further includes a checkbox 530 to transmit case structure data representing the structure of the case to the computer apparatus 1. The case structure data is, for example, CAD data. When the start button 560 is operated with the checkbox 530 being marked, the terminal 420 transmits the case structure data. The case structure data is input into the controller 2 through the server apparatus 410 and other units. The controller 2 generates layout-space data based on the received case structure data. The controller 2 performs the layout design process using the layout-space data generated based on the case structure data.

The screen 500 also includes a checkbox 540 to allow the computer apparatus 1 to determine the smallest size of the case that can accommodate multiple design target components. When the start button 560 is operated with the checkbox 540 being marked, the controller 2 performs the process shown in FIG. 33 described above to determine the smallest size that can accommodate the multiple design target components specified by the user. When the process in FIG. 33 ends, the computer apparatus 1 may provide, through the server apparatus 410, information about the determined smallest size of the case to the terminal 420 on which the start button 560 has been operated. In this case, the terminal 420 may display the received smallest size.

The screen 500 includes a checkbox 550 for the user to specify the size of the case. When the checkbox 550 is marked, the terminal 420 displays a size specifying screen for specifying the size of the case. When the checkbox 550 is marked, the exterior shape of the case is, for example, rectangular. The user may use the size specifying screen to specify the size of the case, including the length, width, and height. When the user specifies the size of the case using the size specifying screen, the terminal 420 switches its display from the size specifying screen to the screen 500. When the start button 560 on the screen 500 is operated, information about the size of the case specified by the user is provided to the controller 2 through the server apparatus 410 and other units. The controller 2 sets the layout space based on the size of the case specified by the user, and performs a layout design process using the set layout space.

Figure 36:
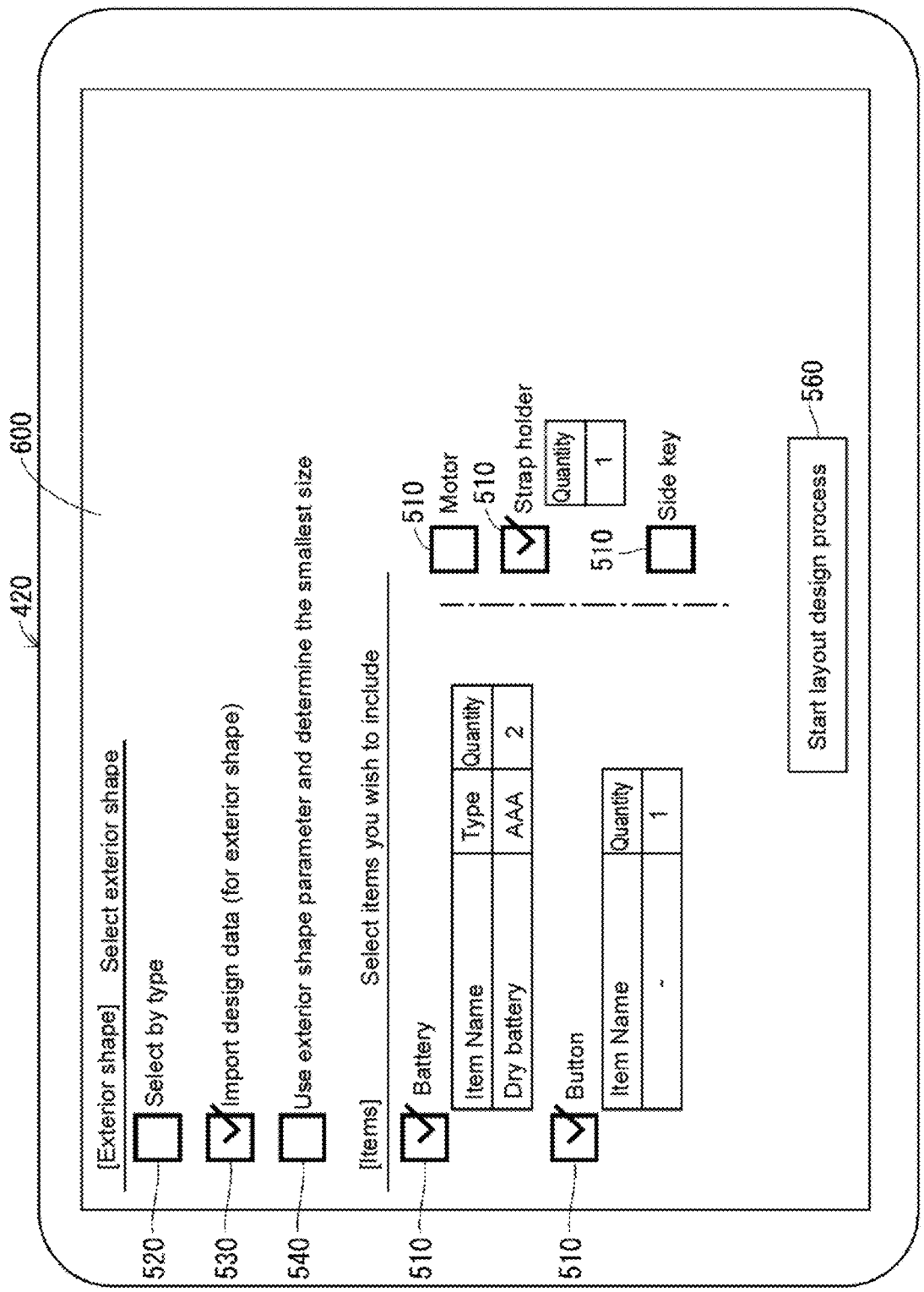
FIG. 36 illustrates a diagram of a display screen in an embodiment.

FIG. 36 is a diagram of a display screen used by a general user appearing on the terminal 420 in another embodiment. In the example shown in FIG. 36, the terminal 420 is a tablet terminal. A screen 600 shown in FIG. 36 includes the start button 560 and the checkboxes 510, 520, 530, and 540 described above. In the example shown in FIG. 36, two AAA batteries, a button, and a strap holder are selected. The controller 2 sets a battery unit including the selected two AAA batteries and a holder holding the batteries as a design target component. The controller 2 sets a button unit including the selected button and a holder holding the button as a design target component. The controller 2 then selects the selected strap holder as a design target component. In the layout design process, the controller 2 determines the layout positions of the battery unit, the button unit, and the strap holder in the layout space.

The screen 500 may appear on the display 5 in the computer apparatus 1. The screen 600 may appear on the display 5 in the computer apparatus 1.

The design system 400 may not include the server apparatus 410. In this case, the network 430 is connected to each terminal 420. Each terminal 420 communicates with the computer apparatus 1 through the network 430.

In an embodiment described above, the controller 2 splits each of the target space and the layout object used in the automatic design process into multiple split elements. The controller 2 then generates input-state data based on data assigned to each split element of the target space and data assigned to each split element of the layout object. This reduces the amount of data used in the automatic design process and shortens the time taken for the automatic design process.

In an embodiment, the input-state data is based on CAD data and thus can be generated easily.

In an embodiment, the learning process and the layout design process are performed based on whether a layout object interferes with another object in the layout space. This allows multiple layout objects to be placed automatically in the layout space to avoid interference between these layout objects.

In an embodiment, holders for multiple layout components overlapping one another are not determined as interfering. This allows holders for multiple layout components to overlap one another in the layout design process, thus reducing the layout area occupied by the layout components.

In an embodiment, the case includes portions that can overlap holders without being determined as interfering. This allows holders to be placed to overlap the case, thus reducing the layout area occupied by layout components.

In an embodiment, a layout component at least partially being outside the layout space is determined as interfering. The layout component at least partially being outside the layout space can be determined in the same manner as an object interfering with another object. This simplifies the automatic design process.

When generating component data for a layout component having a holder, the controller 2 in an embodiment assigns different values to the split elements of the holder and to the split elements of the holdable component. This allows easy identification of the holder and the holdable component in the automatic design process and simplifies the automatic design process.

In an embodiment, the same value is assigned to the split elements of the case and to the split elements of the holder. This allows data representing the case and data representing the holder to be processed in the same manner in the automatic design process. This simplifies the automatic design process.

In an embodiment, the same value is assigned to the split elements of the surrounding space surrounding the layout space and to the split elements of any component to be determined as interfering when overlapping another object. This allows a layout component at least partially being outside the layout space to be determined as interfering with another object easily in the automatic design process. This simplifies the automatic design process.

Automatic Design Process in Other Embodiments

An automatic design process according to other embodiments will now be described.

First Other Embodiment

In an embodiment, multiple sizes are available for split elements. The controller 2 performs, for each different size of split elements, the learning process and the layout design process using input-state data for the set size of the split elements.

The learning process uses multiple first neural network pairs, each including a first neural network and a second neural network, in one-to-one correspondence with different sizes of split elements. The first neural network pairs correspond to the respective sizes of the split elements. Similarly, the layout design process uses multiple second neural network pairs, each including a third neural network and a fourth neural network, in one-to-one correspondence with different sizes of split elements. The second neural network pairs correspond to the respective sizes of the split elements.

The controller 2 performs the learning process using each of the first neural network pairs. To perform the learning process using one first neural network pair, the controller 2 inputs input-state data generated using split elements having the size corresponding to the first neural network pair into the first and second neural networks included in the first neural network pair.

The multiple sizes of the split elements include a first size and a second size. The second size is larger than the first size. For cubic split elements, for example, a cube of each split element having the second size is larger than a cube of each split element having the first size.

In the learning process using a first neural network pair corresponding to the first size, the controller 2 inputs input-state data generated using split elements having the first size into the first neural network in the first neural network pair in step s31a described above. The controller 2 inputs input-state data generated using split elements having the first size into the second neural network in the first neural network pair in step s31b described above.

Similarly, in the learning process using a first neural network pair corresponding to the second size, the controller 2 inputs input-state data generated using split elements having the second size into the first and second neural networks in the first neural network pair.

For split elements having the first size, the layout space and any layout object are each to be split in smaller elements than for split elements having the second size. The resultant input-state data can have a larger data volume. The input elements for each of the first and second neural networks in the first neural network pair corresponding to the first size thus outnumber the input elements for each of the first and second neural networks in the first neural network pair corresponding to the second size. The learning process using the first neural network pair corresponding to the first size causes less movements of a layout object at a time (specifically, movements in step s32a and movements in step s32b) than the learning process using the first neural network pair corresponding to the second size. More specifically, the learning process using the first neural network pair corresponding to the first size allows finer movements of the layout object. The data volumes of layout-space data, component data, and input-state data can change depending on the size of the split elements. The size of the split elements thus indicates the amount of information, or the resolution, of the layout-space data, the component data, and the input-state data.

The controller 2 performs the layout design process using each of the second neural network pairs. In the learning process using one second neural network pair, the controller 2 inputs input-state data generated using split elements having the size corresponding to the second neural network pair into the third and fourth neural networks in the second neural network pair. In the layout design process using a second neural network pair corresponding to one size for split elements, the controller 2 uses, as NN parameters for the third and fourth neural networks in the second neural network pair, learned NN parameters for the first and second neural networks corresponding to the size.

The multiple sizes of the split elements include the first size and the second size. In the layout design process using a second neural network pair corresponding to the first size, the controller 2 inputs input-state data generated using split elements having the first size into the third neural network in the second neural network pair in step s51 described above. The controller 2 then uses, as NN parameters for the third neural network, learned NN parameters for the first neural network in the first neural network pair corresponding to the first size. The controller 2 inputs input-state data generated using split elements having the first size into the fourth neural network in the second neural network pair in step s55 described above. The controller 2 then uses, as NN parameters for the fourth neural network, learned NN parameters for the second neural network in the first neural network pair corresponding to the first size.

Similarly, in the layout design process using a second neural network pair corresponding to the second size, the controller 2 inputs input-state data generated using split elements having the second size into the third and fourth neural networks in the second neural network pair. The controller 2 then uses, as NN parameters for the third and fourth neural networks, learned NN parameters for the first and second neural networks in the first neural network pair corresponding to the second size.

As described above, the split elements with a larger size can have input-state data with a smaller data volume. Setting split elements with a larger size can thus shorten the time taken for the learning process and the layout design process. Setting split elements with a larger size can increase the likelihood that the layout design process can be complete within a predetermined period.

However, split elements with a larger size can cause a layout component to be moved by larger distances in the learning process and in the layout design process. This may increase the layout area occupied by multiple layout components in the layout design process.

Figure 37:
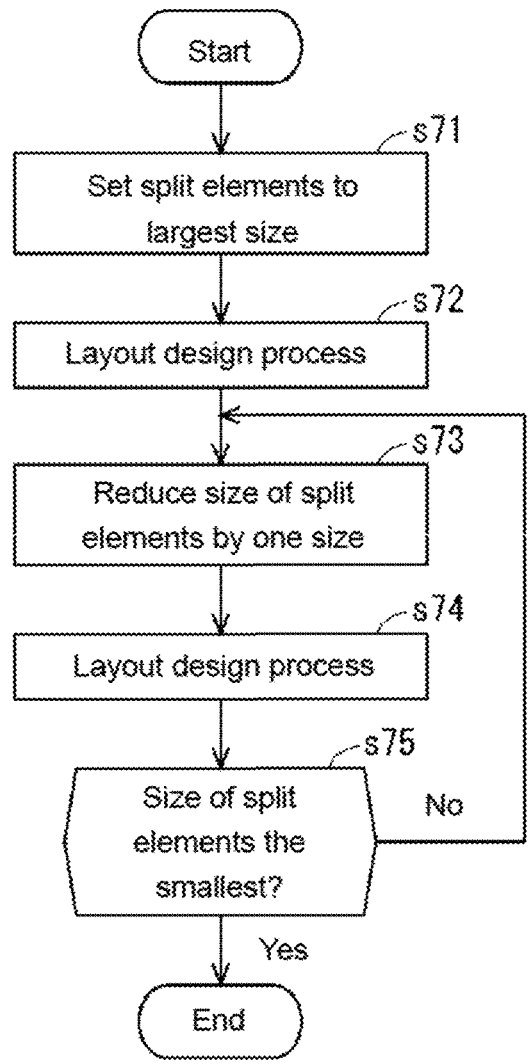
FIG. 37 illustrates a flowchart showing an operation of a computer apparatus in an embodiment.

When multiple sizes are available for split elements, the controller 2 may repeatedly perform the layout design process by setting a smaller size for split elements each time. In other words, the controller 2 may repeatedly perform the layout design process by setting a larger amount of information (in other words, resolution) for input-state data each time. FIG. 37 is a flowchart showing an operation of the controller 2 in an embodiment.

As shown in FIG. 37, the controller 2 sets the size of the split elements to its largest size in step s71. In step s72, the controller 2 performs the layout design process using a second neural network pair corresponding to the largest size. The computer apparatus 1 may provide the result from the layout design process obtained in step s72 to the terminal 420 through the server apparatus 410. In this case, the terminal 420 may display the received result.

In step s73, the controller 2 reduces the size of the split elements by one size. In step s74, the controller 2 performs the layout design process using a second neural network pair corresponding to the set size. The computer apparatus 1 may provide the result from the layout design process obtained in step s74 to the terminal 420 through the server apparatus 410. In this case, the terminal 420 may display the received result.

In step s75, the controller 2 determines whether the size of the split elements is the smallest of the available sizes. When the determination result is affirmative in step s75, the process ends. When the determination result is negative in step s75, the processing in step s73 is performed again to further reduce the size of the split elements by one size. In step s74, the controller 2 then performs the layout design process using a second neural network pair corresponding to the set size. The controller 2 thereafter operates in the same manner as described above.

The controller 2 may perform the process shown in FIG. 37 in accordance with an instruction from the user. The user may instruct, for example, the controller 2 to perform the process shown in FIG. 37 by operating the input unit 6. The above screen 500 or the screen 600 appearing on the terminal 420 may include a checkbox for instructing to start the process shown in FIG. 37. When the start button 560 is operated with the checkbox for instructing to start the process being marked, the instruction to start the process shown in FIG. 37 is provided from the terminal 420 to the controller 2 through the server apparatus 410 and the communicator 4. When receiving the instruction to start the process, the controller 2 performs the process shown in FIG. 37.

Second Other Embodiment

Two components in a particular combination are to be spaced apart by at least a predetermined distance between them. For example, an antenna is to be spaced apart by at least a predetermined distance from a metal object. Also, a component susceptible to noise is to be spaced apart by at least a predetermined distance from a component that is likely to generate noise. A component susceptible to heat is to be spaced apart by at least a predetermined distance from a component that is likely to generate heat. A component that is likely to generate vibrations is to be spaced apart by at least a predetermined distance from a component susceptible to vibrations.

In an embodiment, one of such two design target components that are to be spaced apart from each other is temporarily enlarged from its ordinary value in the layout design process. This increases the likelihood that the two design target components are automatically spaced apart from each other in the layout design process. The layout design process in an embodiment will be described in detail below. Two design target components that are to be spaced apart from each other may be hereafter referred to as spaced-apart components. The two design target components that are to be spaced apart from each other may be referred to as a first spaced-apart component and a second spaced-apart component.

For a first spaced-apart component as an operational target in the layout design process in an embodiment, the controller 2 first determines an action for the first spaced-apart component as the operational target when a second spaced-apart component is at the determined layout position in the layout space. The controller 2 then performs an interference determination using the first spaced-apart component and the second spaced-apart component one of which is enlarged from its ordinary value. The controller 2 enlarges one of the first and second spaced-apart components from its ordinary value by a distance to be maintained between the first spaced-apart component and the second spaced-apart component.

For example, a third operational target component may be a first spaced-apart component as an operational target. In this case, the controller 2 generates input-state data in step s53 after step s52 in FIG. 32 using the first spaced-apart component and the second spaced-apart component one of which is enlarged from its ordinary value. In step s53, array data including data assigned to multiple split elements of the spaced-apart component enlarged from its ordinary value is used as component data representing the spaced-apart component enlarged from its ordinary value, instead of array data including data assigned to multiple split elements of a spaced-apart component having an ordinary size.

In step s54 after step s53, the controller 2 determines whether interference occurs based on the input-state data generated in step s53, that is, input-state data generated using the first spaced-apart component and the second spaced-apart component one of which is enlarged from its ordinary value. When the determination result is negative in step s54, the processing in step s59 is performed to determine the layout position of the first spaced-apart component. When the determination result is affirmative in step s54, the controller 2 resizes the enlarged spaced-apart component back to its ordinary size, and generates input-state data using component data representing the spaced-apart component having the ordinary size. The controller 2 then inputs the input-state data into the fourth neural network in step s55. The controller 2 thereafter operates in the same manner as described above.

Figure 38:
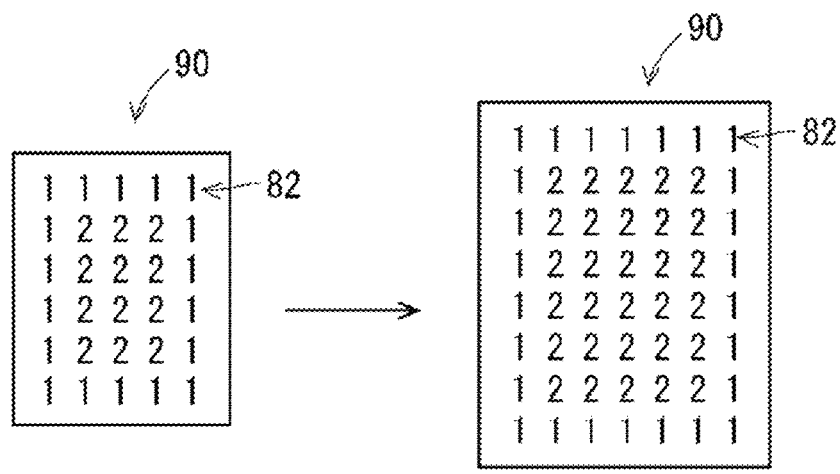
FIG. 38 illustrates a diagram describing component data in an embodiment.

FIG. 38 is a diagram describing component data 90 representing a spaced-apart component in an embodiment. FIG. 38 shows component data 90 representing a spaced-apart component with a holder. FIG. 38 shows, in its left part, component data 90 representing the spaced-apart component with an ordinary size. FIG. 38 shows, in its right part, component data 90 representing the spaced-apart component enlarged from its ordinary value. To enlarge the spaced-apart component with the holder from its ordinary value, the holdable component alone is enlarged. Thus, as shown in FIG. 38, the component data 90 representing the spaced-apart component enlarged from its ordinary value has the size of a data area indicating 1 representing the holder remaining unchanged and the size of a data area indicating 2 representing the holdable component being larger. In step s53, the controller 2 generates input-state data using the component data 90 shown in the right part of FIG. 38. When the determination result is affirmative in step s54, the controller 2 generates input-state data using the component data 90 shown in the left part of FIG. 38.

In step s53, the controller 2 may generate input-state data using the first spaced-apart component and the second spaced-apart component each of which is enlarged from its ordinary value.

When the first spaced-apart component is the fourth operational target component, the controller 2 generates input-state data in step s57 after step s56 using the first spaced-apart component and the second spaced-apart component one of which is enlarged from its ordinary value. In step s58, the controller 2 determines whether interference occurs based on the input-state data generated in step s57. When the determination result is affirmative in step s58, the controller 2 resizes the enlarged spaced-apart component back to its ordinary size, and generates input-state data using component data representing the spaced-apart component having the ordinary size. The controller 2 then inputs the input-state data into the third neural network in step s51. The controller 2 thereafter operates in the same manner as described above. In step s57, the controller 2 may generate input-state data using the first spaced-apart component and the second spaced-apart component each of which is enlarged from its ordinary size.

In an embodiment described above, the controller 2 temporarily enlarges at least one of the first and second spaced-apart components from its ordinary value when determining the layout position of the first spaced-apart component out of the first and second spaced-apart components in the layout space. This increases the likelihood that the first and second spaced-apart components are automatically placed apart from each other. In an embodiment, the simple process of enlarging a spaced-apart component can increase the likelihood that two spaced-apart components are spaced apart from each other, and thus can simplify the layout design process.

When multiple second spaced-apart components with the determined layout positions are in the layout space, the controller 2 performs an interference determination using either a first spaced-apart component as an operational target being enlarged or the multiple second spaced-apart components each being enlarged.

Third Other Embodiment

Some components to be placed in a case may not allow other components to be placed nearby for reasons associated with their manufacture. For example, the case may include a front case and a back case. A molded portion having an insertion hole for receiving a connector, such as a USB, may be integrally molded with the back case. To leave a space for a mold to slide in its molding process, the molded portion cannot have another component that is integrally molded with the same back case, such as a boss, in a specific area nearby.

In the layout design process described below in an embodiment, a design target component that cannot have another design target component in a predetermined space nearby will be less likely to have such a design target component in the predetermined space. An operational target component that cannot have another operational target component in a predetermined space nearby may be hereafter referred to as a first specific component. An operational target component that cannot be placed in a predetermined space surrounding a first specific component may be referred to as an unpermitted component. A predetermined space surrounding a first specific component refers to a predetermined space surrounding a first specific component in which an unpermitted component cannot be placed. A first specific component may be a molded portion having an insertion hole for a USB connector. The molded portion is integrally molded on, for example, the back case. An unpermitted component may be, for example, a boss that is integrally molded with the back case. A boss that is integrally molded with the front case can be placed surrounding a molded portion having an insertion hole for a USB connector that is integrally molded with the back case.

When determining the layout position of a first specific component or an unpermitted component out of the first specific component and the unpermitted component in the layout space, the controller 2 assigns data indicating 2 to each split element of a predetermined space surrounding the first specific component in the layout design process in an embodiment. More specifically, the controller 2 assigns, to each split element of the predetermined space surrounding the first specific component, the same value as the value assigned to each split element of any component to be determined as interfering when overlapping another object.

For example, the layout position of one of the first specific component and the unpermitted component has been determined, and the other one of the first specific component and the unpermitted component is a third operational target component. In this case, the controller 2 causes, in step s53, specific space data representing the predetermined space surrounding the first specific component to be temporarily included in component data representing the first specific component. More specifically, the controller 2 temporarily uses, as component data representing the first specific component, 3D array data including data assigned to each split element of the first specific component and data assigned to each split element of the predetermined space nearby. The controller 2 assigns data indicating 2 to each split element of the predetermined space surrounding the first specific component. Component data representing a first specific component including specific space data representing a predetermined space surrounding the first specific component may be hereafter referred to as first modified component data.

Figure 39:
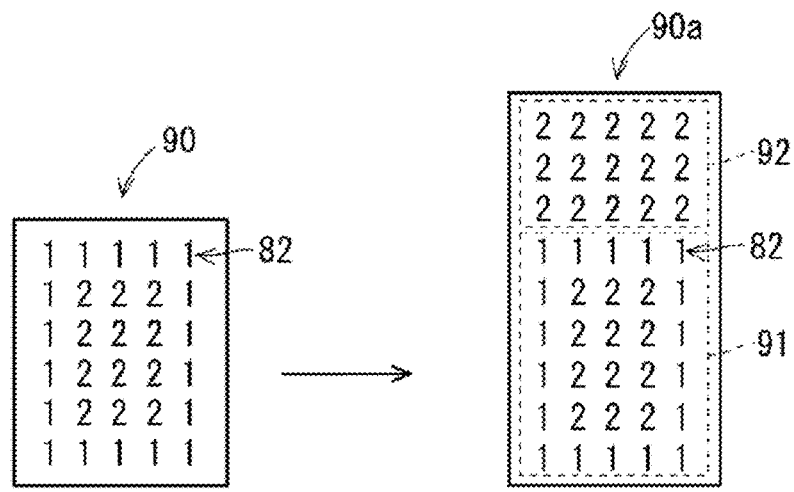
FIG. 39 illustrates a diagram describing component data in an embodiment.

FIG. 39 is a diagram describing first modified component data 90a in an embodiment. FIG. 39 shows, in its left part, ordinary component data 90 without including specific space data representing a predetermined space surrounding a first specific component. FIG. 39 shows, in its right part, first modified component data 90a corresponding to the component data 90 shown in the left part of FIG. 39. The first modified component data 90a includes a data area 91 having the same structure as the ordinary component data 90 and specific space data 92 representing the predetermined space surrounding the first specific component. Each value of the specific space data 92 is set to 2.

In step s53, the controller 2 generates first modified component data for the first specific component, and uses the first modified component data instead of using the ordinary component data representing the first specific component to generate input-state data representing the state of multiple operational target components including the first specific component and an unpermitted component in the current layout space. Ordinary component data is used as the component data representing the unpermitted component. In step s54 after step s53, the controller 2 determines whether interference occurs based on the input-state data generated in step s53. When the determination result is negative in step s54, the processing in step s59 is performed to determine the layout positions of the first specific component and the other component as the unpermitted component. When the determination result is affirmative in step s54, the controller 2 generates input-state data using the ordinary component data representing the first specific component. The controller 2 then inputs the input-state data into the fourth neural network in step s55. The controller 2 thereafter operates in the same manner as described above.

When the other one of the first specific component and the unpermitted component is a fourth operational target component, the controller 2 generates first modified component data for the first specific component in step s57. The controller 2 generates input-state data using the first modified component data instead of the ordinary component data representing the first specific component. In step s58 after step s57, the controller 2 determines whether interference occurs based on the input-state data generated in step s57. When the determination result is affirmative in step s58, the controller 2 generates input-state data using the ordinary component data representing the first specific component. The controller 2 then inputs the input-state data into the third neural network in step s51. The controller 2 thereafter operates in the same manner as described above.

When determining the layout position of a first specific component or an unpermitted component out of the first specific component and the unpermitted component in the layout space in an embodiment described above, the controller 2 assigns, to each split element of a predetermined space surrounding the first specific component, the same value as the value assigned to split elements of any component to be determined as interfering when overlapping another object. This reduces the likelihood that an unpermitted component is automatically placed in a predetermined space surrounding a first specific component. In an embodiment, the simple process of assigning the same value to each split element of a predetermined space surrounding a first specific component as the value assigned to split elements of a holdable component can reduce the likelihood that an unpermitted component is placed in the predetermined space surrounding the first specific component and thus can simplify the layout design process.

Fourth Other Embodiment

The controller 2 may perform a layout design process based on a layout condition for a design target component specified by a general user. A general user may specify, for example, the layout condition for the controller 2 by operating the input unit 6. A general user may use a terminal 420 to specify the layout condition for the computer apparatus 1.

For example, the user may specify the layout condition that one design target component is to be placed at a specific position in the layout space. At the start of the layout design process, the controller 2 fixes the design target component at the position specified by the user in the layout space. The controller 2 then starts the layout design process with the design target component fixed at the specified position.

In another embodiment, the user may specify the layout condition that no design target component is to be placed at a specific position in the layout space. At the start of the layout design process, the controller 2 sets, to 2, each value of a data area of target-space data corresponding to the position specified to include no design target component. The controller then starts the layout design process using the resultant target-space data. This reduces the likelihood that an operational target component is automatically placed at a specified position in the layout design process.

Fifth Other Embodiment

A layout component may at least partially be placed outside the layout space in the layout design process. For example, the holder 362 for the screw boss 360 shown in FIG. 30 described above may have its extra portion placed outside the case to be cut in the design stage. The holder 362 may thus at least partially be placed outside the layout space in the layout design process.

Figure 40:
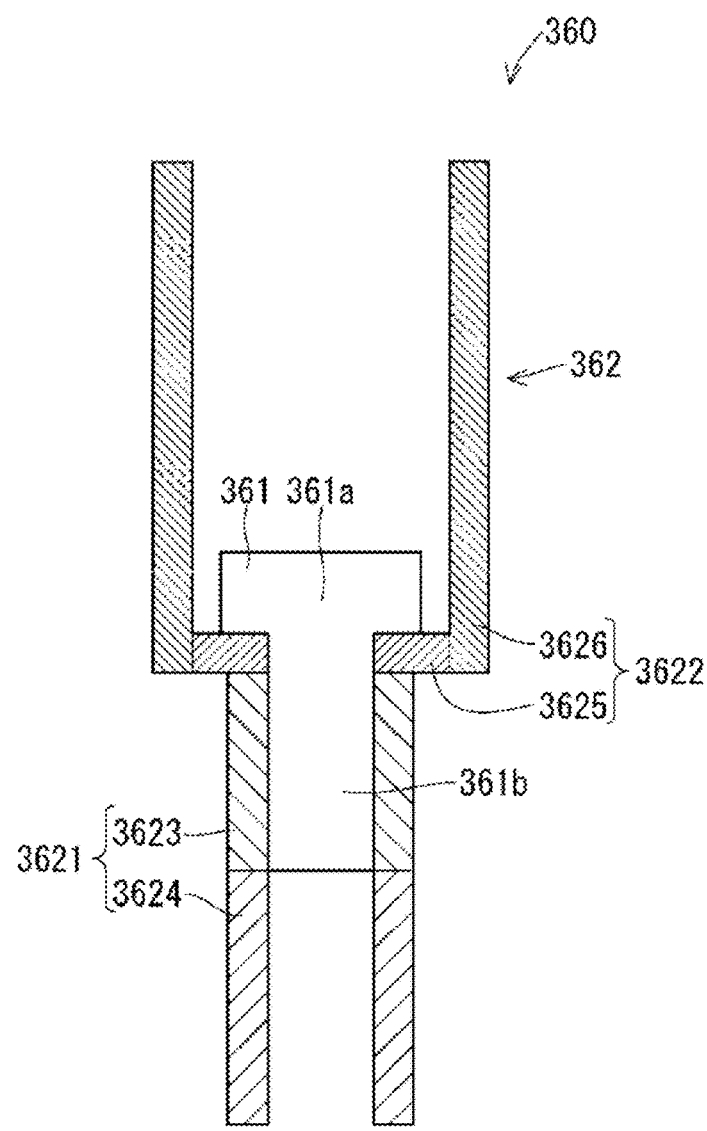
FIG. 40 illustrates a cross-sectional view of the screw boss in an embodiment

FIG. 40 is a cross-sectional view of the screw boss 360 in an embodiment. As shown in FIG. 40, the first section 3621 of the holder 362 for the screw boss 360 includes a third section 3623 to which a stem 361b of the screw 361 is to be screwed and a fourth section 3624 to which the stem 361b is not to be screwed. The second section 3622 of the holder 362 includes a fifth section 3625 that receives a head 361a of the screw 361 and a sixth section 3626 that surrounds the head 361a of the screw 361 along the circumference of the screw 361.

The holder 362 for the screw boss 360 uses at least its third section 3623 and its fifth section 3625 for attaching the screw 361 to the holder 362. Thus, the fourth section 3624 and the sixth section 3626 placed outside the case can be cut in the design stage. Thus, the fourth section 3624 and the sixth section 3626 of the screw boss 360 may be placed outside the layout space in the layout design process. A portion of a layout object that may be placed outside the layout space, like the fourth section 3624 or the sixth section 3626 of the screw boss 360, may be hereafter referred to as an outside-placeable portion.

In the learning process and the layout design process in an embodiment, a layout component including an outside-placeable portion placed outside the layout space is not determined as interfering. The automatic design process can thus achieve the layout condition that a layout component can partially be outside the layout space by commonly using interference as a criterion of determination. This simplifies the automatic design process.

In an embodiment, identification data for identifying an outside-placeable portion of a layout component is added to component data representing the layout component including the outside-placeable portion. When a layout component including an outside-placeable portion is an operational target in the learning process and in the layout design, the controller 2 uses identification data for the layout component for generating input-state data. The learning process and the design process in an embodiment will be described in detail below. A layout component including an outside-placeable portion may be hereafter referred to as a second specific component.

In the learning process and the layout design process in an embodiment, when generating input-state data for a second specific component including an outside-placeable portion placed outside the layout space, the controller 2 merges, on target-space data or on merged target-space data, component data representing the second specific component in which data indicating 0, changed from its ordinary data value of 1, has been assigned to each split element of a part of the outside-placeable portion placed outside the layout space. This causes the outside-placeable portion of the second specific component not to be determined as interfering when being placed outside the layout space. The controller 2 determines whether the outside-placeable portion of the second specific component is outside the layout space based on identification data. The controller 2 then identifies a part of the outside-placeable portion outside the layout space based on the identification data.

For example, a first operational target component may be a second specific component in the learning process. In this case, when the outside-placeable portion of the second specific component is outside the layout space, the controller 2 in step s33a merges, on target-space data or on merged target-space data, component data representing the second specific component in which data indicating 0, changed from its ordinary data value of 1, has been assigned to each split element of a part of the outside-placeable portion placed outside the layout space to generate input-state data. The processing in steps s34a to 37a and s31b is then performed using the input-state data generated in step s33a. The controller 2 thereafter operates in the same manner as described above.

In this learning process, when the second specific component has the layout position determined in the layout space as well, the controller 2 in step s33a merges, on target-space data or on merged target-space data, component data representing the second specific component in which data indicating 0, changed from its ordinary data value of 1, has been assigned to each split element of a part of the outside-placeable portion placed outside the layout space to generate input-state data.

The same applies to the layout design process. For example, a third operational target component may be a second specific component in the layout design process. In this case, when the outside-placeable portion of the second specific component is outside the layout space, the controller 2 in step s53 merges, on target-space data or on merged target-space data, component data representing the second specific component in which data indicating 0, changed from its ordinary data value of 1, has been assigned to each split element of a part of the outside-placeable portion placed outside the layout space to generate input-state data. The processing in steps s54 and s55 is then performed using the input-state data generated in step s53. The controller 2 thereafter operates in the same manner as described above.

The second specific component may be a component other than the screw boss 360 shown in FIG. 40. An administrative user may register a layout component having an outside-placeable portion with the computer apparatus 1. In this case, the administrative user may register a layout component having an outside-placeable portion with the computer apparatus 1 by operating, for example, the input unit 6. The administrative user may also register a layout component having an outside-placeable portion with the computer apparatus 1 by operating, for example, the terminal 420.

Figure 41:
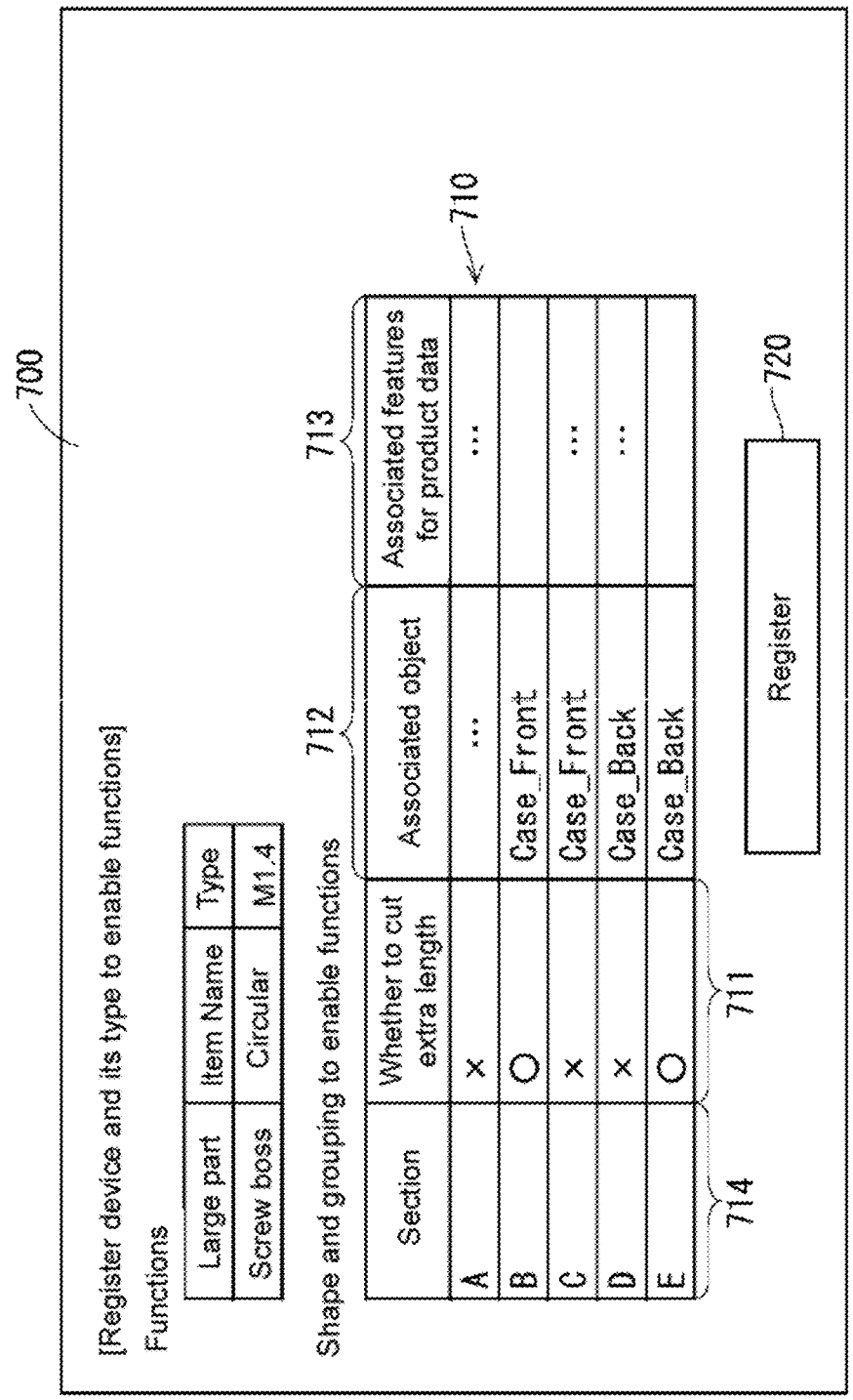
FIG. 41 illustrates a diagram of a display screen in an embodiment.

FIG. 41 is a diagram of a screen 700 appearing on the terminal 420 to be used by an administrative user when registering the screw boss 360 having an outside-placeable portion with the computer apparatus 1 in an embodiment. The administrative user may also register the screw boss 360 having an outside-placeable portion with the computer apparatus 1 by using, for example, the screen 700.

As shown in FIG. 41, the screen 700 includes an entry field 710 and a register button 720. The entry field 710 includes a first entry field 711, a second entry field 712, a third entry field 713, and a display field 714.

The display field 714 shows a symbol assigned to each section of the screw boss 360. In the display field 714, symbols A, B, C, D, and E respectively indicate the screw 361, the fourth section 3624, the third section 3623, the fifth section 3625, and the sixth section 3626 in the screw boss 360.

The first entry field 711 is used by the administrative user to select whether each section of the screw boss 360 is to be an outside-placeable portion. The administrative user operates the first entry field 711 to select whether each section of the screw boss 360 is to be an outside-placeable portion. A circle in the first entry field 711 indicates that a section identified with the symbol in the left field is specified as an outside-placeable portion. In other words, a circle in the first entry field 711 indicates that a section identified with the symbol in the left field can be cut when the portion is outside the case. A cross in the first entry field 711 indicates that a section identified with the symbol in the left field is not specified as an outside-placeable portion.

The second entry field 712 is used by the administrative user to choose whether to associate each section of the screw boss 360 with the front case or the back case. The administrative user operates the second entry field 712 to choose whether to associate each section of the screw boss 360 with the front case or the back case. A section associated with the back case is integrally molded with the back case. A section associated with the front case is integrally molded with the front case. An entry Case_Front in the second entry field 712 indicates that the front case is associated with the section identified with the symbol in the left display field 714. An entry Case_Back in the second entry field 712 indicates that the back case is associated with the section identified with the symbol in the left display field 714.

The third entry field 713 is used by the administrative user to select a position in CAD data at which each outside-placeable portion of the screw boss 360 is to be assigned. The administrative user operates the third entry field 713 to select the position in CAD data at which each outside-placeable portion of the screw boss 360 is to be assigned. Entries D165 and D170 in the third entry field 713 are parameters each indicating a position in the CAD data.

The register button 720 is used to register, with the computer apparatus 1, data input on the terminal 420 by the administrative user using the entry field 710. When the register button 720 is operated, data associated with the screw boss 360 input by the administrative user is input from the terminal 420 into the computer apparatus 1 through the server apparatus 410. In the computer apparatus 1, data from the terminal 420 is input into the controller 2 through the communicator 4. The controller 2 stores the input data about the screw boss 360 into the storage 3. This registers the screw boss 360 having an outside-placeable portion with the computer apparatus 1. The controller 2 can generate such specific data associated with the screw boss 360 based on the data associated with the screw boss 360 received from the terminal 420. After the screw boss 360 having an outside-placeable portion is registered with the computer apparatus 1, a general user can specify the screw boss 360 having an outside-placeable portion as a design target component using, for example, the above screen 600 appearing on the terminal 420. The screen 700 may appear on the display 5 in the computer apparatus 1.

Sixth Other Embodiment

In addition to input merged data, the input-state data may include data other than the input merged data. The input-state data may include, for example, input merged data and object-state data representing the state of a layout object alone in the layout space. The object-state data may include data representing the state of the entire layout object in the layout space or may include data representing the state of a part of the layout object in the layout space. The learning process and the layout design process in an embodiment described below use a second specific component, or specifically, a layout component including an outside-placeable portion. In an embodiment, a second specific component refers to, like the above screw boss 360, a layout component having a holder including an outside-placeable portion. In an embodiment, an outside-placeable portion of a holder may be referred to as an outside-placeable holder portion. Another part of the holder other than the outside-placeable portion in an embodiment may be referred to as an outside-unplaceable holder portion.

For example, an operational target may be a second specific component in the learning process. In this case, the controller 2 generates, in step s23 in FIG. 16, input-state data including input merged data and object-state data representing the state of a second specific component alone in the layout space.

The object-state data includes, for example, first object-state data representing the state of an outside-unplaceable holder portion of a holder for the second specific component in the layout space. The object-state data includes, for example, second object-state data representing the state of an outside-placeable holder portion of the holder for the second specific component in the layout space.

The controller 2 merges first shape data representing the outside-unplaceable holder portion on target-space data in accordance with the position of the outside-unplaceable holder portion in the layout space, and uses the resultant 3D array data as first object-state data. The controller 2 sets each value of the target-space data to 0, differently from an ordinary setting, and merges the first shape data on the target-space data with each value set to 0. The controller 2 uses, as first shape data, array data obtained by assigning data indicating 1 to each split element of the outside-unplaceable holder portion. The first shape data is the same as a data area representing the outside-unplaceable holder portion in component data representing the second specific component.

The controller 2 also merges second shape data representing an outside-placeable holder portion on target-space data in accordance with the position of the outside-placeable holder portion in the layout space, and uses the resultant 3D array data as second object-state data. The controller 2 sets each value of the target-space data to 0, differently from an ordinary setting, and merges the second object-shape data on the target-space data with each value set to 0. The controller 2 uses, as second shape data, array data obtained by assigning data indicating 1 to each split element of the outside-placeable holder portion. The second object-shape data is the same as a data area representing the outside-placeable holder portion in component data representing the second specific component.

Figure 42:
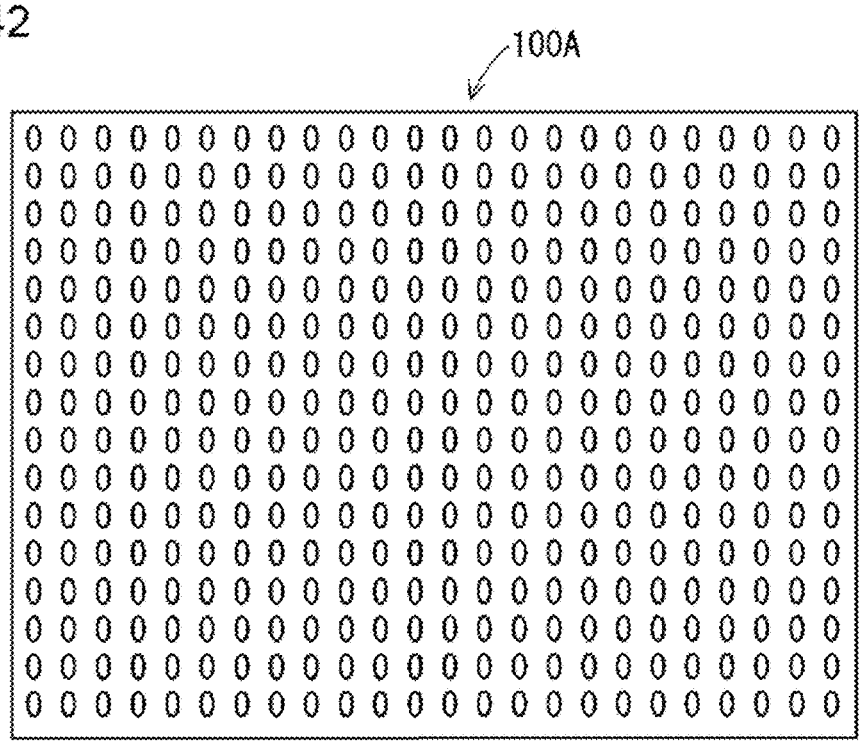
FIG. 42 illustrates a diagram describing target-space data with each value set to 0 in an embodiment.
Figure 43:
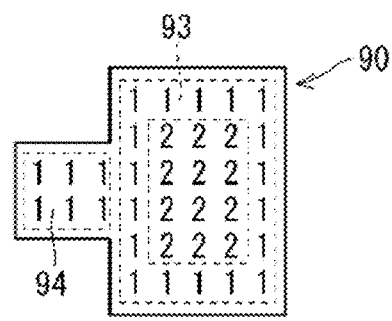
FIG. 43 illustrates a diagram describing component data and shape data in an embodiment.
Figure 43:
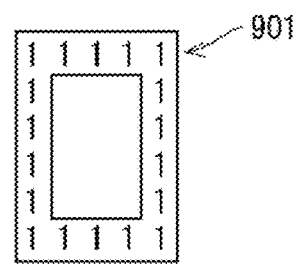
Figure 43:

FIG. 42 is a diagram describing target-space data 100A with each value set to 0, differently from an ordinary setting in an embodiment. FIG. 43 is a diagram describing component data 90 representing a second specific component, first shape data 901 representing an outside-unplaceable holder portion of the second specific component, and second shape data 902 representing an outside-placeable holder portion of the second specific component in an embodiment. As shown in FIG. 43, the first shape data 901 is a data area 93 representing the outside-unplaceable holder portion in the component data 90. The second shape data 902 is a data area 94 representing the outside-placeable holder portion in the component data 90.

Figure 44:
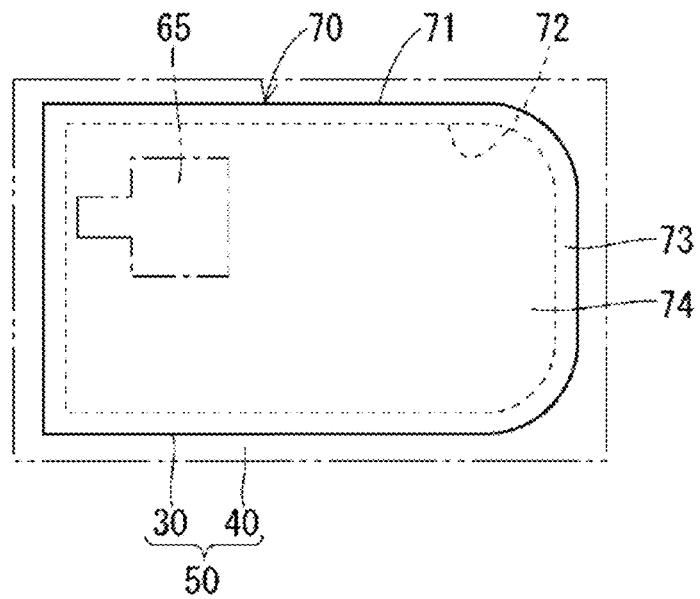
FIG. 44 illustrates a diagram describing a layout object placed in a layout space in an embodiment.
Figure 45:
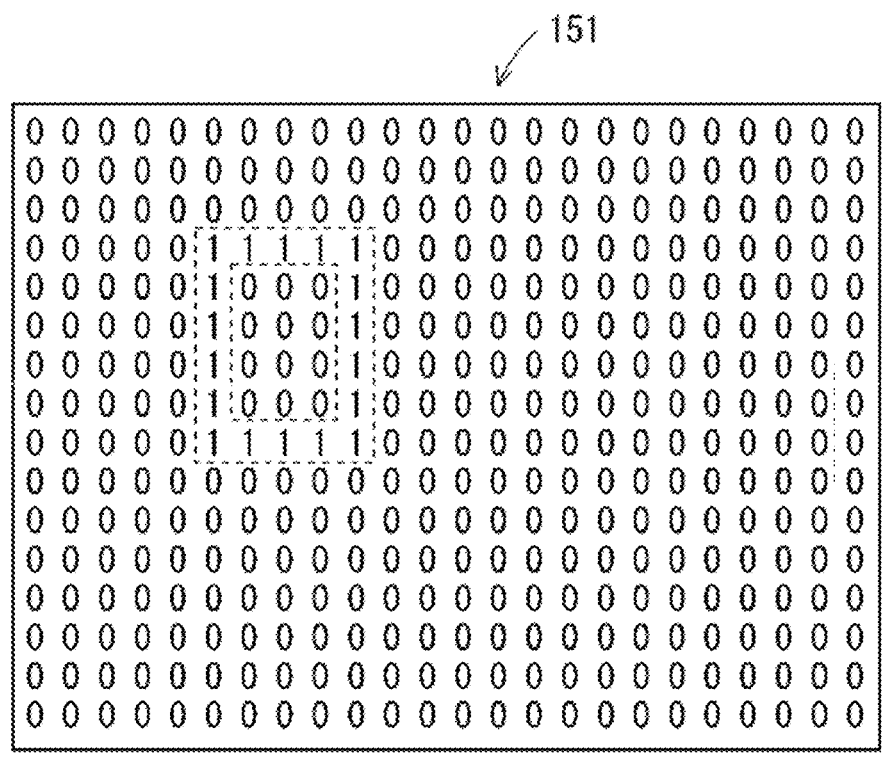
FIG. 45 illustrates a diagram describing first object-state data in an embodiment.

For example, a second specific component 65 is placed as shown in FIG. 44 in the target space 50. The examples shown in FIGS. 42 and 43 use a first object-state data 151 shown in FIG. 45, and a second object-state data 152 shown in FIG. 46. The first object-state data 151 is a data area of the target-space data 100A in FIG. 42 occupied by the outside-unplaceable holder portion of the second specific component 65 in the target space 50 with each value set to 1, changed from 0. Also, the second object-state data 152 is a data area of the target-space data 100A occupied by the outside-placeable holder portion of the second specific component 65 in the target space 50, with each value set to 1, changed from 0.

In step s31a shown in FIG. 17, input-state data including the input merged data and the object-state data generated in step s23 is input into the first neural network. The number of input elements in the neural network 10 in an embodiment is the sum of the number of values included in the input merged data, the number of values included in the first object-state data, and the number of values included in the second object-state data. More specifically, the number of input elements in the neural network 10 is three times the number of values included in the target-space data.

Step s32a is performed after s31a, and the input-state data is then updated in step s33a. When the second specific component is moved in step s32a, the first object-state data and the second object-state data are updated accordingly. In step s31b, the input-state data updated in step s33a is input into the second neural network. The controller 2 thereafter operates in the same manner as described above.

In the learning process, when the second specific component is not an operational target and has the layout position determined in the layout space, object-state data representing the state of the second specific component with the determined layout position in the layout space is generated in steps s33a and 33b. Thus, when the layout position of the second specific component in the layout space has been determined, the same object-state data is always generated in step s33a and in step s33b.

In the learning process, when the second specific component is not an operational target and has the layout position yet to be determined in the layout space, or more specifically, when no second specific component is in the layout space, first object-state data and second object-state data with all the values set to 0 are generated in steps s23, s33a, and s33b.

The same applies to the layout design process. For example, an operational target may be a second specific component in the layout design process. In this case, the controller 2 generates input-state data including input merged data, first object-state data, and second object-state data in step s43 in FIG. 31. In step s51 shown in FIG. 32, the controller 2 inputs the input-state data including the input merged data and the object-state data generated in step s43 into the third neural network. Step s52 is performed after s51, and the input-state data is then updated in step s53. When the second specific component is moved in step s51, the first object-state data and the second object-state data are updated accordingly. In step s55, the input-state data updated in step s53 is input into the fourth neural network. The controller 2 thereafter operates in the same manner as described above. When no second specific component is in the layout space, the layout design process uses first object-state data and second object-state data with all the values set to 0.

In this manner, when input-state data includes input merged data and object-state data representing the state of a layout object alone in the layout space, the input-state data can represent the states of multiple layout objects in more detail in the layout space. The learning process can be performed more appropriately. This shortens the time taken for the layout design process.

Figures 46, 47:
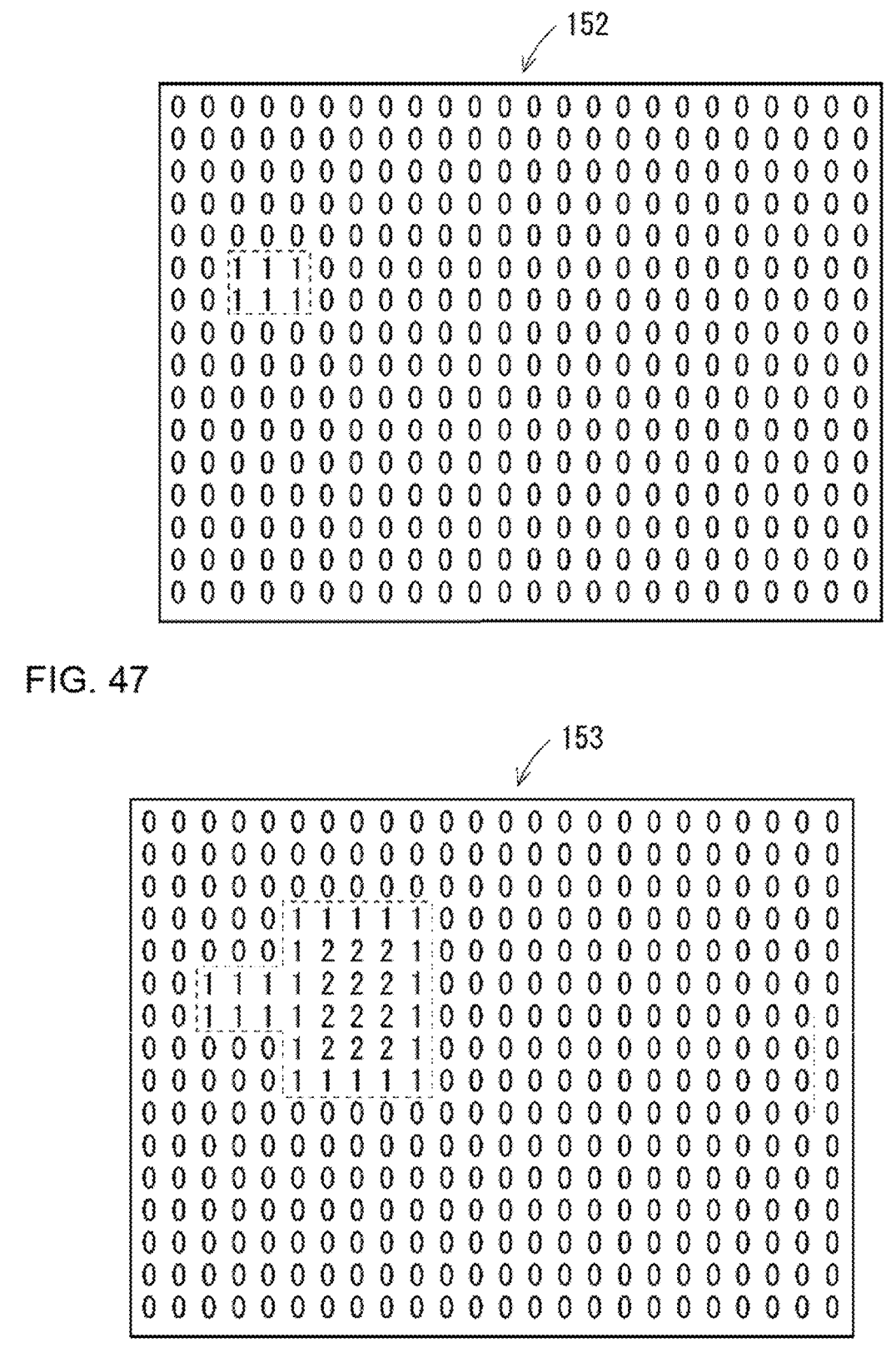

The object-state data may include third object-state data representing the state of the entire layout component in the layout space. The controller 2 merges, for example, component data representing a layout component on target-space data 100A in accordance with the position of the layout component in the layout space, and uses the resultant 3D array data as third object-state data. For the second specific component 65 placed as shown in FIG. 44 described above, for example, third object-state data 153 for the second specific component 65 is shown in FIG. 47.

Other Embodiments

In the above embodiments, the learning process and the layout design process are performed by the same computer apparatus, but these processes may be performed by different computer apparatuses. In this case, learned NN parameters generated by the computer apparatus that performs the learning process are input into the computer apparatus that performs the layout design process.

Although the above embodiments describe the layout design process for components of an electronic device, the above disclosure is applicable to a layout design process for objects other than the components of the electronic device. For example, the above disclosure is applicable to a circuit layout design process for semiconductor circuits. The above disclosure is also applicable to automatic placement of multiple sweets in a box. The above disclosure is also applicable to design of a floor plan of a house in which each room is used as a layout object.

The computer apparatus 1 has been described in detail above, but the above embodiments are merely illustrative in all aspects, and the disclosure is not limited to these embodiments. The above embodiments may be combined in any manner unless any contradiction arises. Examples other than those illustrated above may also be included without departing from the scope of the present disclosure.

The invention claimed is:

1. A learning method implementable by an apparatus for a system performing a layout design for automatically determining layout positions of a plurality of layout objects to be placed in a layout space by virtually moving the plurality of layout objects in the layout space based on a relationship between states of the plurality of layout objects in the layout space and movements of the plurality of layout objects to be performed, the method comprising:
virtually moving a plurality of first layout objects in the layout space,
determining a reward depending on whether or not the plurality of first layout objects interfere with another object in the layout space, and
performing a learning process for learning the relationship through machine learning based on the reward, wherein:
whether or not the plurality of first layout objects interfere with another object in the layout space is determined based on first state data representing states of the plurality of first layout objects in the layout space.

2. The learning method according to claim 1, wherein:
the layout space is a three-dimensional space.

3. The learning method according to claim 1, wherein:
the first state data includes data based on computer-aided design data.

4. The learning method according to claim 1, wherein:
a first space including the layout space includes a plurality of elements, and each of the plurality of first layout objects includes a plurality of elements,
the learning process is performed using first array data representing the first space and second array data representing each of the plurality of first layout objects,
the first array data is generated by assigning first data to each of the plurality of elements of the first space, and the second array data is generated by assigning second data to each of the plurality of elements of each of the plurality of first layout objects, and
the first state data includes merged array data obtained by merging a plurality of sets of second array data representing the plurality of first layout objects on the first array data in accordance with a position of each of the plurality of first layout objects in the layout space corresponding to the plurality of sets of second array data.

5. The learning method according to claim 4, wherein:
the first state data includes the merged array data and object-state data representing a state of each of the plurality of first layout objects in the layout space.

6. The learning method according to claim 1, wherein:
the plurality of first layout objects include a first layout object having a fourth section to be determined as interfering when being outside the layout space.

7. The learning method according to claim 6, wherein:
the plurality of first layout objects include the first layout object having the fourth section and a fifth section, and the fifth section is to be determined as not interfering when being outside the layout space.

8. The learning method according to claim 1, wherein:
a first space including the layout space includes a plurality of elements, and each of the plurality of first layout objects includes a plurality of elements,
the learning process is performed using first array data representing the first space and second array data representing each of the plurality of first layout objects,
the first array data is generated by assigning first data to each of the plurality of elements of the first space, and the second array data is generated by assigning second data to each of the plurality of elements of each of the plurality of first layout objects, and
the method further comprises determining whether each of the plurality of first layout objects interferes with another object in the layout space based on merged array data obtained by merging a plurality of sets of second array data representing the plurality of first layout objects on the first array data in accordance with a position of each of the plurality of first layout objects in the layout space corresponding to the plurality of sets of second array data.

9. The learning method according to claim 8, wherein:
the plurality of first layout objects include a first layout object having a first section to be determined as not interfering when overlapping a first section of another first layout object of the plurality of first layout objects, and a second section to be determined as interfering when overlapping another object, the first section includes elements to which a first value is assigned as the second data, and the second section includes elements to which a second value different from the first value is assigned as the second data.

10. The learning method according to claim 9, wherein:
the layout space includes a space definer defining the layout space,
the space definer has a third section to be determined as not interfering when overlapping the first section, and
the third section includes elements to which the first value assigned to the elements of the first section is assigned as the first data.

11. The learning method according to claim 9, wherein:
the first space includes a second space surrounding the layout space, and the second space includes elements to which the second value assigned to the elements of the second section is assigned as the first data.

12. An automatic layout design method implementable by an apparatus, the method comprising:
performing a layout design for automatically determining layout positions of a plurality of second layout objects to be placed in a layout space by virtually moving the plurality of second layout objects in the layout space based on the relationship learned with the learning method according to claim 1, wherein:
the layout positions of the plurality of second layout objects in the layout space are determined for a plurality of sizes of the layout space.

13. An automatic layout design method implementable by an apparatus, the method comprising:
performing a layout design for automatically determining layout positions of a plurality of second layout objects to be placed in a layout space to avoid interference between each of the plurality of second layout objects and another object by virtually moving the plurality of second layout objects in the layout space based on the relationship learned with the learning method according to claim 1, wherein:
a first space including the layout space includes a plurality of elements, and each of the plurality of second layout objects includes a plurality of elements,
the layout design is performed using first array data representing the first space and second array data representing each of the plurality of second layout objects, the first array data is generated by assigning first data to each of the plurality of elements of the first space, and the second array data is generated by assigning second data to each of the plurality of elements of each of the plurality of second layout objects, and
the method further comprises determining whether each of the plurality of second layout objects interferes with another object in the layout space based on merged array data obtained by merging a plurality of sets of second array data representing the plurality of second layout objects on the first array data in accordance with a position of each of the plurality of second layout objects in the layout space corresponding to the plurality of sets of second array data.

14. The automatic layout design method according to claim 13, wherein:
the plurality of second layout objects include a second layout object having a first section to be determined as not interfering when overlapping a first section of another second layout object of the plurality of second layout objects, and a second section to be determined as interfering when overlapping another object,
the first section includes elements to which a first value is assigned as the second data, and
the second section includes elements to which a second value different from the first value is assigned as the second data.

15. The automatic layout design method according to claim 14, wherein:
the layout space includes a space definer defining the layout space,
the space definer has a third section to be determined as not interfering when overlapping the first section, and
the third section includes elements to which the first value assigned to the elements of the first section is assigned as the first data.

16. The automatic layout design method according to claim 14, wherein:
the first space includes a second space surrounding the layout space, and the second space includes elements to which the second value assigned to the elements of the second section is assigned as the first data.

17. The automatic layout design method according to claim 14, wherein:
the plurality of second layout objects include a third layout object, and a fourth layout object not to be placed in a third space surrounding the third layout object, and
the method further comprises determining a layout position of the third layout object or the fourth layout object in the layout space to accommodate the third layout object and the fourth layout object, and assigning, to the elements of the third space, the second value assigned to the elements of the second section.

18. A learning method implementable by an apparatus for a system performing a layout design for automatically determining layout positions of a plurality of layout objects to be placed in a layout space by virtually moving the plurality of layout objects in the layout space based on a relationship between states of the plurality of layout objects in the layout space and movements of the plurality of layout objects to be performed, the method comprising:
performing a learning process for learning the relationship based on first state data representing states of a plurality of first layout objects in the layout space while virtually moving the plurality of first layout objects in the layout space, wherein:
a first space including the layout space includes a plurality of elements, and each of the plurality of first layout objects includes a plurality of elements,
the learning process is performed using first array data representing the first space and second array data representing each of the plurality of first layout objects, the first array data is generated by assigning first data to each of the plurality of elements of the first space, and the second array data is generated by assigning second data to each of the plurality of elements of each of the plurality of first layout objects, and
the first state data includes merged array data obtained by merging a plurality of sets of second array data representing the plurality of first layout objects on the first array data in accordance with a position of each of the plurality of first layout objects in the layout space corresponding to the plurality of sets of second array data.

19. A learning method implementable by an apparatus for a system performing a layout design for automatically determining layout positions of a plurality of layout objects to be placed in a layout space by virtually moving the plurality of layout objects in the layout space based on a relationship between states of the plurality of layout objects in the layout space and movements of the plurality of layout objects to be performed, the method comprising:

virtually moving a plurality of first layout objects in the layout space, determining a reward depending on whether or not the plurality of first layout objects interfere with another object in the layout space, and performing a learning process for learning the relationship through machine learning based on the reward, wherein:

the plurality of first layout objects include a first layout object having a first section to be determined as not interfering when overlapping a first section of another first layout object of the plurality of first layout objects, and a second section to be determined as interfering when overlapping another object.

20. The learning method according to claim 19, wherein:

the layout space includes a space definer defining the layout space, and the space definer has a third section to be determined as not interfering when overlapping the first section.

21. The learning method according to claim 4, further comprising:

performing a first learning process and a second learning process, the first learning process being the learning process based on the merged array data obtained using each of the plurality of elements having a first size, the second learning process being the learning process based on the merged array data obtained using each of the plurality of elements having a second size different from the first size.

22. An automatic layout design method implementable by an apparatus, the method comprising:

performing a first layout design for automatically determining layout positions of a plurality of second layout objects to be placed in a layout space by virtually moving the plurality of second layout objects in the layout space based on the relationship learned with the first learning process performed with the learning method according to claim 21; and performing a second layout design for automatically determining the layout positions of the plurality of second layout objects to be placed in the layout space by virtually moving the plurality of second layout objects in the layout space based on the relationship learned with the second learning process performed with the learning method according to claim 21.

\* \* \* \* \*